US012670962B2

(12) United States Patent
Hsu et al.

(10) Patent No.: US 12,670,962 B2
(45) Date of Patent: Jun. 30, 2026

(54) ANALOG BITSCAN TECHNIQUES IN A MEMORY DEVICE

(71) Applicant: Sandisk Technologies, Inc., Milpitas, CA (US)

(72) Inventors: Hua-Ling Hsu, Fremont, CA (US); Henry Chin, Fremont, CA (US); Yen-Lung Li, San Jose, CA (US); Yanwei He, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 158 days.

(21) Appl. No.: 18/230,972

(22) Filed: Aug. 7, 2023

(65) Prior Publication Data

US 2025/0006277 A1      Jan. 2, 2025

Related U.S. Application Data

(60) Provisional application No. 63/523,943, filed on Jun. 29, 2023.

(51) Int. Cl.
| | |
|---|---|
| *G11C 16/34* | (2006.01) |
| *G11C 16/04* | (2006.01) |
| *G11C 16/14* | (2006.01) |

(52) U.S. Cl.
CPC ...... *G11C 16/3436* (2013.01); *G11C 16/0483* (2013.01); *G11C 16/14* (2013.01)

(58) Field of Classification Search
CPC . G11C 16/3436; G11C 16/0483; G11C 16/14; G11C 11/5628; G11C 11/5642; G11C 16/26; G11C 16/08; G11C 16/3459; G11C 16/3445
See application file for complete search history.

(56) References Cited

U.S. PATENT DOCUMENTS

| | | | | |
|---|---|---|---|---|
| 10,366,770 | B1 * | 7/2019 | Kurosawa | .......... G11C 16/3454 |
| 11,342,035 | B1 * | 5/2022 | Pitner | .................... G11C 16/30 |
| 11,475,959 | B1 * | 10/2022 | Lien | ........................ G11C 16/24 |
| 11,568,943 | B2 * | 1/2023 | Pitner | ................... G11C 16/10 |
| 2017/0206124 | A1 * | 7/2017 | Lim | .................... G11C 11/5628 |
| 2018/0286485 | A1 * | 10/2018 | Takizawa | .......... G11C 16/0483 |

FOREIGN PATENT DOCUMENTS

| | | |
|---|---|---|
| KR | 20170085774 A | 7/2017 |
| KR | 20200139622 A | 12/2020 |

* cited by examiner

*Primary Examiner* — Pho M Luu
*Assistant Examiner* — Christopher Lane Reece
(74) *Attorney, Agent, or Firm* — Dickinson Wright PLLC

(57) ABSTRACT

The memory device includes a memory block with a plurality of memory cells that are arranged in a plurality of word lines. Circuitry is configured to program at least some of the plurality of memory cells in a program loop or that is configured to erase at least some of the plurality of memory cells in an erase loop. During the program loop or the erase loop, the circuitry is configured to perform a verify operation and an analog bitscan operation. In the analog bitscan operation, the circuitry counts the memory cells that pass or that fail the verify operation. The circuitry is also configured to determine an output of the analog bitscan operation, the output being one of at least three options.

20 Claims, 48 Drawing Sheets

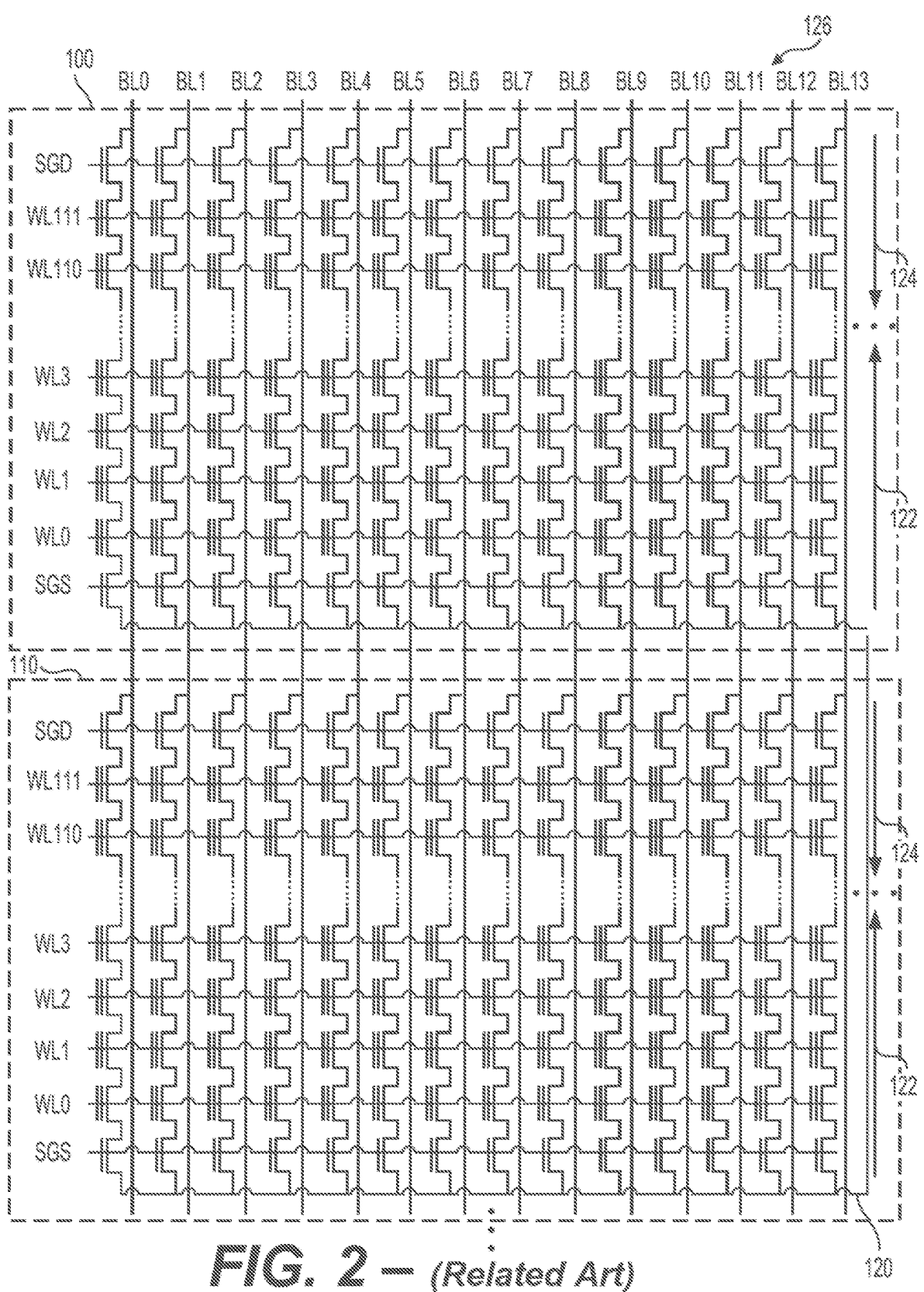
*FIG. 2 — (Related Art)*

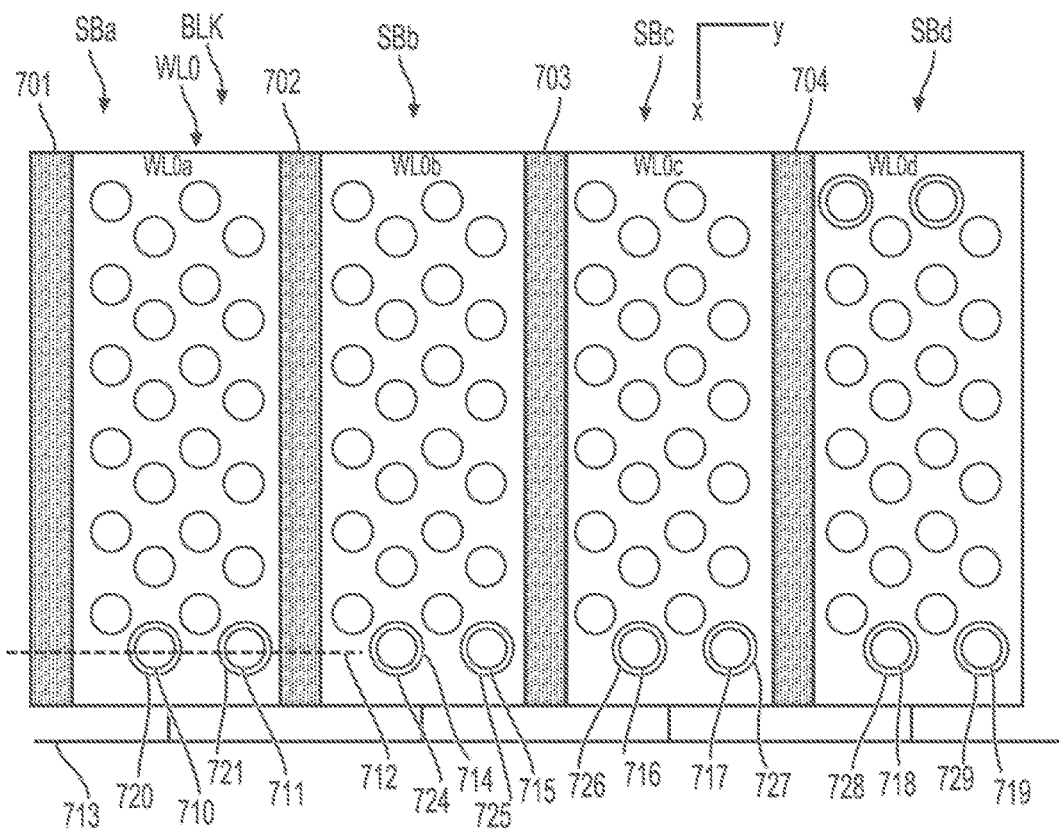
FIG. 7A – *(Related Art)*
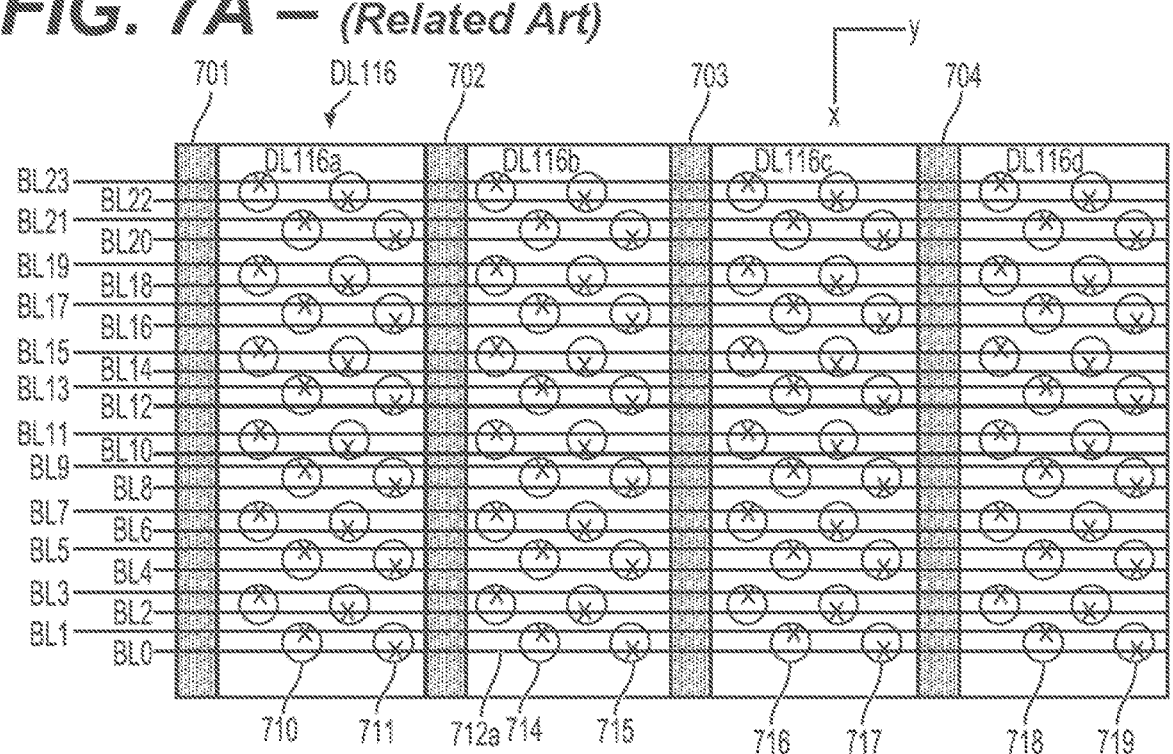
FIG. 7B – *(Related Art)*

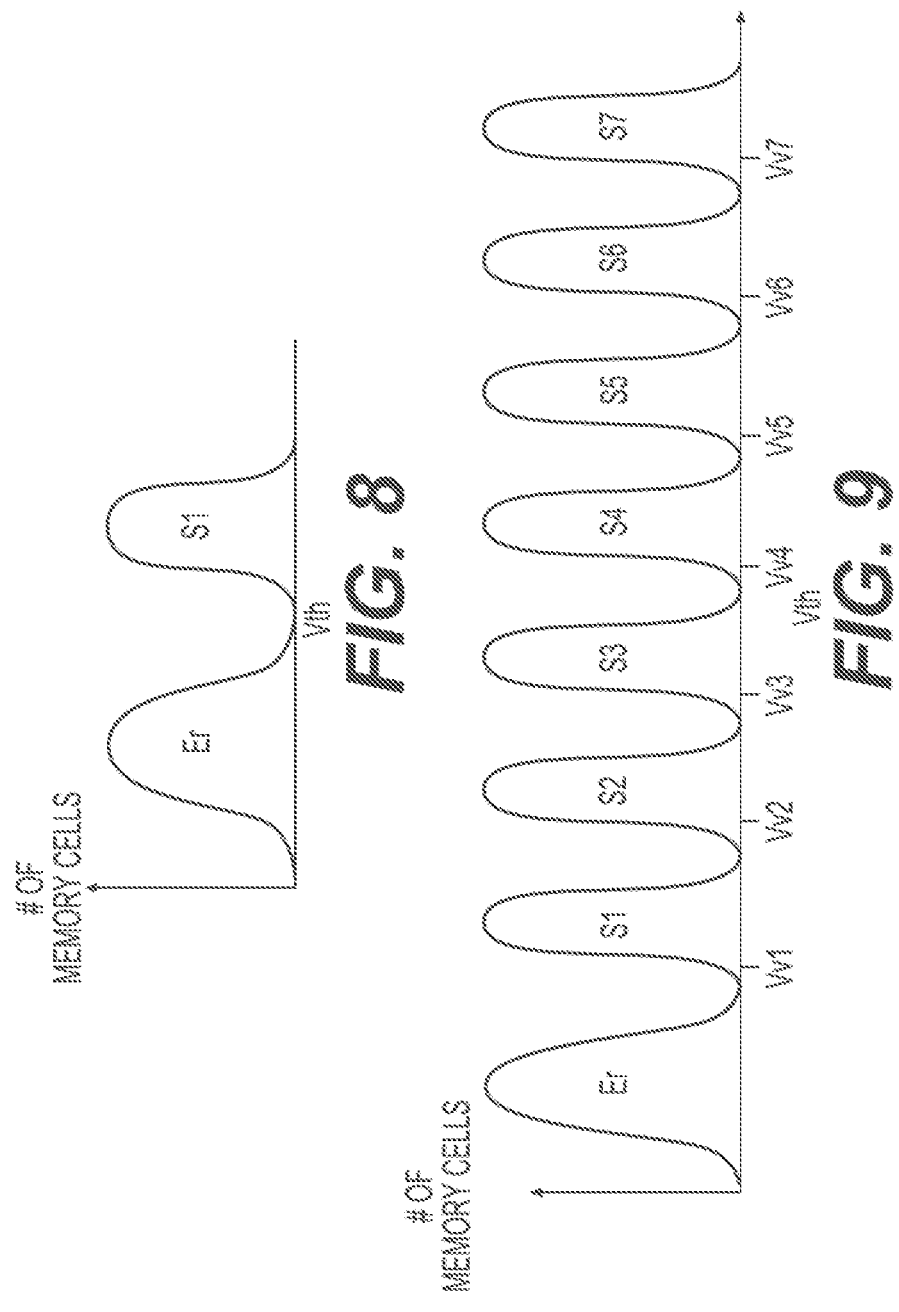

| SCENARIO | BITSCAN STATUS | STATUS JUDGE | EXAMPLE OF BUSY TIME |
|---|---|---|---|
| STRONG FAIL | FAIL | FAIL BITS > BSPF | 1ST TIER FAIL | :80 CYCLES, 1.008US |
| WEAK FAIL | FAIL | FAIL BITS > BSPF | LAST TIER FAIL | :153 CYCLES, 2.568US |
| WEAK PASS | PASS | FAIL BITS <= BSPF | FAIL BITS = BSPF | :152 CYCLES, 2.584US |
| STRONG PASS | STRONG PASS | FAIL BITS <= BSPF | 0 FAIL BITS | :137 CYCLES, 2.328US |

*FIG. 11*

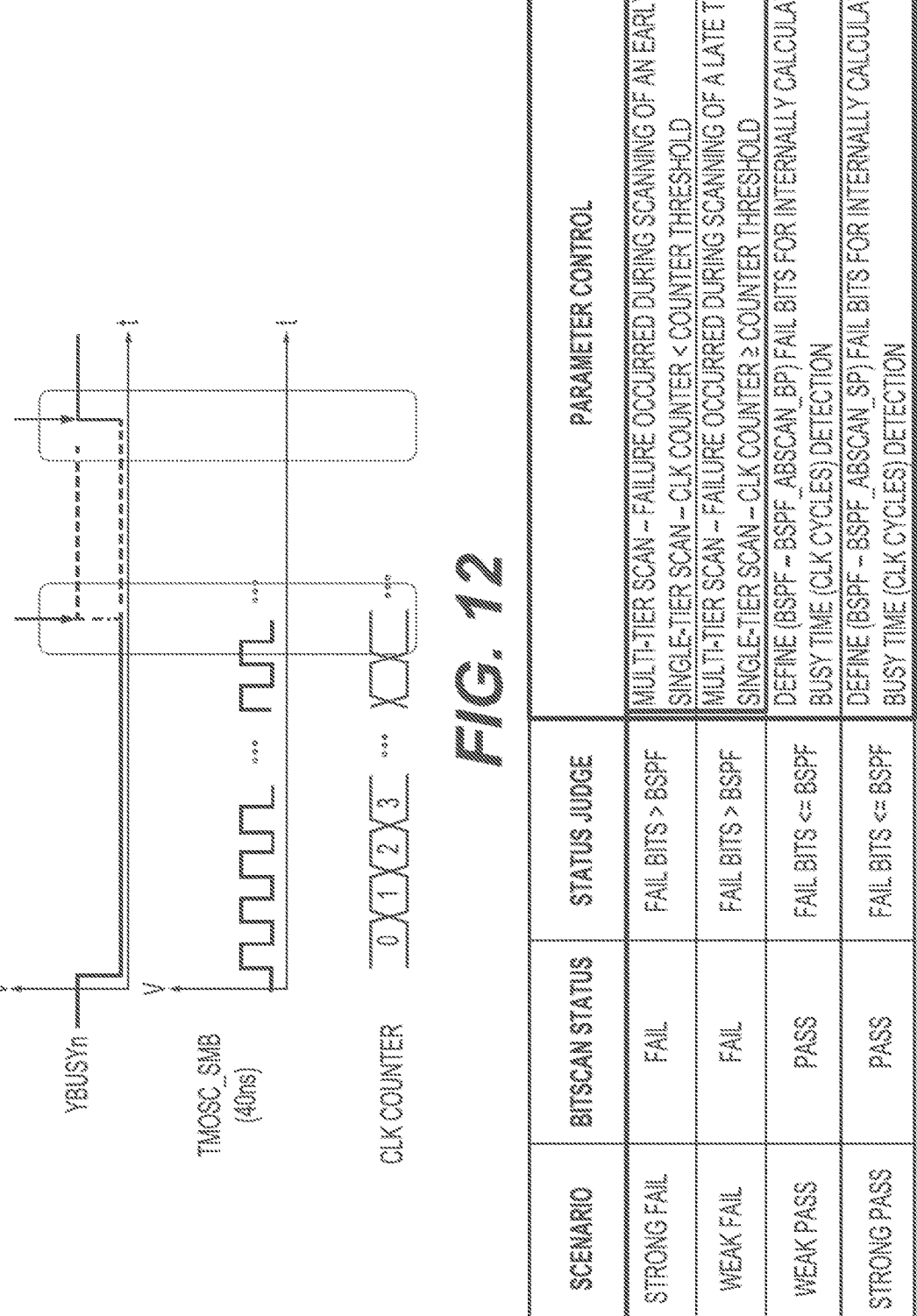

FIG. 12

| | SCENARIO | BITSCAN STATUS | STATUS JUDGE | PARAMETER CONTROL |
|---|---|---|---|---|
| 1 | STRONG FAIL | FAIL | FAIL BITS > BSPF | MULTI-TIER SCAN – FAILURE OCCURRED DURING SCANNING OF AN EARLY TIER SINGLE-TIER SCAN – CLK COUNTER < COUNTER THRESHOLD |
| 2 | WEAK FAIL | FAIL | FAIL BITS > BSPF | MULTI-TIER SCAN – FAILURE OCCURRED DURING SCANNING OF A LATE TIER SINGLE-TIER SCAN – CLK COUNTER ≥ COUNTER THRESHOLD |
| 3 | WEAK PASS | PASS | FAIL BITS <= BSPF | DEFINE (BSPF – BSPF_ABSCAN_BP) FAIL BITS FOR INTERNALLY CALCULATED BUSY TIME (CLK CYCLES) DETECTION |
| 4 | STRONG PASS | PASS | FAIL BITS <= BSPF | DEFINE (BSPF – BSPF_ABSCAN_SP) FAIL BITS FOR INTERNALLY CALCULATED BUSY TIME (CLK CYCLES) DETECTION |

FIG. 13

| BITSCAN OPTIONS | TIER ORDER | STRONG FAIL | WEAK FAIL | |
|---|---|---|---|---|
| 16 TIERS | 0->1->2->3->4->5->6->7->8->9->10->11->12->13->14->15 | FAIL @ 0,1,2, OR 3 | FAIL @ 12, 13,14, OR 15 | PASS |
| 8 TIERS | 0->2->4->6->8->10->12->14 | FAIL @ 0 OR 2 | FAIL @ 12 OR 14 | PASS |
| 4 TIERS | 0->4->8->12 | FAIL @ 0 | FAIL @ 12 | PASS |
| 2 TIERS | 0->8 | FAIL @ 0 | FAIL @ 8 | PASS |

*FIG. 14*

| OUTPUT | BITSCAN STATUS | STATUS JUDGE | LOGIC CONTROL EXAMPLE |
|---|---|---|---|
| STRONG FAIL | FAIL | FAIL BITS > BSPF_ADJ | FAIL @ 1ST TIER |
| WEAK FAIL | FAIL | FAIL BITS > BSPF_ADJ | FAIL @ NTH TIER |
| WEAK PASS | FAIL | FAIL BITS > BSPF_ADJ | FAIL @ LAST TIER |
| STRONG PASS | PASS | FAIL BITS > BSPF_ADJ | PASS |

FIG. 15

| OUTPUT | BITSCAN STATUS | STATUS JUDGE | PARAMETER CONTROL |
|---|---|---|---|
| STRONG FAIL | FAIL | FAIL BITS > BSPF | FBC > BSPF_ABSCAN_F |
| WEAK FAIL | FAIL | FAIL BITS > BSPF | BSPF < FBC < BSPF_ABSCAN_F |
| WEAK PASS | PASS | FAIL BITS > BSPF | BSPF_ABSCAN_P < FBC < BSPF |
| STRONG PASS | PASS | FAIL BITS ≥ BSPF | FBC < BSPF_ABSCAN_P |

*FIG. 16*

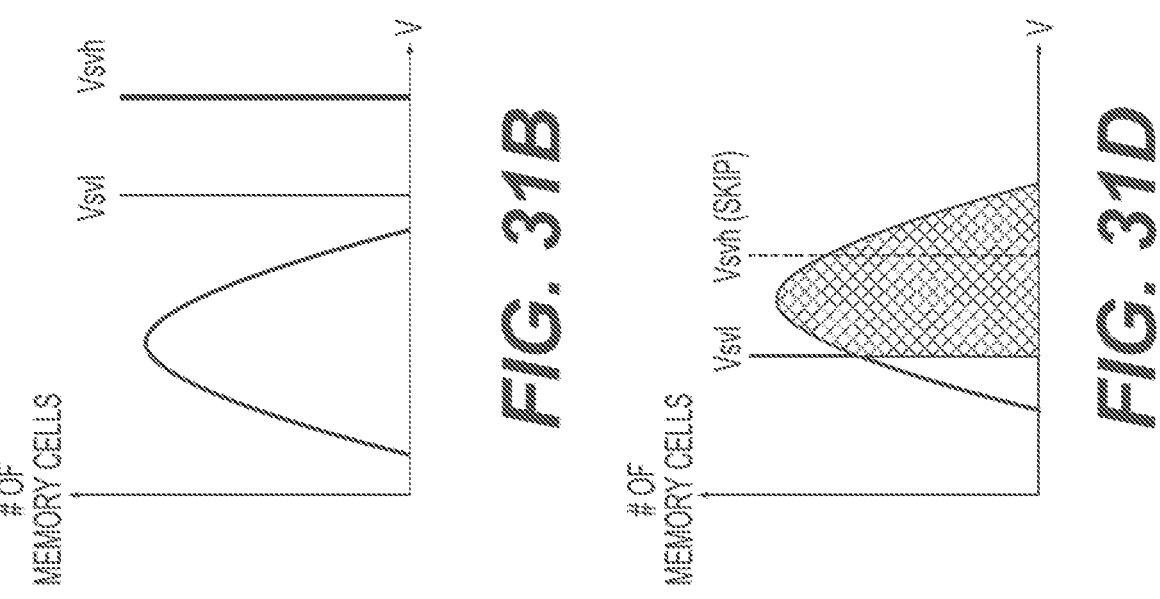
FIG. 31A
FIG. 31B
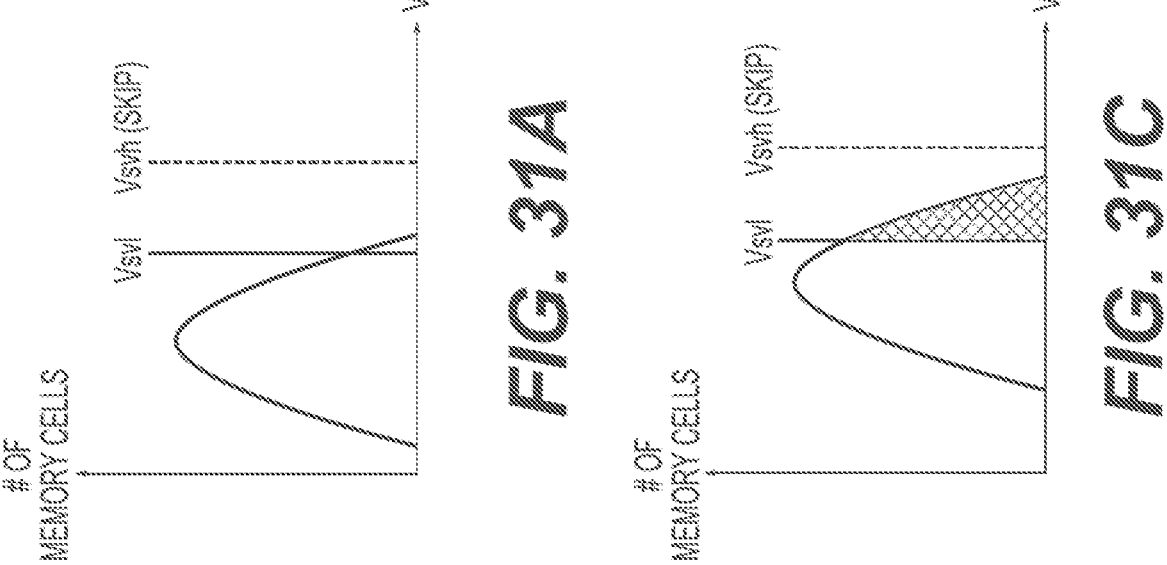
FIG. 31C
FIG. 31D

3200

3202 SET VPGM = VPGMU

3204 PERFORM PROGRAM LOOP VERIFY WITH Vsvi, COUNT LOOPS

3207 VPGM = VPGM + dVPGM_SV2

3206 DID THE ANALOG BITSCAN PASS?

STRONG PASS

WEAK PASS

3208 VPGM = VPGM + dVPGM_SV1

FAIL

3210 PERFORM PROGRAM-VERIFY LOOP VERIFY WITH Vsvh

3212 DID THE ANALOG BITSCAN PASS?

FAIL

PASS

3216 VPGM = VPGM + dVPGM_SV2 ½ * dVPGM_SV * (LOOPS-1)-(½)*dVPGM_SV

3214 SET SV_VPGM = VPGM + DVPGM_SV * (LOOPS-1)

3218 FINISH PROGRAM WLn

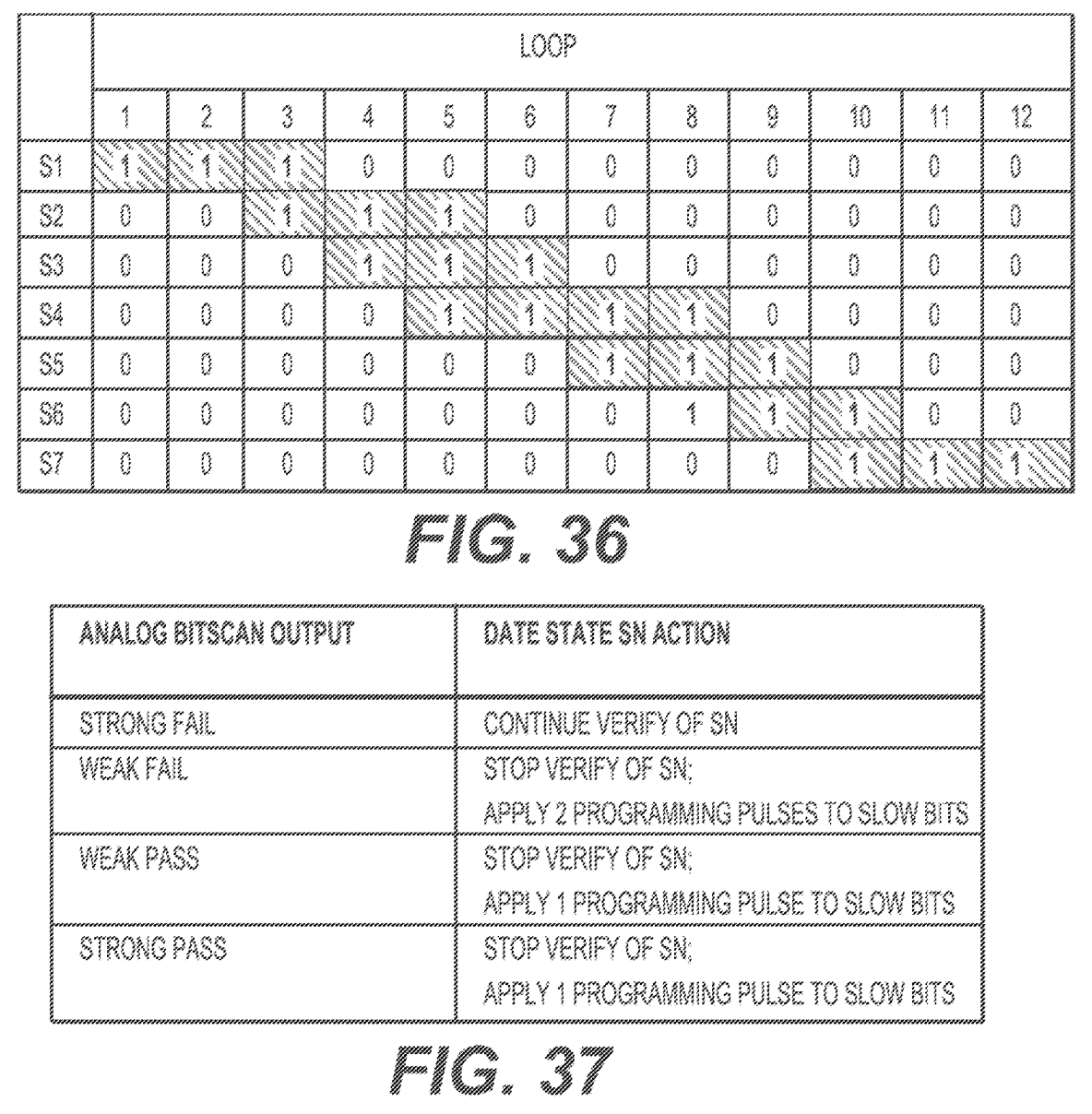

LOOP

| | 1 | 2 | 3 | 4 | 5 | 6 | 7 | 8 | 9 | 10 | 11 | 12 |
|---|---|---|---|---|---|---|---|---|---|---|---|---|
| S1 | 1 | 1 | 1 | 0 | 0 | 0 | 0 | 0 | 0 | 0 | 0 | 0 |
| S2 | 0 | 0 | 1 | 1 | 1 | 1 | 0 | 0 | 0 | 0 | 0 | 0 |
| S3 | 0 | 0 | 0 | 1 | 1 | 1 | 1 | 1 | 0 | 0 | 0 | 0 |
| S4 | 0 | 0 | 0 | 0 | 1 | 1 | 1 | 1 | 1 | 0 | 0 | 0 |
| S5 | 0 | 0 | 0 | 0 | 1 | 0 | 1 | 1 | 1 | 1 | 0 | 0 |
| S6 | 0 | 0 | 0 | 0 | 0 | 0 | 0 | 1 | 1 | 1 | 1 | 0 |
| S7 | 0 | 0 | 0 | 0 | 0 | 0 | 0 | 0 | 0 | 1 | 1 | 1 |

*FIG. 36*

| ANALOG BITSCAN OUTPUT | DATE STATE SN ACTION |
|---|---|
| STRONG FAIL | CONTINUE VERIFY OF SN |
| WEAK FAIL | STOP VERIFY OF SN; APPLY 2 PROGRAMMING PULSES TO SLOW BITS |
| WEAK PASS | STOP VERIFY OF SN; APPLY 1 PROGRAMMING PULSE TO SLOW BITS |
| STRONG PASS | STOP VERIFY OF SN; APPLY 1 PROGRAMMING PULSE TO SLOW BITS |

*FIG. 37*

PROGRAM LOOP (EXAMPLE WITH DVPGM = 0.8V)

| | 1 | 2 | 3 | 4 | 5 | 6 | 7 | 8 | 9 | 10 | 11 | 12 |
|---|---|---|---|---|---|---|---|---|---|---|---|---|
| A | 1 | 1 | 0 | 0 | 0 | 0 | 0 | 0 | 0 | 0 | 0 | 0 |
| B | 0 | 0 | 1 | 1 | 0 | 0 | 0 | 0 | 0 | 0 | 0 | 0 |
| C | 0 | 0 | 0 | 1 | 1 | 1 | 0 | 0 | 0 | 0 | 0 | 0 |
| D | 0 | 0 | 0 | 0 | 1 | 1 | 1 | 1 | 0 | 0 | 0 | 0 |
| E | 0 | 0 | 0 | 0 | 0 | 0 | 0 | 1 | 1 | 1 | 0 | 0 |
| F | 0 | 0 | 0 | 0 | 0 | 0 | 0 | 1 | 0 | 0 | 1 | 0 |
| G | 0 | 0 | 0 | 0 | 0 | 0 | 0 | 0 | 0 | 1 | 1 | 0 |

*FIG. 38*

| ANALOG BITSCAN OUTPUT | DATE STATE SN ACTION |
|---|---|
| STRONG FAIL | CONTINUE VERIFY OF SN; |
| MEDIUM FAIL | STOP VERIFY OF SN; APPLY 3 PROGRAMMING PULSES TO SLOW BITS |
| WEAK FAIL | STOP VERIFY OF SN; APPLY 2 PROGRAMMING PULSES TO SLOW BITS |
| PASS | STOP VERIFY OF SN; APPLY 1 PROGRAMMING PULSE TO SLOW BITS |

FIG. 40

| ANALOG BITSCAN OUTPUT | DATE STATE SN ACTION |
|---|---|
| FAIL | CONTINUE VERIFY OF SN |
| WEAK PASS | STOP VERIFY OF SN; APPLY 3 PROGRAMMING PULSES TO SLOW BITS |
| MEDIUM PASS | STOP VERIFY OF SN; APPLY 2 PROGRAMMING PULSES TO SLOW BITS |
| STRONG PASS | STOP VERIFY OF SN; APPLY 1 PROGRAMMING PULSE TO SLOW BITS |

FIG. 41

|  | LOOP 1 | LOOP 2 | LOOP 3 | LOOP 4 |
|---|---|---|---|---|
| BETWEEN VL~VH | OPTION #1 | QPW | QPW | QPW | QPW |
| | OPTION #2 | QPW | QPW | QPW | |
| | OPTION #3 | QPW | QPW | | |
| | OPTION #4 | QPW | | | |
| BELOW VL | OPTION #1 | VSS | VSS | VSS | VSS |
| | OPTION #2 | VSS | QPW | QPW | QPW |
| | OPTION #3 | VSS | VSS | QPW | QPW |
| | OPTION #4 | VSS | VSS | VSS | QPW |

4402   SET VPGM = VPGMU

4404   SCL VPGM PULSE; VERIFY

4406   ANALOG BITSCAN

4408   DID THE ANALOG BITSCAN PASS?

PASS

WEAK FAIL

STRONG FAIL

4410   VPGM = VPGM + dVBPGM

4412   VPGM = VPGM + dVPGM; SLC VPGM PULSE

4414   END PROGRAMMING OF WLn

ANALOG BITSCAN TECHNIQUES IN A MEMORY DEVICE

CROSS-REFERENCE TO RELATED APPLICATIONS

This application claims the benefit of U.S. Provisional Application No. 63/523,943, filed on Jun. 29, 2023. The entire disclosure of the application referenced above is incorporated herein by reference.

BACKGROUND

1. Field

The present disclosure is related generally to the operation of non-volatile memory and more particularly to programming and erasing techniques to improve performance, reliability, and/or endurance.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

An aspect of the present disclosure is related to a method of performing an operation in a memory device. The method includes the step of preparing a memory block that includes a plurality of memory cells that are arranged in a plurality of word lines. The method continues with the step of programming at least some of the plurality of memory cells in a program loop or erasing at least some of the plurality of memory cells in an erase loop. The method proceeds with the step of performing a verify operation. In an analog bitscan operation, the method continues with the steps of counting the memory cells that pass or that fail the verify operation and of determining an output of the analog bitscan operation, the output being one of at least three options.

According to another aspect of the present disclosure, the step of programming or erasing at least some of the plurality of memory cells includes performing the program loop on a selected word line of the plurality of word lines.

According to yet another aspect of the present disclosure, the step of programming or erasing at least some of the plurality of memory cells includes performing the erase loop on at least some of the plurality of word lines.

According to still another aspect of the present disclosure, the analog bitscan operation includes a scan of multiple tiers of the plurality of memory cells that are programmed in the program loop or that are erased in the erase loop. The output of the analog bitscan operation is determined based on which tier of the multiple tiers is being scanned when the analog bitscan operation is completed.

According to a further aspect of the present disclosure, the analog bitscan operation includes a scan of multiple tiers of the plurality of memory cells that are programmed in the program loop or that are erased in the erase loop. The output of the analog bitscan operation is determined based on a busy time calculation.

According to yet a further aspect of the present disclosure, the at least three options include four options, comprising: strong fail, weak fail, weak pass, and strong pass.

According to still a further aspect of the present disclosure, at least one programming parameter in a subsequent program loop or at least one erasing parameter in a subsequent erase loop is adjusted based on the output of the analog bitscan operation. The at least one programming parameter or erasing parameter could be, for example, a program-verify parameter or a smart verify parameter.

According to another aspect of the present disclosure, the analog bitscan operation includes the step of comparing a fail bit count to a plurality of thresholds.

Another aspect of the present disclosure is related to a memory device that includes a memory block with a plurality of memory cells that are arranged in a plurality of word lines. The memory device also includes circuitry that is configured to program at least some of the plurality of memory cells in a program loop or that is configured to erase at least some of the plurality of memory cells in an erase loop. During the program loop or the erase loop, the circuitry is configured to perform a verify operation and an analog bitscan operation. In the analog bitscan operation, the circuitry counts the memory cells that pass or that fail the verify operation. The circuitry is also configured to determine an output of the analog bitscan operation, the output being one of at least three options.

According to another aspect of the present disclosure, the circuitry is configured to program the memory cells of a selected word line of the plurality of word lines in the program loop.

According to yet another aspect of the present disclosure, the circuitry is configured to erase the memory cells of at least some of the plurality of word lines in the erase loop.

According to still another aspect of the present disclosure, when performing the analog bitscan operation, the circuitry scans multiple tiers of the plurality of memory cells that are programmed in the program loop or that are erased in the erase loop. The output of the analog bitscan operation is determined by the circuitry based on which tier of the multiple tiers is being scanned when the analog bitscan operation is completed.

According to a further aspect of the present disclosure, during the analog bitscan operation, the circuitry scans multiple tiers of the plurality of memory cells that are programmed in the program loop or that are erased in the erase loop. the output of the analog bitscan operation from the circuitry is determined based on a busy time calculation.

According to yet a further aspect of the present disclosure, during the analog bitscan operation, the circuitry compares a fail bit count to a plurality of thresholds.

According to still a further aspect of the present disclosure, the at least three options include four options, comprising: strong fail, weak fail, weak pass, and strong pass.

According to another aspect of the present disclosure, the circuitry adjusts at least one programming parameter in a subsequent program loop or adjusts at least one erasing parameter in a subsequent erase loop based on the output of the analog bitscan operation.

Yet another aspect of the present disclosure is related to an apparatus that includes a memory block with a plurality of memory cells that are arranged in a plurality of word lines. The apparatus also includes a programming means for programming the memory cells of a selected word line of the plurality of word lines in a plurality of program loops. The apparatus further includes an erasing means for erasing the memory cells of at least some of the plurality of word lines in a plurality of erase loops. The apparatus also includes an analog bitscan means for counting memory cells that complete programming during the program loops or that complete erasing during the erase loops. The analog bitscan means is configured to determine an output that is one of at least three options.

According to another aspect of the present disclosure, the at least three options that the analog bitscan means is configured to output include strong fail, weak fail, weak pass, and strong pass.

According to yet another aspect of the present disclosure, the programming means is configured to adjust at least one programming parameter in a subsequent program loop based on the output of the analog bitscan means in a previous program loop.

According to still another aspect of the present disclosure, the erasing means is configured to adjust at least one erasing parameter in a subsequent erase loop based on the output of the analog bitscan means in a previous erase loop.

According to a further aspect of the present disclosure, the analog bitscan means scans multiple tiers of the plurality of memory cells that are programmed in the program loop or that are erased in the erase loop. The output of the analog bitscan means is determined based on which tier of the multiple tiers is being scanned when an analog bitscan operation is completed.

According to yet a further aspect of the present disclosure, during an analog bitscan operation, the analog bitscan means scans multiple tiers of the plurality of memory cells that are programmed in the program loop or that are erased in the erase loop. The output of the analog bitscan means is determined based on a busy time calculation.

According to still a further aspect of the present disclosure, the analog bitscan menas is configured to compare a fail bit count to a plurality of thresholds.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

FIG. 8 depicts a threshold voltage distribution of a page of memory cells programmed to one bit per memory cell (SLC);

FIG. 9 depicts a threshold voltage distribution of a page of memory cells programmed to three bits per memory cell (TLC);

FIG. 11 is a table containing the analog bitscan output options and the corresponding Busy Time calculation that results in the different options according to an embodiment of the present disclosure;

FIG. 12 is a plot of a Busy Voltage, an oscillator, and a corresponding clock counter according to an example embodiment;

FIG. 13 is a table containing the analog bitscan output options and the corresponding parameters that result in the different options according to an embodiment of the present disclosure;

FIG. 14 is a table containing the analog bitscan output options and the corresponding parameters that result in the different options according to another embodiment of the present disclosure;

FIG. 15 is a table containing the analog bitscan output options and the corresponding parameters that result in the different options according to yet another embodiment of the present disclosure;

FIG. 16 is a table containing the analog bitscan output options and the corresponding parameters that result in the different options according to still another embodiment of the present disclosure;

FIG. 31A is a threshold voltage distribution of a plurality of memory cells that would produce a weak pass output in an example analog bitscan operation;

FIG. 31B is a threshold voltage distribution of a plurality of memory cells that would produce a strong pass output in an example analog bitscan operation;

FIG. 31C is a threshold voltage distribution of a plurality of memory cells that would produce a weak fail output in an example analog bitscan operation;

FIG. 31D is a threshold voltage distribution of a plurality of memory cells that would produce a strong fail output in an example analog bitscan operation;

FIG. 36 is a table identifying which data states are verified in which program loops according to an example programming operation;

FIG. 37 is a table containing actions to be taken in response to different analog bitscan outputs according to an example embodiment of the present disclosure;

FIG. 38 is a table identifying which data states are verified in which program loops according to an example embodiment of a programming operation;

FIG. 40 is table identifying which data states are verified in which program loops according to an example embodiment of a programming operation;

FIG. 41 is table identifying which data states are verified in which program loops according to another example embodiment of a programming operation;

FIG. 43 is a table identifying which data states are verified in which program loops according to another example embodiment of a programming operation;

DESCRIPTION OF THE ENABLING EMBODIMENTS

Programming and erasing typically both occur in a plurality of loops, each of which includes a programming or erasing pulse and a verify operation. In the verify operation, the threshold voltages Vt of the memory cells being programmed or erased are checked to determine if they have completed programming or erasing. After the verify operation, a bitscan operation may be performed to count how many memory cells have completed or failed the programming or erasing operation. The present disclosure is related generally to a so-called "analog bitscan" operation whereby the bitscan operation can generate more than two possible outputs, i.e., more than just "pass" and "fail." By generating additional output options (for example, strong pass, weak pass, weak fail, and strong fail), certain parameters of the programming or erasing operation can be optimized to improve the performance, reliability, and or endurance of the memory device. These analog bitscan techniques and corresponding programming and erasing operations which utilize analog bitscan are discussed in further detail below.

Figures 1A, 1B:
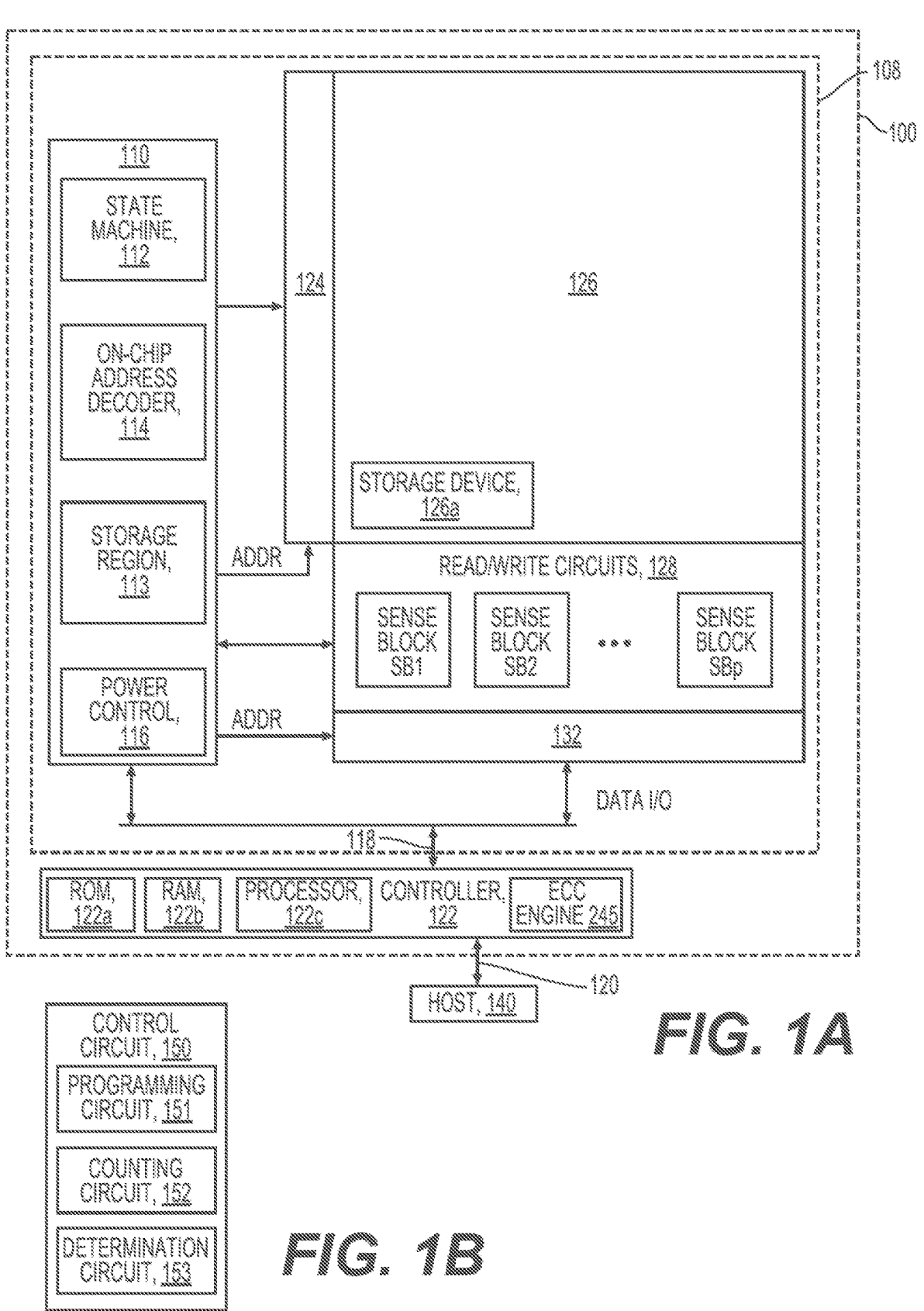
FIG. 1A is a block diagram of an example memory device.
FIG. 1B is a block diagram of an example control circuit.

FIG. 1A is a block diagram of an example memory device 100 is configured to operate according to the analog bitscan techniques of the present disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ... SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ... , SBp, read/write circuits 128, controller 122, and so forth.

The control circuits 150 can include a programming circuit 151 configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits 150 can also include a counting circuit 152 configured to obtain a count of memory cells which pass a verify test for the one data state. The control circuits 150 can also include a determination circuit 153 configured to determine, based on an amount by which the count exceeds a threshold, if a programming operation is completed.

For example, FIG. 1B is a block diagram of an example control circuit 150 which comprises the programming circuit 151, the counting circuit 152, and the determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122*b*, it is executed by the processor 122*c*. The control code includes drivers to perform basic tasks such as controlling and allocating memory, prioritizing the processing of instructions, and controlling input and output ports.

Figure 1C:
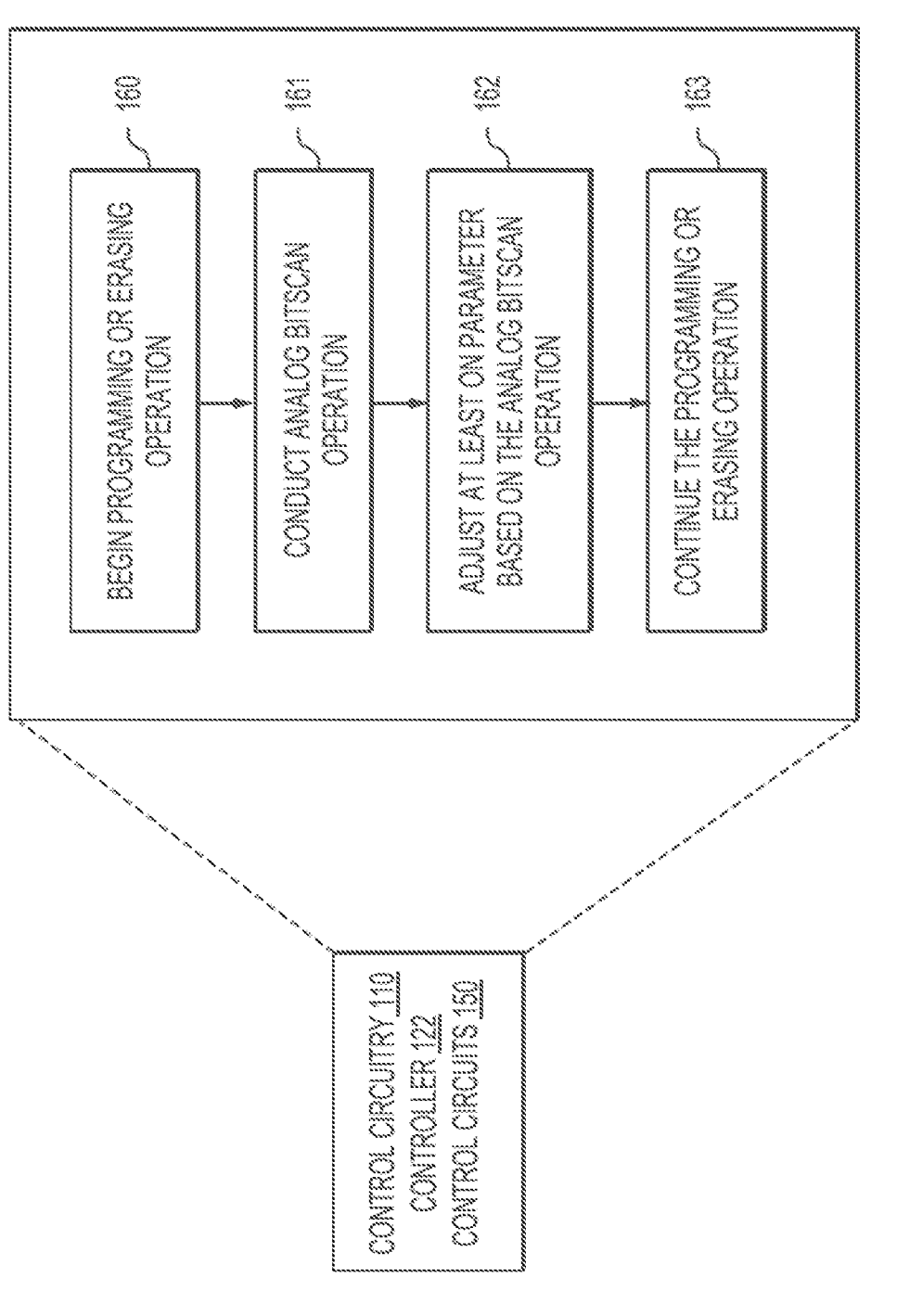
FIG. 1C is a block diagram of example programming circuitry of the memory device of FIG. 1A.

Generally, the control code can include instructions to perform the functions described herein including the steps of the flowcharts discussed further below and provide the voltage waveforms including those discussed further below. For example, as illustrated in FIG. 1C, the control circuitry 110, the controller 122, and/or the control circuits 150 are configured to program and/or erase the memory cells of a selected word line WLn according to the unique techniques discussed herein which include an analog bitscan operation. At step 160, the circuitry begins the programming or erasing operation. At step 161, the circuitry conducts an analog bitscan operation that produces one of more than two possible outputs. At step 162, the circuitry adjusts at least one parameter of the programming or erasing operation based on the output of the analog bitscan operation. At step 163, the circuitry continues the programming or erasing operation using the at least one adjusted parameter.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates memory blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain-side select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors or between certain data word lines. Such dummy word lines can shield the edge data word line from certain edge effects.

Figures 3A, 3B:
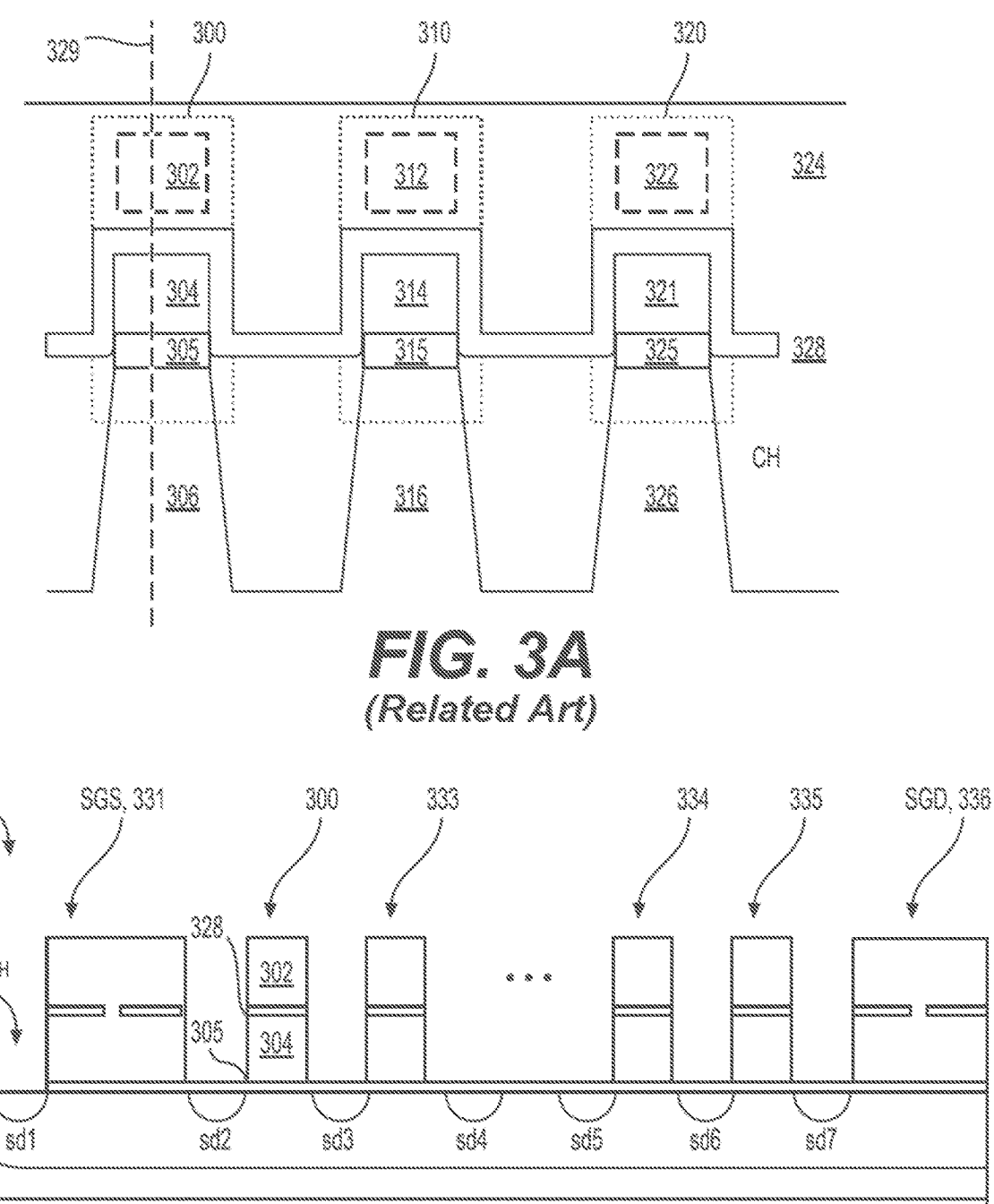
FIG. 3A and FIG. 3B depict cross-sectional views of example floating gate memory cells in NAND strings.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
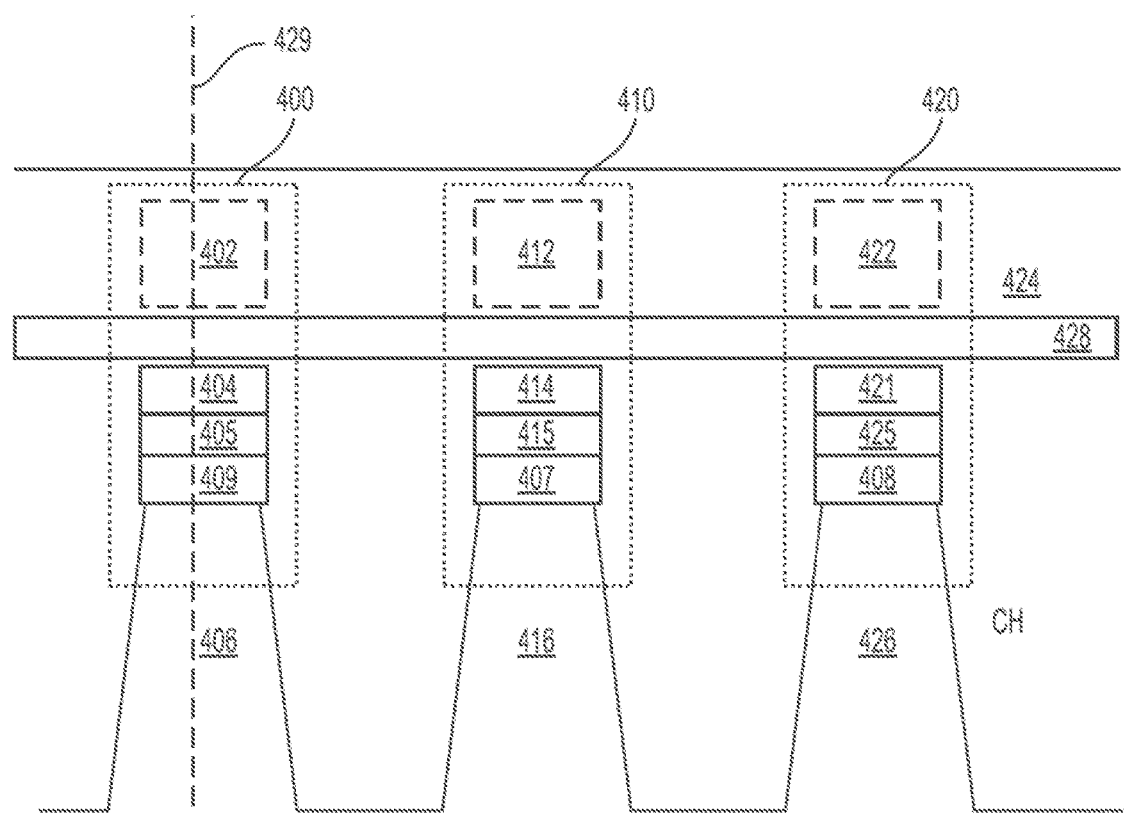
FIG. 4A and FIG. 4B depict cross-sectional views of example charge-trapping memory cells in NAND strings.
Figure 4B:
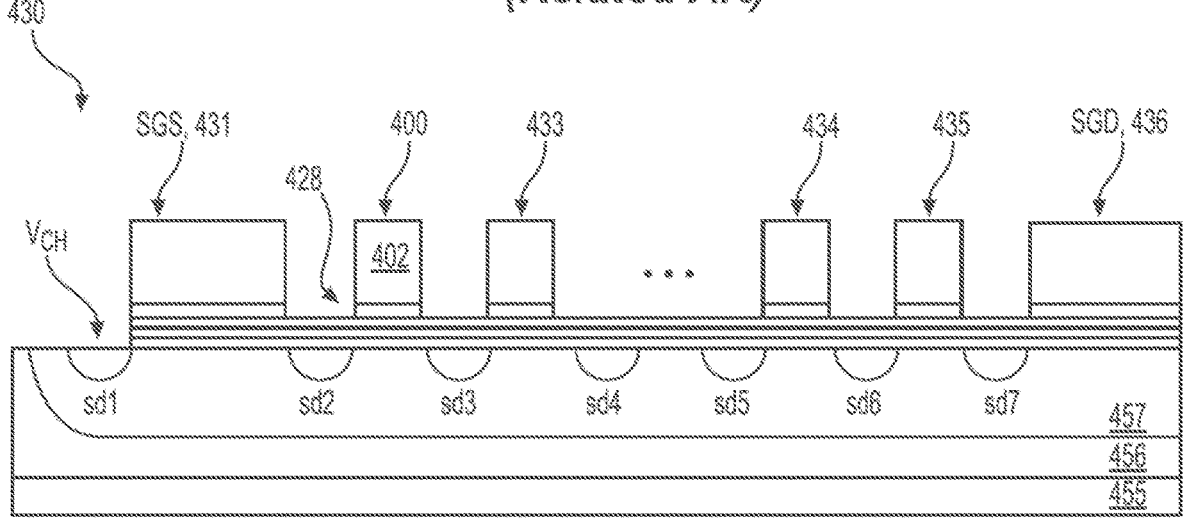

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414,

421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
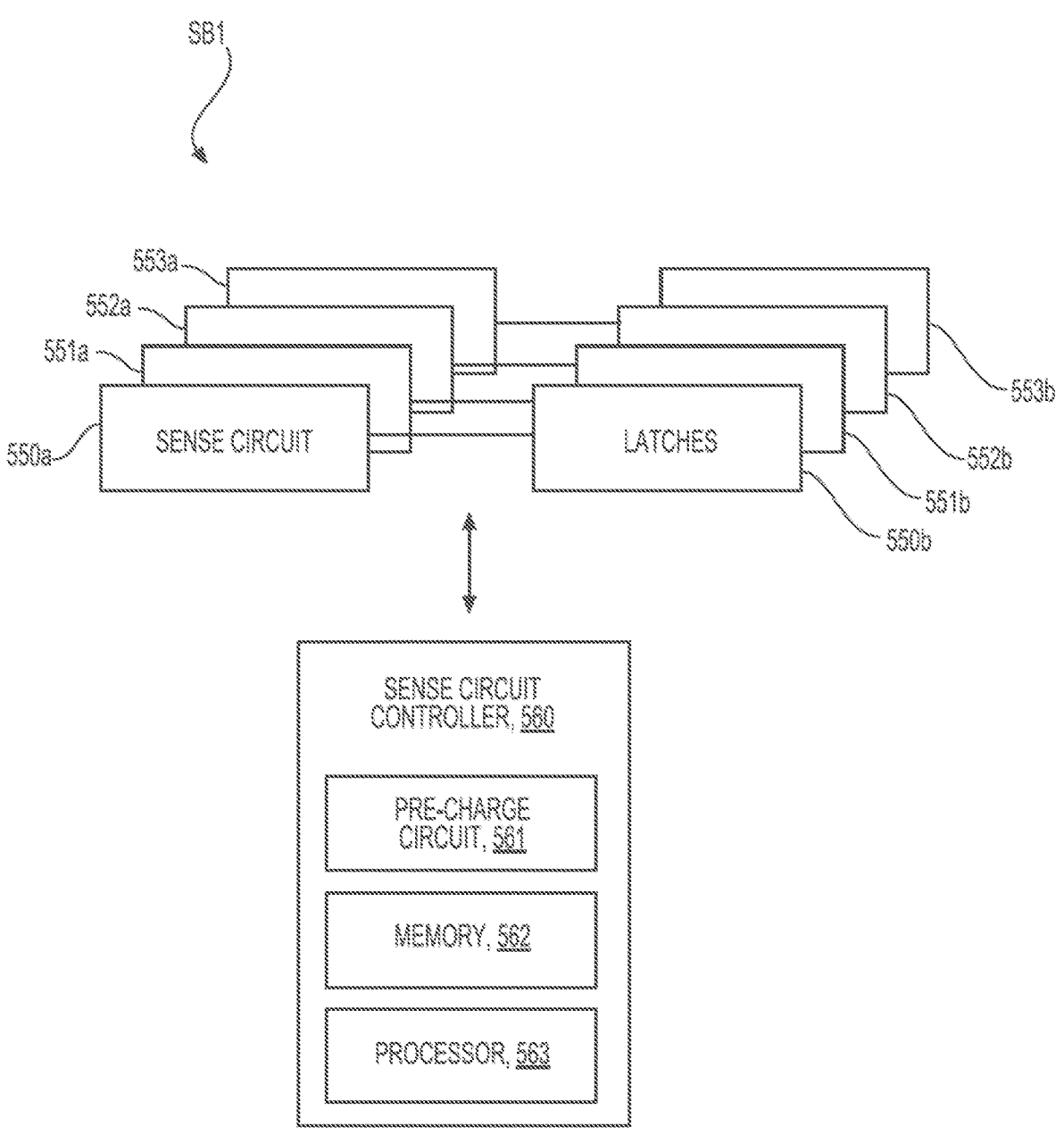
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
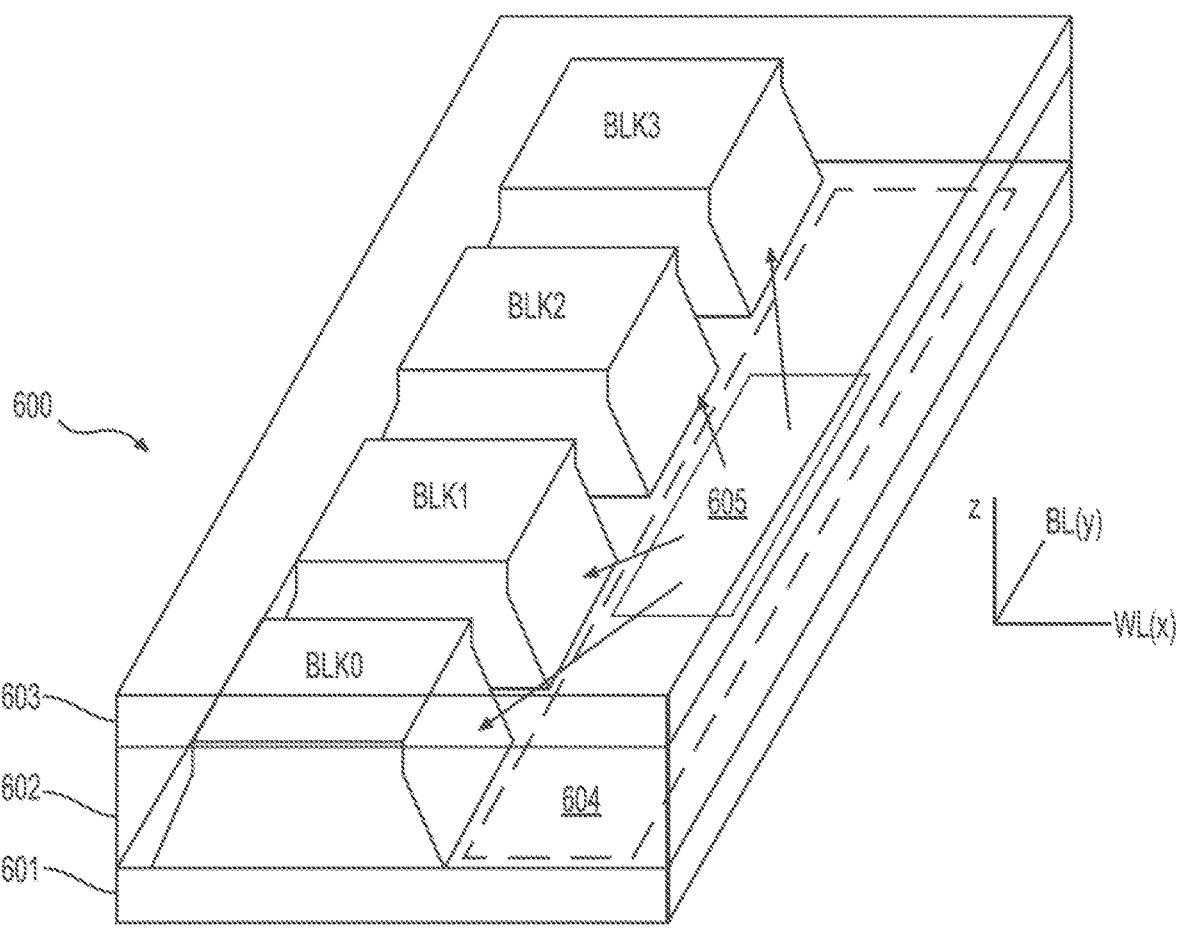
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
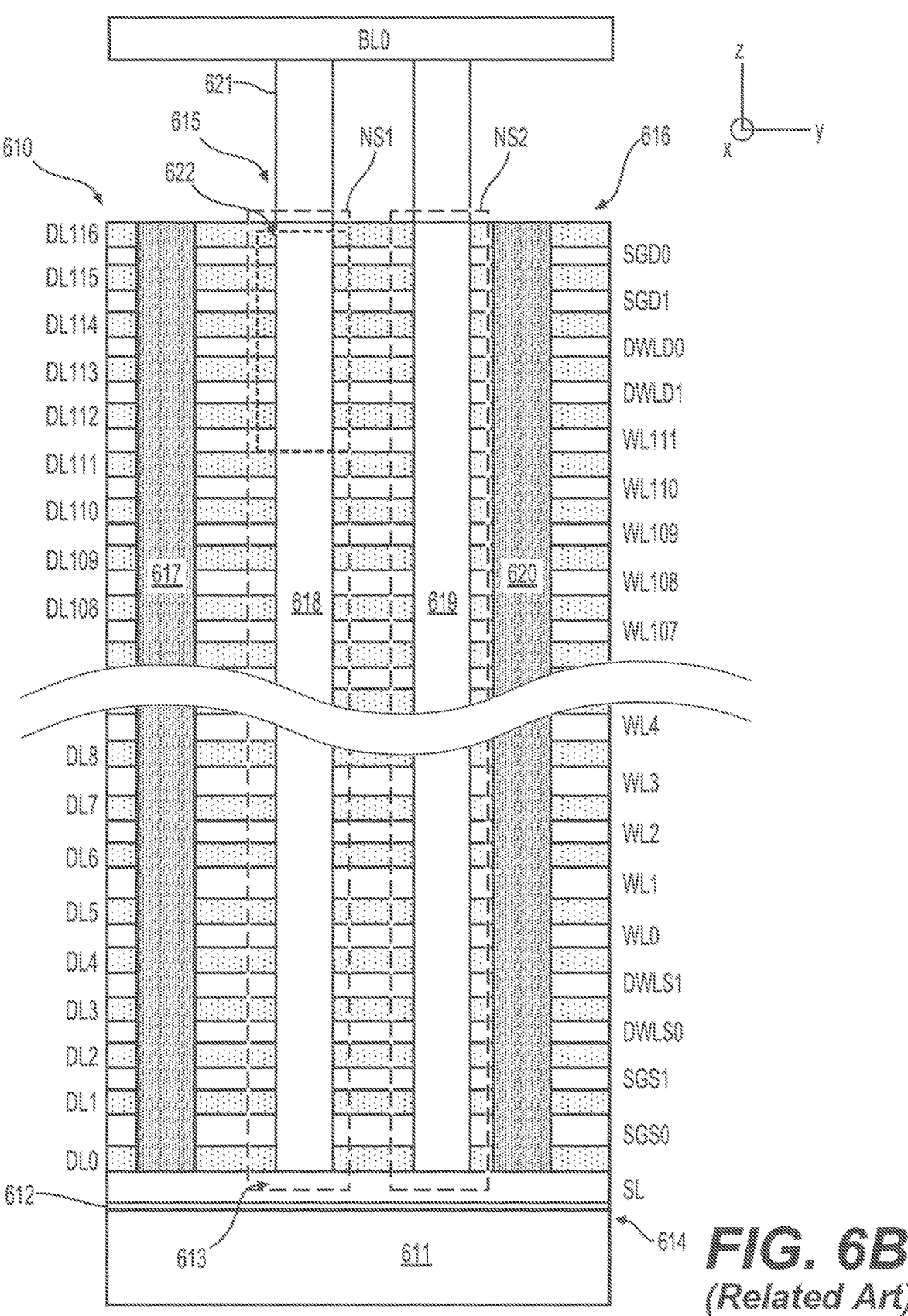
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below. The dielectric layers can have variable thicknesses such that some of the conductive layers can be closer to or further from neighboring conductive layers. The thicknesses of the dielectric layers affects the "ON pitch," which is a factor in memory density. Specifically, a smaller ON pitch allows for more memory cells in a given area but may compromise reliability.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
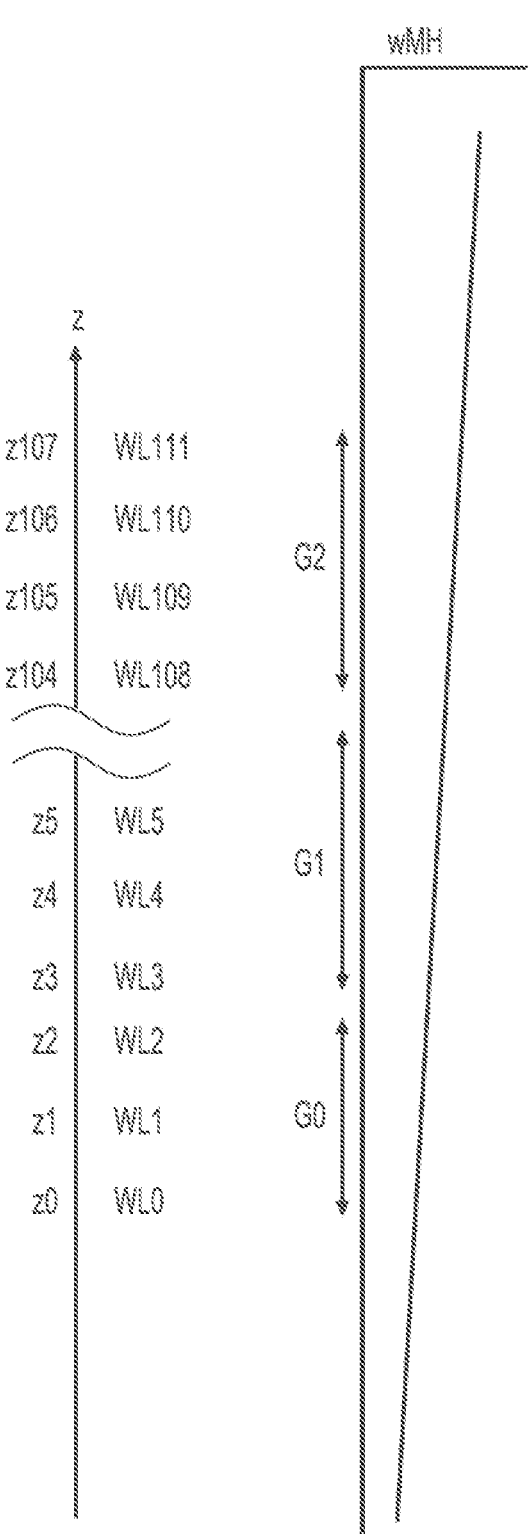
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wNM), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
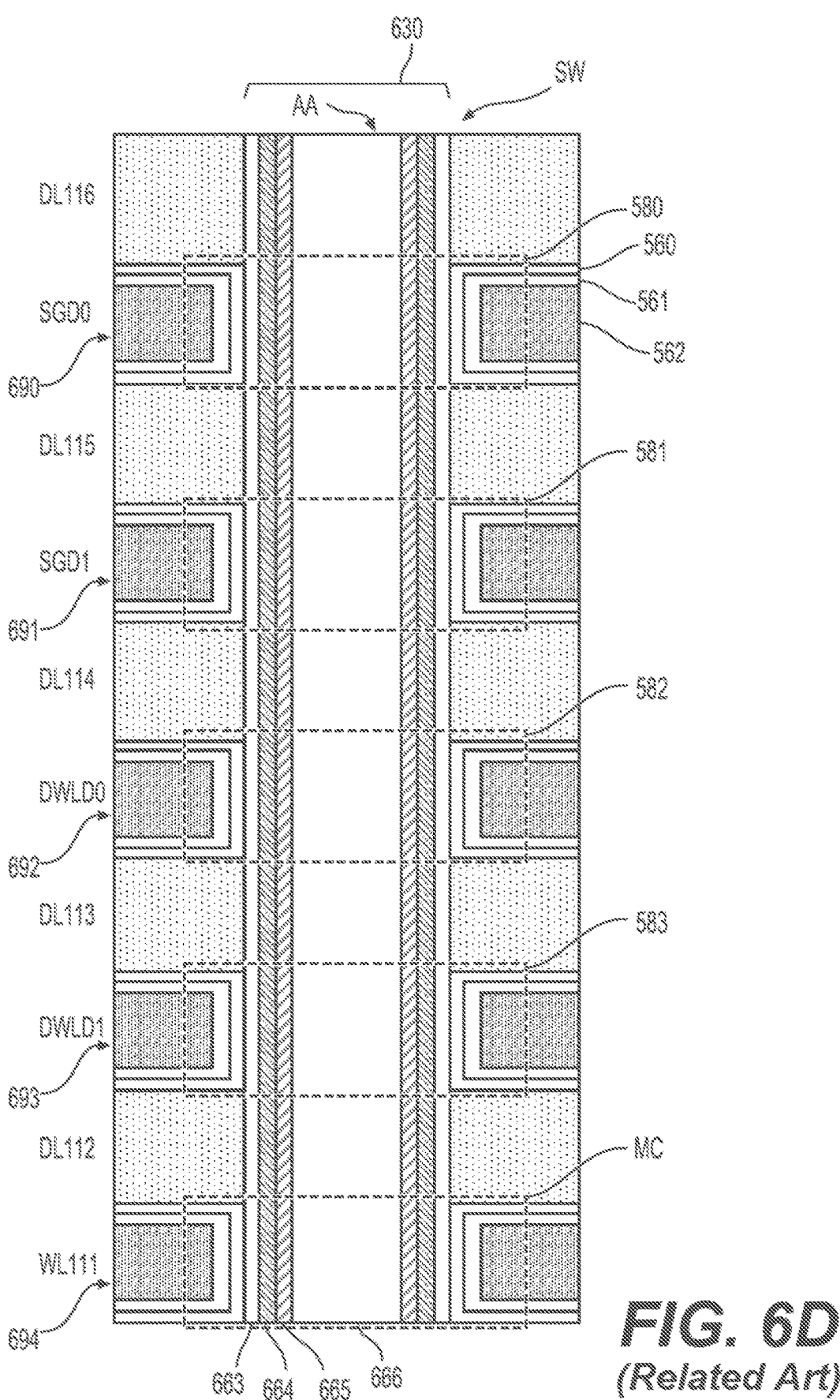
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL 11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to store one or more bits of data in multiple data states, each of which is associated with a respective threshold voltage Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. Other storage schemes are also available, such as two bits per cell (MLC) with four data states, four bits per cell (QLC) with sixteen data states, or five bits per cell (PLC) with thirty-two data states.

Programming the memory cells of a memory block occurs on a word line by word line basis from one side of the memory block towards an opposite side. The programming direction can start from a drain side of a memory block (or a sub-block in some cases) and proceed towards the source side or vice versa. For example, with reference to FIG. 6B, in a normal order programming (NOP) direction, the first word line to be programmed may be WL0. The next word line to be programmed may be WL1 and then WL2 and so on. In a reverse order programming (ROP) operation, the first word line to be programmed may be physical WLN (where N is the highest data word line in the memory block or sub-block, e.g., WL111), and then programming proceeds to physical WLN-1 (e.g., WL110), then physical WLN-2 (e.g., WL109), and so on.

Figure 10:
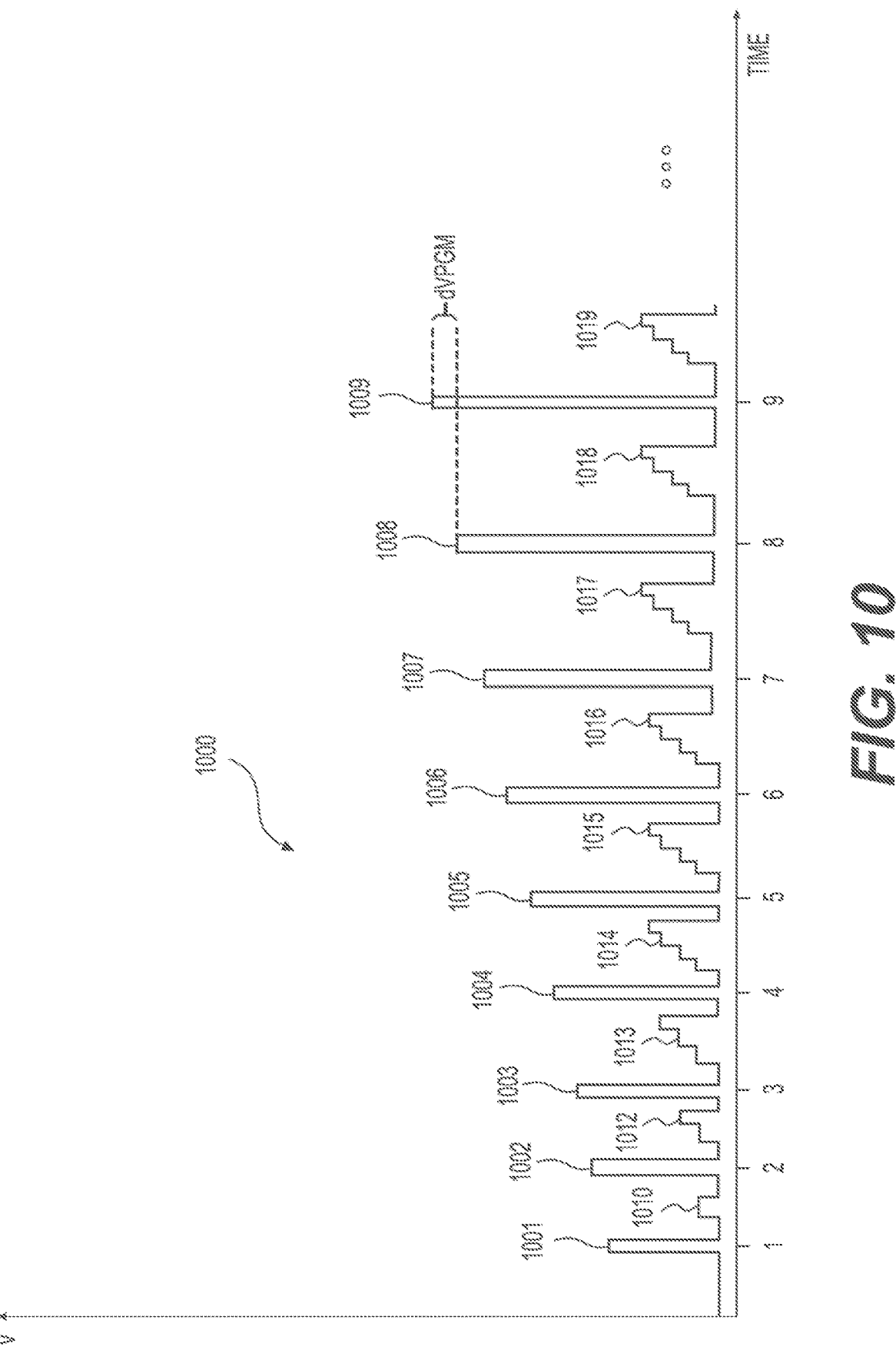
FIG. 10 depicts an example voltage waveform applied to a selected word line during programming of the memory cells of the selected word line.

Programming the memory cells of one of the word lines to multiple bits per memory cell (for example, MLC, TLC, or QLC) typically begins with the memory cells being in the erased state and includes a plurality of program loops. FIG. 10 depicts a waveform 1000 of the voltages applied to a selected word line during an example memory cell programming operation for programming the memory cells of the selected word line to a greater number of bits per memory cell (e.g., TLC). As depicted, each program loop includes a programming pulse VPGM and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse amplitude steps up, or increases, in each successive program loop. In other words, the pulse train includes VPGM pulses that increase stepwise in amplitude with each successive program loop by a fixed step size (dVPGM). A new pulse train starts with an initial VPGM pulse level VPGMU and ends at a final VPGM pulse level, which does not exceed a maximum allowed level. The example pulse train 1000 includes a series of VPGM pulses 1001-1009 that are applied to a selected word line that includes a set of non-volatile memory cells. One or more verify voltage pulses 1010-1019 are provided after each VPGM pulse as an example, based on the target data states which are being verified in the program loop. The verify voltages correspond with voltages Vv1-Vv7 shown in FIG. 9. Concurrent with the application of the verify voltages, a sensing operation can determine whether a particular memory cell in the selected word line has a threshold voltage Vt above the verify voltage associated with its intended data state by sensing a current through the memory cell. If the current is relatively high, this indicates that the memory cell is in a conductive state, such that its threshold voltage Vt is less than the verify voltage. If the current is relatively low, this indicates that the memory cell is in a non-conductive state, such that its threshold voltage Vt is above the verify voltage. If the memory cell passes verify, programming of that memory cell is completed and further programming of that memory cell is inhibited for all remaining program loops by applying an inhibit voltage to a bit line coupled with the memory cell concurrent with the VPGM pulse. Programming proceeds until all memory cells pass verify for their intended data states, in which case, programming passes, or until a predetermined maximum number of program loops is exceeded, in which case, programming fails. In some embodiments, the memory cells of a word line can be divided into a series of string groups, or simply strings, that can be programmed independently of one another, and programming can commence from one string to another across the word line before proceeding to the next word line in the memory block.

In addition to the verify operations described above, a bitscan operation also may be performed to determine when programming is complete for a group of memory cells, e.g., a plurality of memory cells in a selected word line that are being programed to a given data state or that are being erased. As used herein, a "bitscan" is an operation that counts a number of memory cells whose programming characteristic has not shifted above or below a particular verify voltage level for a particular data state or has shifted above the verify voltage, depending on a particular application. In some embodiments, a bitscan may include a bitcount operation that counts a number of memory cells whose threshold voltages Vt have not shifted above a particular verify voltage Vv level for a particular data state. For example, a data state Sn bitscan is a count of a number of data state Sn memory cells who fail verify, i.e., whose threshold voltages Vt have not shifted above a verify voltage level Vvn for data state Sn. Likewise, a state Sn+1 bitscan is a count of a number of state n+1 memory cells whose threshold voltages Vt have not shifted above a verify voltage level Vvn+1 for data state Sn+1, and so on. In some other embodiments, a bitscan may be a count of the number of memory cells that pass verify, i.e., whose threshold voltages Vt have shifted above a verify voltage level Vvn.

Programming of memory cells for a particular memory state Sn may be considered complete if the bitscan count for a particular state is less than a predetermined bit scan pass fail (BSPF) threshold. In some embodiments, the BSPF threshold is less than a number of read errors that can be corrected by the ECC engine of the memory device. In other words, programming of memory cells for a particular memory state Sn may be considered complete even though all memory cells that are to be programmed to the particular memory state Sn do not have threshold voltages that have shifted above a verify voltage level Vvn for the data state Wn as long as the number of "failing" memory cells is less than a number of read errors that can be corrected by the ECC engine.

Bitscan operations typically are performed based on results of verify operations for a particular program-verify iteration. In particular, the results of the verify operations may be used to calculate the bitscan for a particular memory state.

Bitscan may also be performed following erase-verify in an erase operation to count the number of memory cells whose threshold voltages Vt whose memory threshold voltages Vt are greater than an erase verify voltage, as discussed in further detail below.

Conventionally, the result of a bitscan operations is binary. That is, either bitscan passes (for example, if the number of failed memory cells is less than the BSPF threshold) or fails (for example, if the number of failed memory cells is greater than the BSPF threshold). The present disclosure improves on these techniques by allowing the bitscan operation to produce additional (non-binary) results. A bitscan operation which produces non-binary results (greater than two possible options) is hereinafter referred to as "analog bitscan." For example, if a bitscan operation passes, some analog bitscan operations can determine if the pass was a strong pass (where the number of failed memory cells is significantly less than the BSPF threshold) or a weak pass (where the number of failed memory cells is equal to or barely less than the BSPF threshold). Likewise, if the bitscan operation fails, some analog bitscan operations can determine if the fail was a strong fail (where the number of failed memory cells is significantly higher than the BSPF threshold) or a weak fail (where the number of failed bits is barely above the BSPF threshold).

In some embodiments discussed below, an analog bitscan operation may produce even more than four possible outputs, or bins. By expanding the bitscan results to provide additional information beyond just the binary pass/fail of conventional bitscan operations, programming and erasing algorithms and modes can be optimized with dynamic control for improving performance, reliability, and/or endurance. For example, in some embodiments, program verify can be skipped in certain program loops to improve performance. In some other embodiments, different dVPGM or dVERA voltages can be dynamically applied to improve performance and/or endurance. In still other embodiments, extra verify operations can be triggered to improve reliability. These and other features and advantages are discussed in further detail below.

A first example of an analog bitscan operation utilizes a busy time detector to determine the output (for example, "strong fail," "weak fail," "weak pass," or "strong pass".) When a bitscan operation fails, it immediately ceases after the number of failed bits exceeds the BSPF threshold. Thus, a word line that fails bit scan with a large number of failed bits (a strong fail) will fail bitscan more quickly than a word line that fails bitscan with a comparatively smaller number of failed bits (a weak fail). Similarly, counting failed bits takes some time during the bitscan operation. Therefore, a word line with a relatively low number of failed bits (strong pass) will pass bitscan more quickly than a word line with a relatively higher (but still passing) number of failed bits (weak pass). In this example embodiment, the magnitude of a bitscan pass (strong pass/weak pass) or a bitscan fail (strong fail/weak fail) is essentially determined based on the time, or busy time, of the bitscan operation.

The analog bitscan operation begins with determining whether bitscan passed or failed by comparing the number of failed bits (memory cells) to the BSPF threshold. Then, a busy time detector determines if a bitscan pass or fail was strong or weak pass. The amount of time to complete the bitscan operation is proportional to Busy Time, which can be determined using a mathematical formula, such as:

$$\text{Busy Time} = 1 + (\text{DBUS\_Precharge\_Cycle} + 1) + (\text{DBUS\_Discharge\_Cycle} + 1) + (\text{Detection\_Time\_1\_Tier\_No\_Error}) * (\#\_of\_Tiers\_Execute) + (\#\_of\_Fail\_Bits)/8$$

DBUS is an internal bus that connects the user cache to internal data latches. DBUS_Precharge_Cycle thus is a count of clock cycles that are required to precharge the DBUS, and DBUS_Discharge_Cycle is a count of clock cycles that are required to discharge the DBUS. Both DBUS_Precharge_Cycle and DBUS_Discharge_Cycle are thus pre-set parameters. In an example embodiment, both are set at five (5) cycles. Detection_Time_for_1_Tier_No_Error is also a parameter and is set at thirty-one (31) cycles in an example embodiment but can also be set at different levels in other embodiments. The variable #_of_Tiers_Executed includes the number of tiers in a page. In an example embodiment, the number of tiers is sixteen (16). The variable #_of_Fail_Bits increases the Busy Time with each failed bit (memory cell) that is detected.

An example table which illustrates an example of how the Busy Time can be used to determine the magnitude of a bitscan pass or a bitscan fail is provided in FIG. 11. In this example, the BSPF threshold is set at one hundred and twenty (120) bits, and the bitscan is a four-tier bitscan. There are four possible outputs for this example analog bitscan operation: strong fail, weak fail, weak pass, and strong pass. In some embodiments, more bins could be added, e.g., medium fail and medium pass. The bitscan status of pass/fail is first determined by comparing the number of failed bits to the BSPF threshold.

Once the bitscan status is determined, the Busy Time may be calculated using a formula, such as the formula presented above. If Busy Time is less than a Busy Time threshold (for example, one hundred and fifty [150] cycles) then if the bitscan status is pass, the output is strong pass and if the bitscan status is fail, then the output is strong fail. On the other hand, if Busy Time is greater than or equal to the Busy Time threshold, then if the bitscan status is pass, the output is weak pass, and if the bitscan status is fail, the output is weak fail.

By way of example, if the analog bitscan operation fails (failed bits exceeded the BSPF threshold) while scanning the first tier, then Busy Time will naturally be below the busy time threshold and the output is strong fail. On the other hand, if the bit scan operation failed while scanning the last tier, then Busy Time will be equal to or above the busy time threshold and the output is weak fail. In other words, if the bitscan operation was completed relatively quickly, then the output is strong fail, and if the bitscan operation was completed relatively slowly, then the output is weak fail.

In the case where the bitscan status is pass, according to the above formula if there are very few failed bits, Busy Time will be lower as compared to a case where there are many failed bits because the variable (#_of_Fail_Bits) will be low. Thus, if the bitscan status is pass and Busy Time is less than the Busy Time threshold, the output is a strong pass. In other words, if the bitscan operation was completed relatively quickly, then the output is strong pass, and if the bitscan operation was completed relatively slowly, then the output is weak pass. The Busy Time threshold for a pass may be the same as or different than the Busy time threshold for a fail.

Figure 18:
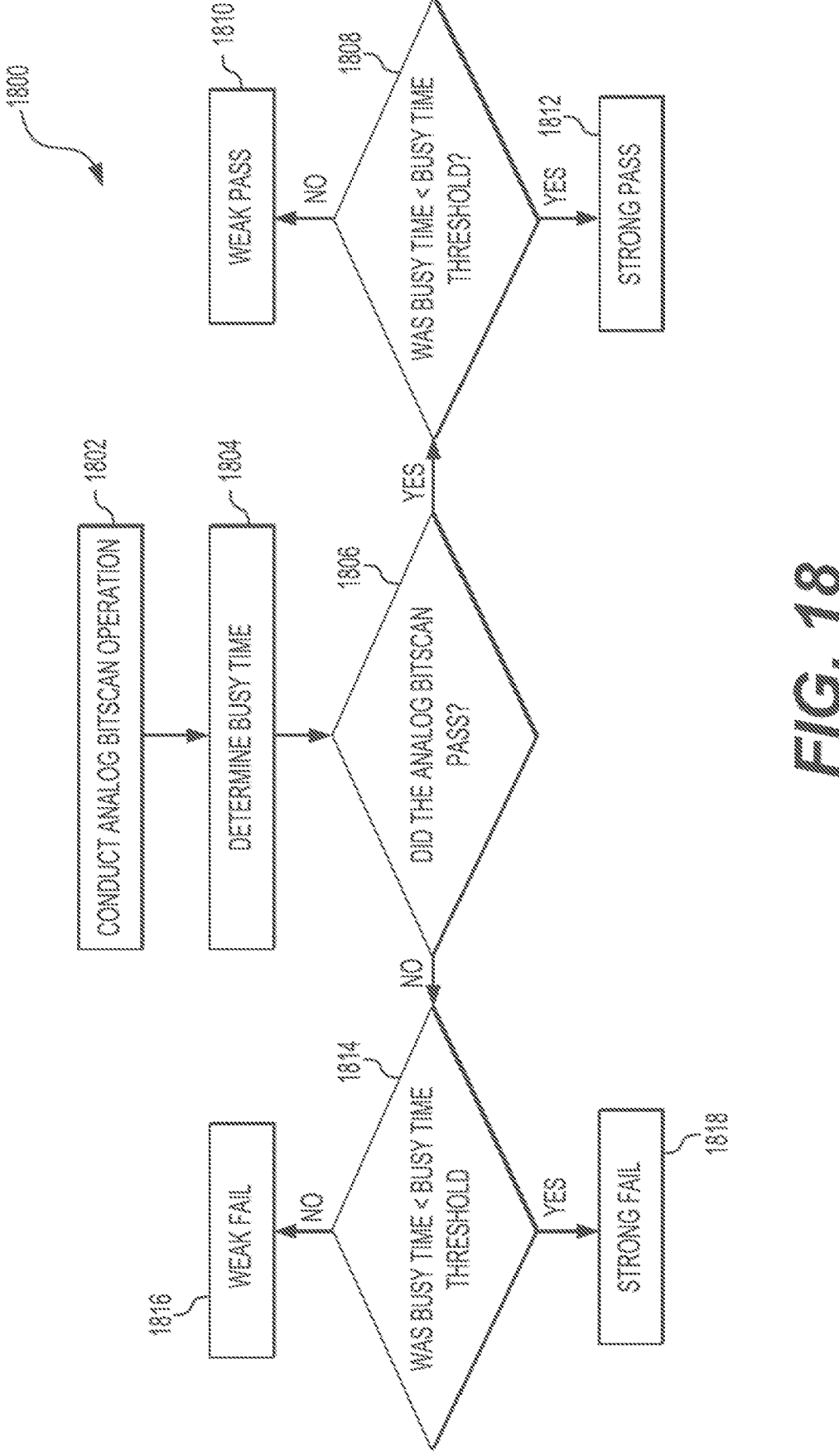
FIG. 18 is a flow chart containing the steps of performing another example embodiment of an analog bitscan operation.

Turning now to FIG. 18, a flow chart 1800 depicting an example embodiment of the present disclosure is provided. These steps could be performed by the controller, a processor or processing device or any other circuitry, executing instructions stored in memory, and/or other circuitry described herein that is specifically configured/programmed to execute the following steps.

At step 1802, an analog bitscan operation is performed to count the failed bits and compared the number of failed bits to the BSPF threshold. At step 1804, the Busy Time is determined, for example, by using the Busy Time formula set forth above.

At decision step 1806, it is determined if the analog bitscan operation passed. If the answer at decision step 1806 is "yes," then at decision step 1808, it is determined if Busy Time is less than the Busy Time threshold. If the answer at decision step 1808 is "no," then at step 1810, the output of the analog bitscan operation is weak pass. If the answer at decision step 1808 is "yes," then at step 1812, the output of the analog bitscan operation is strong pass.

If the answer at decision step 1806 is "no," then at decision step 1814, it is determined if Busy Time is less than the Busy Time threshold. If the answer at decision step 1814 is "no," then the output of the analog bitscan operation is weak fail. If the answer at decision step 1814 is "yes," then the output of the analog bitscan operation is strong fail.

In the example depicted in FIGS. 11, 12, and 18, the bitscan operation scanned four tiers of the page. In some embodiments, as few as a single tier can be scanned during the bitscan operation. In some embodiments where multiple tiers are scanned, whether a bitscan fail is a strong fail or a weak fail can be determined based on which tier was being scanned when the bitscan operation finished. For example, if four tiers are scanned and the bitscan operation failed during the scanning of any of the first three tiers, then the failure tier info will be plugged into the Busy Time formula, which will increase the Busy Time and likely result in a strong fail output. However, if the bitscan operation failed during scanning of the fourth tier, then the output can be weak fail. If only one tier is scanned, then a count of clock cycles can be used to determine if the output is strong fail or a weak fail.

Turning now to FIGS. 12 and 13, depicted in this Figure are a busy control signal YBUSYn that remains activated during the bitscan operation, an oscillator TMOSC_SMB, and a clock CLK counter that counts the cycles of the oscillator during the bitscan operation. Based on the clock count, parameters are set which determines if a bitscan fail is a strong fail or a weak fail and if a bitscan pass is a strong pass or a weak pass during an analog bitscan operation that includes only a single tier scan.

Specifically, the CLK counter is compared to a counter threshold. If the CLK counter is less than the counter threshold at the end of scanning, then the output is strong fail, and if the CLK counter is equal to or greater than the counter threshold, then the output is weak fail. The counter threshold can be set at any suitable level to separate a strong fail condition from a weak fail.

As for determining if a pass was a strong pass or a weak pass, separate parameters BSPF_ABSCAN_WP, BSPF_ABSCAN_SP are provided to change the Busy Time that separates a strong pass from a weak pass. Specifically, when determining if a pass is a weak pass, the difference between BSPF and BSPF_ABSCAN_WP (BSPF−BSPF_AB-SCAN_WP) is input into the above Busy time formula in place of (#_of_Fail_Bits/8) to establish a Busy Time weak pass threshold. The number of clock cycles during the bitscan operation is then compared against the Busy Time threshold. If the number of clock cycles is greater than the Busy Time weak pass threshold, then the output is weak pass. Similarly, the difference between BSPF and BSPF_ABSCAN_SP can be calculated and plugged into the above formula to establish a Busy Time strong pass threshold. The number of clock cycles to complete the bitscan operation is then compared to the Busy Time strong pass threshold. If the number of clock signals is less than the Busy Time strong pass threshold, then the output is strong pass. Conversely, if the number of clock cycles to complete the bitscan operation is greater than the Busy Time strong pass threshold, then the output is weak pass.

According to another exemplary embodiment, the determination of whether a bitscan fail is strong or weak is based on which tier was being scanned at the time of the bitscan fail. As discussed above, a page may be divided up into a plurality of tiers, e.g., sixteen (16) tiers (Tiers 0-15) in an example embodiment. The bitscan operation can scan all sixteen tiers or only some of those tiers, e.g., every other tier, every fourth tier, or only two tiers. FIG. 14 is a table which depicts different tier scanning options, the tier scanning order, and the outputs based on which tier is being scanned at the time of bitscan fail. For example, in a sixteen-tier scan, if the failure occurs during the scanning of Tier 0-Tier 3, then the output is strong fail. If the failure occurs during the scanning of Tier 12-Tier 15, then the output is weak fail. If the failure occurs during any of the other tiers, then the output is a regular fail or "medium fail." Additional bins may be possible, depending on how many tiers are scanned. Also, the barriers between these bins can be set as appropriate for a given memory device or operation. In a two-tier scan, only two failure bins (strong fail, weak fail) are possible according to the techniques of this embodiment.

Figure 19:
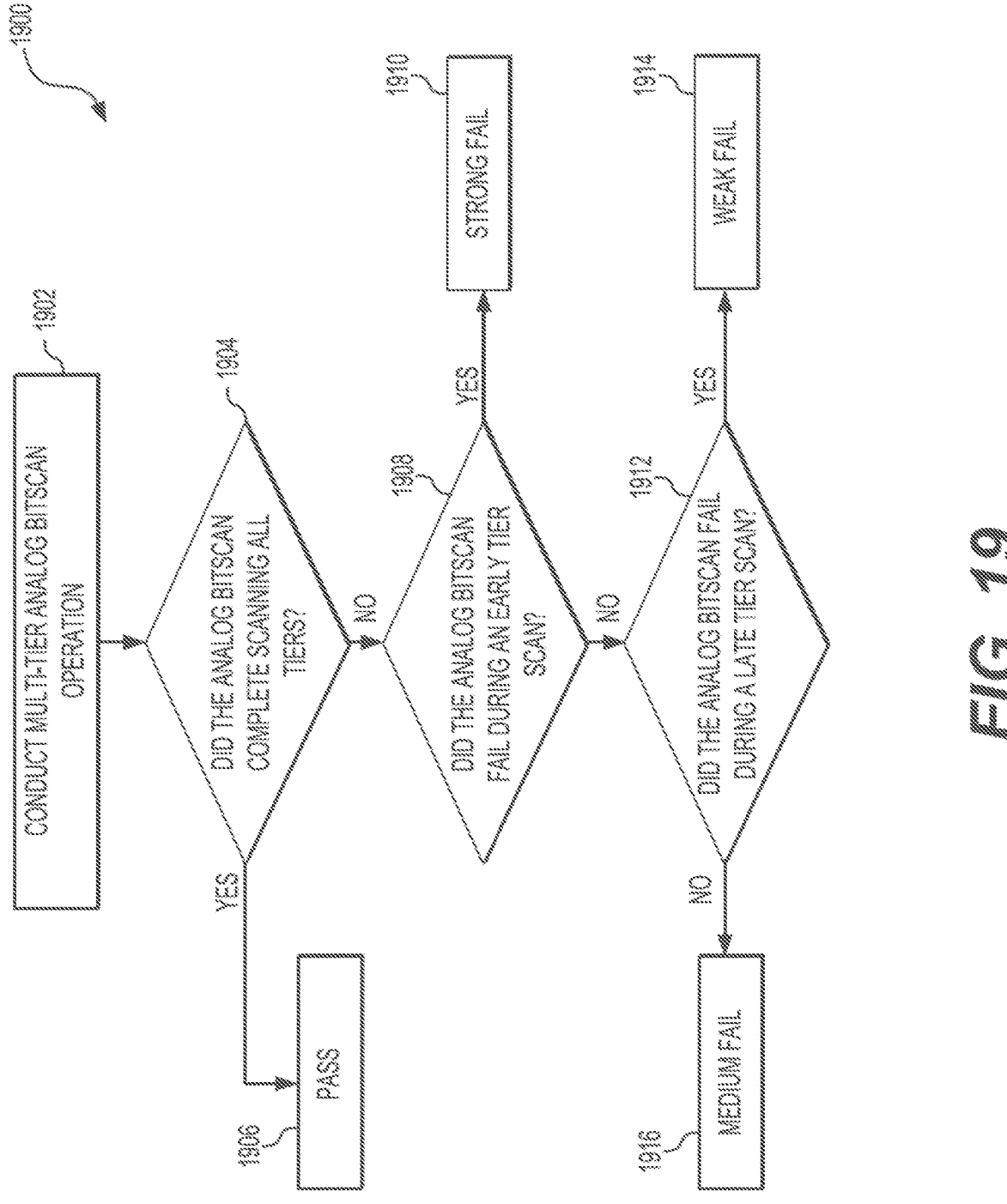
FIG. 19 is a flow chart containing the steps of performing yet another example embodiment of an analog bitscan operation.

FIG. 19 depicts a flow chart 1900 depicting an example embodiment of the present disclosure is provided. These steps could be performed by the controller, a processor or processing device or any other circuitry, executing instructions stored in memory, and/or other circuitry described herein that is specifically configured/programmed to execute the following steps.

At step 1902, a multi-tier analog bitscan operation is performed on a page, e.g., a selected word line being programmed. At decision step 1904, it is determined if the analog bitscan operation completed scanning all of the tiers and the number of failed bits is also less than or equal to the BSPF threshold. If the answer at decision step 1904 is "yes," then at step 1906, the output of the analog bitscan operation is "pass."

If the answer at decision step 1904 is "no," then the process proceeds to decision step 1908. At decision step 1908, it is determined if the analog bitscan operation failed during an early tier scan, e.g., one of the first four tiers scanned in a sixteen tier scan. If the answer at decision step 1908 is "yes," then at step 1910, the output of the analog bitscan operation is strong fail.

If the answer at decision step 1908 is "no," then the process proceeds to decision step 1912. At decision step 1912, it is determined if the analog bitscan operation failed during a late tier scan, e.g., one of the last four tiers scanned in a sixteen tier scan. If the answer at decision step 1912 is "yes," then at step 1914, the output of the analog bitscan operation is weak fail. If the answer at decision step 1912 is "no," then at step 1916, the output of the analog bitscan operation is "medium fail."

In the example embodiment of FIG. 14, the tiers are scanned sequentially in order from Tier 0 to Tier 15. However, in some embodiments, other orders may be employed. The outputs will be adjusted accordingly such that the output is strong fail if failure occurs during scanning of one of the first tiers (regardless of its Tier #) and the output is weak fail if failure occurs during scanning of one of the last tiers (regardless of its Tier #).

One drawback to the example embodiment of FIG. 14 is that this embodiment does not allow the analog bitscan operation to differentiate between a weak pass and a strong pass, i.e., the output for any completion of the bitscan operation is just a pass. Turning now to FIG. 15, according to another exemplary embodiment, a weak pass can be detected by adjusting (reducing) the BSPF threshold from a baseline downwardly such that BSPF_adj is at a lower quantity than that the ECC engine can easily correct. Specifically, the BSPF threshold is set at an adjusted (reduced) level BSPF_adj prior to the bit scan. Then, if the bitscan operation fails during scanning of the last tier or one of the last tiers, the output is weak pass and if the bitscan passes even at the higher BSPF_adj level, the output is strong pass because the number of failed bits must actually be less than the baseline BSPF threshold. In other words, in this embodiment, the tiers are binned and failure during each bin may either be a strong fail, a weak fail, or a weak pass, and any pass at the adjusted BSPF is a strong pass.

In some embodiments, the tiers are selected to cover memory hole variations such that each tier is associated with memory holes that come from a specific row (e.g., see the rows in FIG. 7B). Selecting the tiers in this manner ensures that each tier includes memory cells that will have a range of different behaviors (fast to program and slow to program), and thus, each tier represents a cross-section of similar cell behaviors.

According to another embodiment, multiple BSPF windows or ranges are established, and which option (for example, strong fail, weak fail, weak pass, or strong pass) is output depends on which BSPF window the fail bit count (FBC) falls within. The BSPF windows are defined by predetermined BSPF criteria. For example, in the embodiment depicted in the table of FIG. 16, the baseline BSPF is one criteria. The other exemplary criteria are BSPF_ABSCAN_F, which is greater than BSPF, and BSPF_ABSCAN_P, which is less than BSPF. These three criteria define four total windows: a first window that includes FBC greater than BSPF_ABSCAN_F; a second window that includes FBC between BSPF_ABSCAN_F and BSPF; a third window that includes FBC between BSPF and BSPF_ABSCAN_P; and a fourth window that includes FBC below BSPCF_ABSCAN_P.

In this example, the analog bitscan operation is performed to determine the FBC. If the FBC in the first window (FBC>BSPF_ABSCAN_F), then the output is strong fail. If the FBC is in the second window (BSPF<FBC≤BSPF_ABSCAN_F), then the output is weak fail. If the FBC is in the third window (BSPF_ABSCAN_P<FBC≤BSPF), then the output is weak pass. If the FBC is less than the fourth window (FBC≤BSPF_ABSCAN_P), then the output is strong pass.

Figure 17:
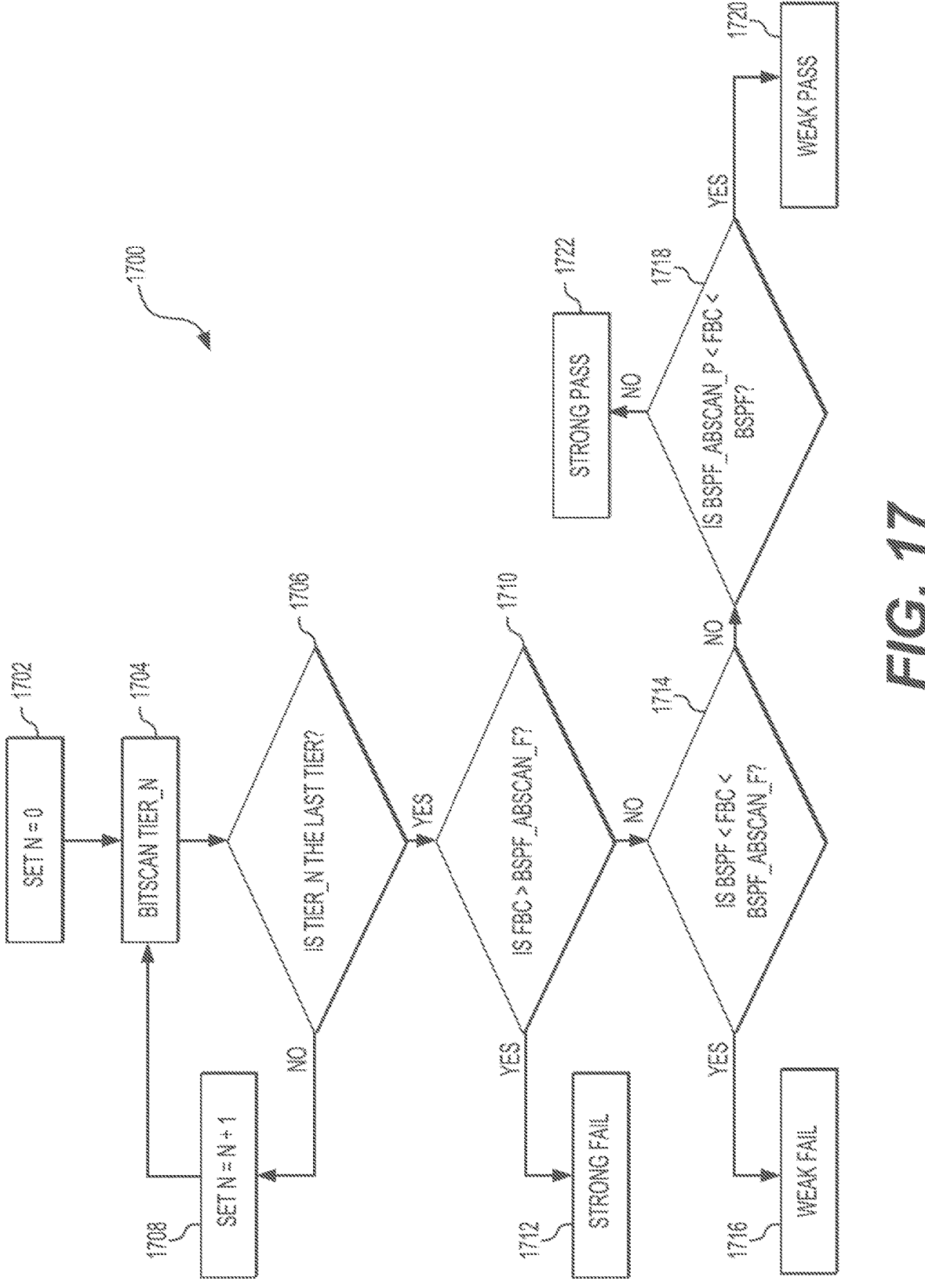
FIG. 17 is a flow chart containing the steps of performing an example embodiment of an analog bitscan operation.

Turning now to FIG. 17, a flowchart 1700 is depicted that includes the steps of conducting an analog bitscan operation according to one embodiment of the present disclosure. These steps could be performed by the controller, a processor or processing device or any other circuitry, executing instructions stored in memory, and/or other circuitry described herein that is specifically configured/programmed to execute the following steps.

At step 1702, the variable n is set to zero so that the first tier to be scanned is Tier 0. This numbering format is intended to be exemplary in nature, and in some embodiments, the numbering may be different and the first tier to be scanned could be some tier other than Tier 0.

At step 1704, the bitscan operation is performed on Tier_n and the failed bits are counted and included in the FBC. At decision step 1706, it is determined if Tier_n is the last tier to be scanned. If the answer at decision step 1706 is "no," then at step 1708, the tier to be scanned next is incrementally advanced. In the exemplary embodiment, this involves incrementally advancing the variable n, i.e., n=n+1. In some embodiments, every other tier or every fourth tier can be scanned, in which case, n may be incrementally increased by two or four. In some other embodiments, the tiers can be scanned in a very different order, and in those embodiments, the tiers being scanned can be advanced in a different way. The process then returns to step 1704.

If the answer at decision step 1706 is "yes," then at decision step 1710, it is determined if FBC is greater than BSPF_ABSCAN_F. If the answer at decision step 1710 is "yes," then at step 1712, the output is strong fail, and the process ends.

If the answer at decision step 1710 is "no," then at decision step 1714, it is determined if FBC is between BSPF_ABSCAN_F and BSPF. If the answer at decision step 1714 is "yes," then at step 1716, the output is weak fail, and the process ends.

If the answer at decision step 1714 is "no," then at decision step 1718, it is determined if FBC is between BSPF and BSPF_ABSCAN_P. If the answer at decision step 1718 is "yes," then at step 1720, the output is weak pass, and the process ends. If the answer at decision step 1718 is "no," then at step 1722, the output is strong pass, and the process ends.

According to this embodiment, the scan must be completed for all tiers that are to be scanned, i.e., the failed bits must be counted to the last tier. In other words, the bitscan operation cannot cease if the FBC exceeds the BSPF threshold as is the case in the embodiments described above. However, in an alternate embodiment, in between steps 1704 and 1706, an additional decision step can be introduced to determine if FBC is greater than BSPF_ABSCAN_F. This additional decision step determines if a strong fail condition has already been reached. If the answer at this additional decision step is "yes," then the process proceeds straight to step 1712 and the process ends with a strong fail output.

The fail bit count detector that performs or contributes to the performance of these steps can be incorporated into a range of different circuits within a memory device.

Another aspect of the present disclosure is related to the use of an analog bitscan operation, such as any of the techniques and embodiments discussed above, to improve erase efficiency and improve the operating life, or endurance, of the memory device.

An erase operation involves transitioning the memory cells from their respective programmed data states (e.g., data states S1-S7 in FIG. 9) to the erased state Er so that they can be re-programmed to contain new data. During the erase operation, it is desired to lower the threshold voltages Vt of the memory cells below an erase-verify level that represents an upper bound of the erased data state Er. An erase operation often includes a number of erase loops, each including an erase portion followed by an erase-verify operation. The erase operation is typically performed on a memory block or sub-block level rather than a word line level. In other words, one memory block or a sub-block, which includes many word lines, is erased at a time.

In the erase portion of an erase loop, circuitry in the memory device applies an erase voltage VERA to the strings of the memory block via the bit lines and/or the source line while a very low voltage (for example, zero Volts) is applied to the word lines of the memory block to provide a positive channel-to-gate voltage difference for the memory cells of the memory block to tunnel holes from the channel to the charge storing materials of the memory cells, thereby reducing the threshold voltages Vt of the memory cells. In the verify portion, a verify voltage is applied to the word lines and sensing circuitry is used to sense currents in the NAND strings to determine if the memory cells have been sufficiently erased. If an insufficient number of memory cells have been sufficiently erased, then this process is repeated in one or more subsequent erase loops until the erase-verify operation passes. In between erase loops, the erase voltage may be increased by a step size dVERA similar to how the programming voltage VPGM increases by dVPGM between programming loops.

Figures 20, 21:
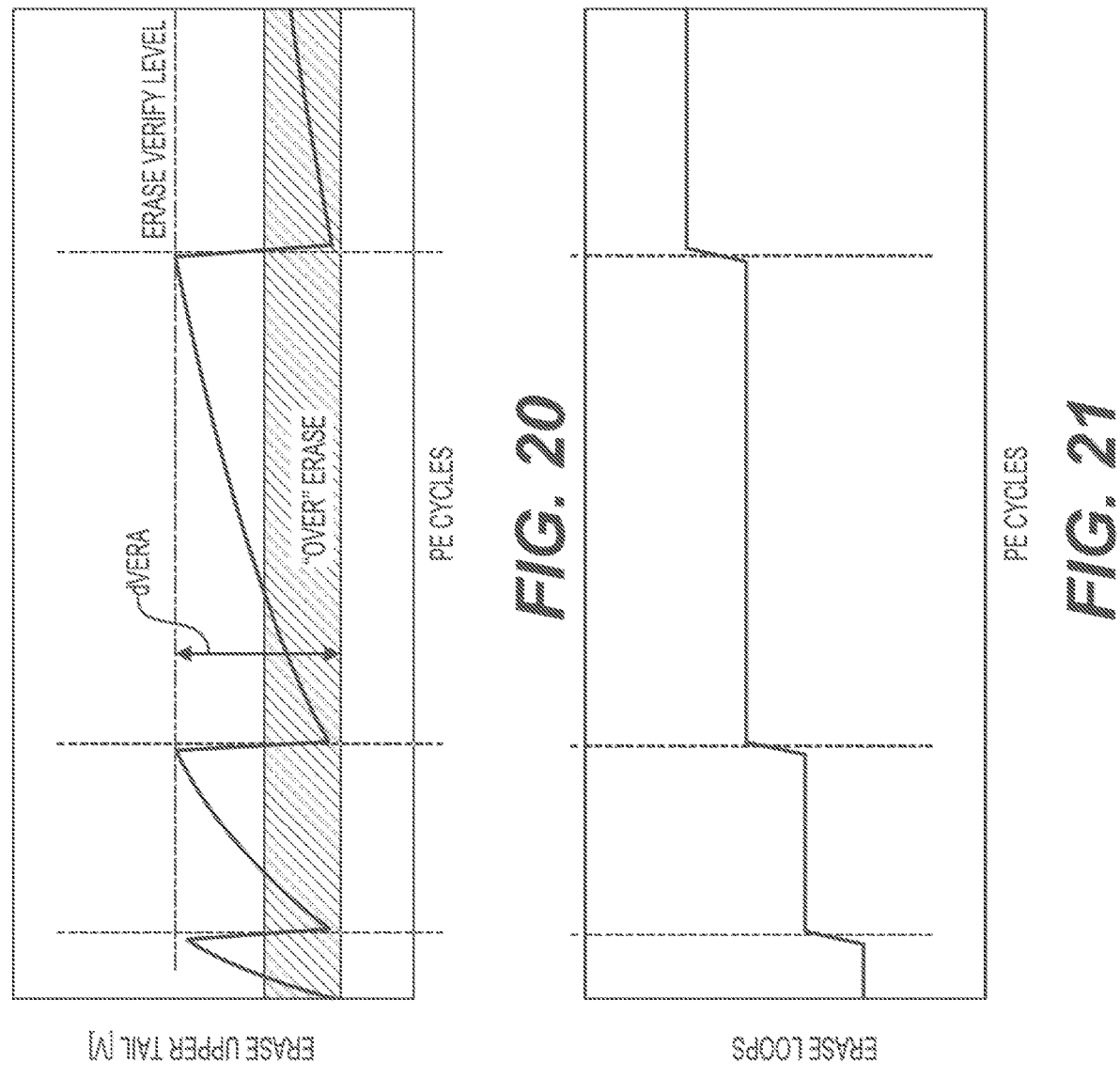
FIG. 20 is a plot of erase upper tail versus programming and erasing cycles during the operating life of a memory block for one example.
FIG. 21 is a plot of erase loops versus programming and erasing cycles during the operating life of a memory block for the same example of FIG. 20.

An unnecessarily deep erase where the threshold voltages Vt of the memory cells are significantly lower than the erase-verify voltage can reduce the endurance of the memory device and/or lead to data retention degradation. It is also known that with increased programming and erasing cycling, the memory cells become slower to erase and may require additional erase pulses to bring their threshold voltages Vt below the erase-verify voltage as compared to when the memory device is at the beginning of its operating life. Each time the number of erase loops to pass erase-verify increases with program-erase cycling, the erase depth is reduced by approximately the same voltage magnitude as the step size dVERA. For example, FIG. 20 is a plot of erase upper tail versus program-erase (PE) cycles in an example memory device, and FIG. 21 is a plot of erase loops to complete erase versus program-erase cycles. The erase-verify level is illustrated, and an "over-erase" voltage range is highlighted. As illustrated, the erase upper tail increases with program-erase cycling due to slowing erase speeds of the memory cells until the upper tail reaches the erase-verify level, at which point, an extra erase loop is triggered and added to each subsequent erase operation. When this happens, the erase upper tail falls by approximately the step size dVERA into the "over-erase" zone, thereby increasing degradation in the memory cells. One approach to avoid over-erase is to use a small step size dVERA, but this can come at the cost of erase time (performance) because it will require additional erase loops to complete the erase operation.

According to an aspect of the present disclosure, the analog bitscan operation is utilized in each erase loop to enable a more finely controlled erase depth with a minimal performance penalty. According to these techniques, the erase voltage step size dVERA that the erase voltage VERA is increased by between erase loops is set as a function of the output of the analog bitscan operation. In some embodiments, if the output of the analog bitscan operation is weak fail (i.e., the threshold voltages Vt of the memory cells are barely above the erase-verify voltage), then the erase voltage VERA can be increased by a reduced step size (for example, dVERA/2) and the erase-verify operation can be skipped in a final erase loop. This allows for improved erase accuracy and a reduction in the threshold voltages Vt of the memory cells reaching the over-erased zone.

Figure 22:
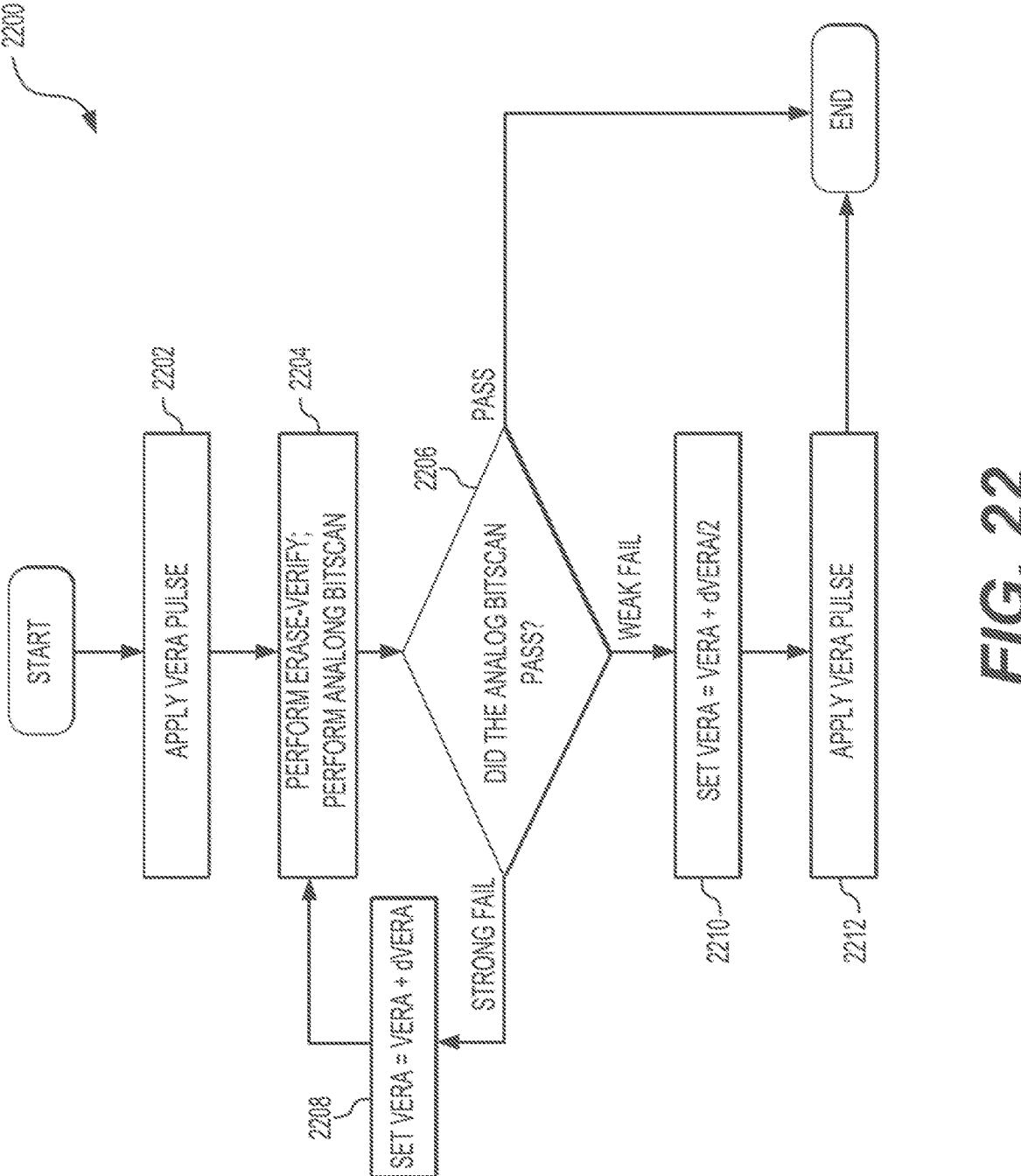
FIG. 22 is a flow chart containing the steps of performing an erase operation that includes an analog bitscan operation.

FIG. 22 is a flow chart 2200 that depicts the steps of erasing a memory block or sub-block according to one embodiment of these techniques. These steps could be performed by the controller, a processor or processing device or any other circuitry, executing instructions stored in memory, and/or other circuitry described herein that is specifically configured/programmed to execute the following steps.

At step 2202, an erase pulse at an erase voltage VERA is applied to the NAND strings of a memory block to be fully erased itself or containing a sub-block to be erased. The VERA voltage can be applied to a drain side of the NAND strings; to a source side of the NAND strings; or to both the source and drain sides. At step 2204, an erase-verify operation is performed on the memory block or sub-block to determine if a sufficient number of memory cells in the memory block or sub-block have threshold voltages Vt that are below the erase-verify voltage. Also at this step, the analog bitscan operation is performed to determine if erase-verify failed strongly, failed weakly, or passed.

Figures 23A, 23B, 23C:
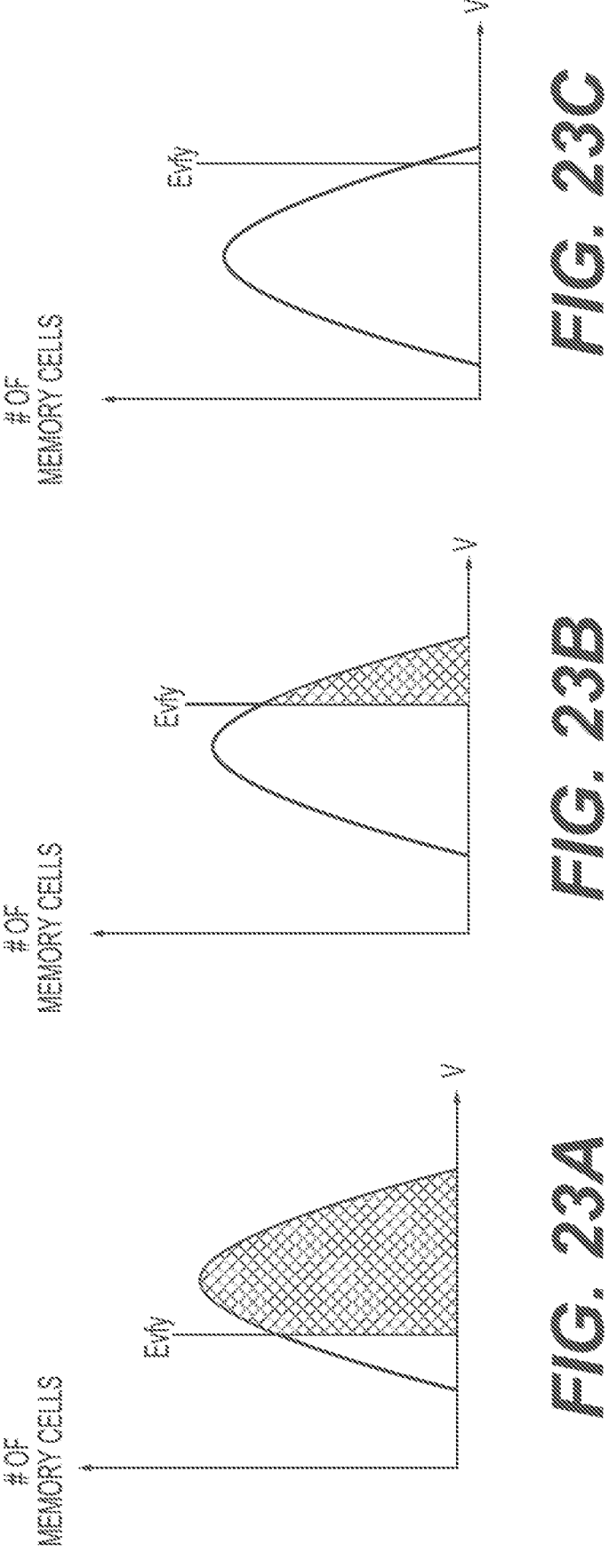
FIG. 23A is a threshold voltage distribution plot illustrating a condition that would produce a strong fail output of an analog bitscan operation.
FIG. 23B is a threshold voltage distribution plot illustrating a condition that would produce a weak fail output of an analog bitscan operation.
FIG. 23C is a threshold voltage distribution plot illustrating a condition that would produce a pass output of an analog bitscan operation.

At decision step 2206, it is determined if the analog bitscan operation passed. If the answer, or output, at decision step 2206 is strong fail, then the process proceeds to step 2208. An example threshold voltage distribution that would produce a strong fail result is illustrated in FIG. 23A because a large number of memory cells have threshold voltages Vt that are higher than the erase-verify voltage. At step 2208, the erase voltage VERA is increased by a first step size dVERA. The process then returns to step 2202 to begin another erase loop.

If the output at decision step 2206 is weak fail, then the process proceeds to step 2210. An example threshold voltage Vt distribution that would produce a weak fail output is illustrated in FIG. 23B because a medium amount of memory cells have threshold voltages Vt that are higher than the erase-verify voltage. At step 2210, the erase voltage VERA is increased by a second step size that is less than the first step size, e.g., dVERA/2. In other embodiments, the second step size can be any suitable voltage that is less than the first step size dVERA. At step 2212, an erase pulse at the erase voltage VERA is applied to the memory block without a following erase-verify operation. The erase operation then ends.

If the output at decision step 2206 is pass (either a strong pass or a weak pass), then the erase operation ends right there without any more erase loops. An example threshold voltage Vt distribution that would produce a pass output is illustrated in FIG. 23C because a high amount of memory cells have threshold voltages Vt that are below than the erase-verify voltage, i.e., very few memory cells have failed erase-verify.

Figure 24:
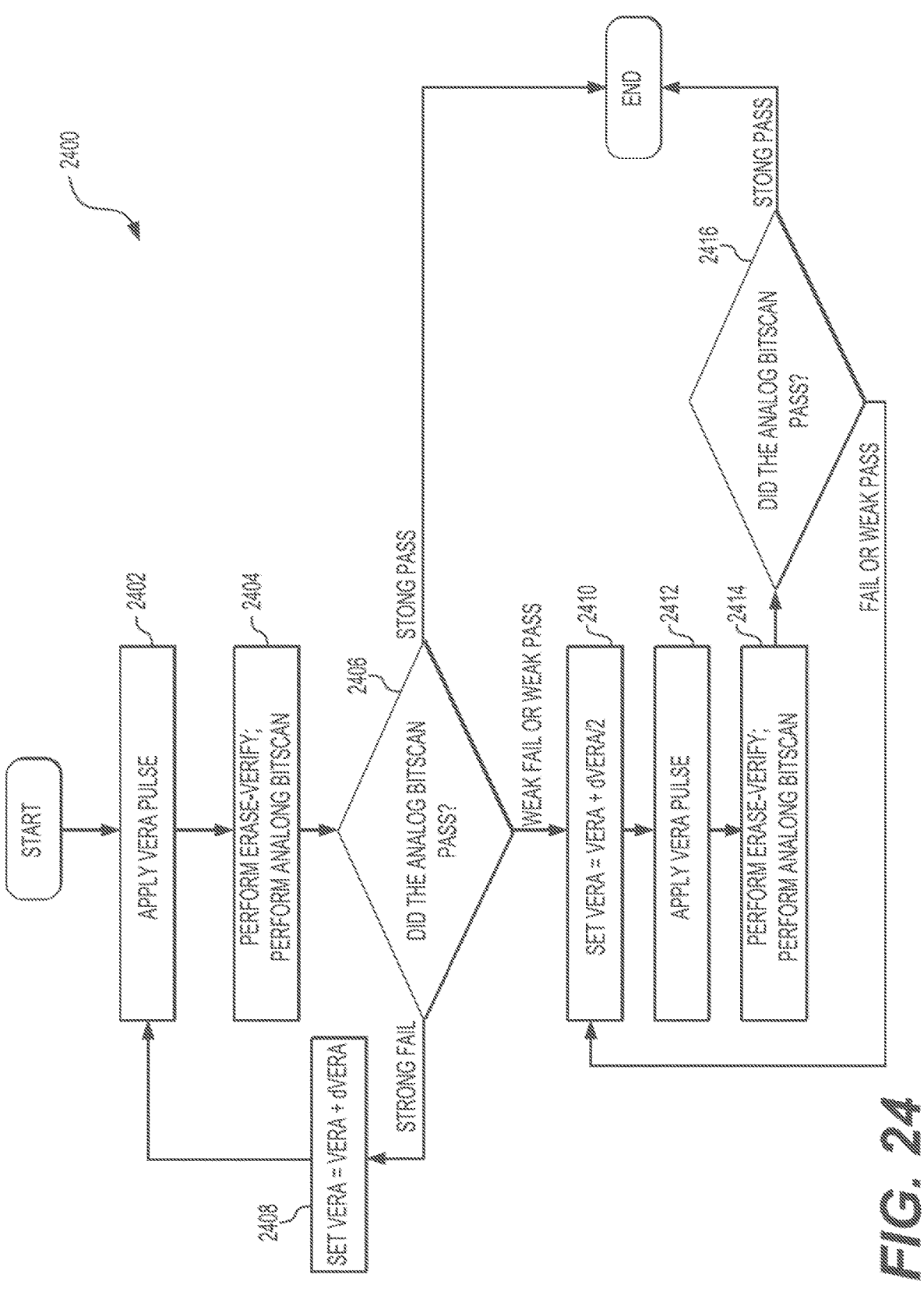
FIG. 24 is a flow chart containing the steps of performing an erase operation that includes an analog bitscan operation.

Turning now to the flow chart 2400 of FIG. 24, the steps of erasing the memory cells of a memory block or sub-block are depicted with like numerals, separated by a prefix of "24" rather than "22" identifying corresponding steps with the embodiment of FIG. 22. This embodiment is distinguished from the embodiment of FIG. 22 by, in the event that the output at 2406 is weak pass, the process proceeding to step 2410 rather than ending. Also, after the erase pulse at step 2412, at step 2414, an erase-verify operation is performed followed by an analog bitscan operation. At step 2416, it is determined if the analog bitscan passed. The process only ends if the output at step 2416 is a strong pass. If the output at step 2416 is fail or weak pass, then the process returns to step 2410 to begin another erase-verify loop with the reduced erase voltage step size (dVERA/2). In this embodiment, the applied erase pulse is always verified with an erase verify VERA pulse prior to the process ending. In some alternate embodiments, if the output at decision step 2406 is either strong pass or weak pass, then the process ends and only a weak fail output results in the process proceeding to step 2410.

In some alternate embodiments, more than two step size voltages dVERA may be employed, wherein the step size that is selected is based on how strongly the bitscan operation passes or fails. In other embodiments, the erase strength can be adjusted by changing the erase duration or the biasing of the BL, source voltage, or other nodes.

Figure 25:
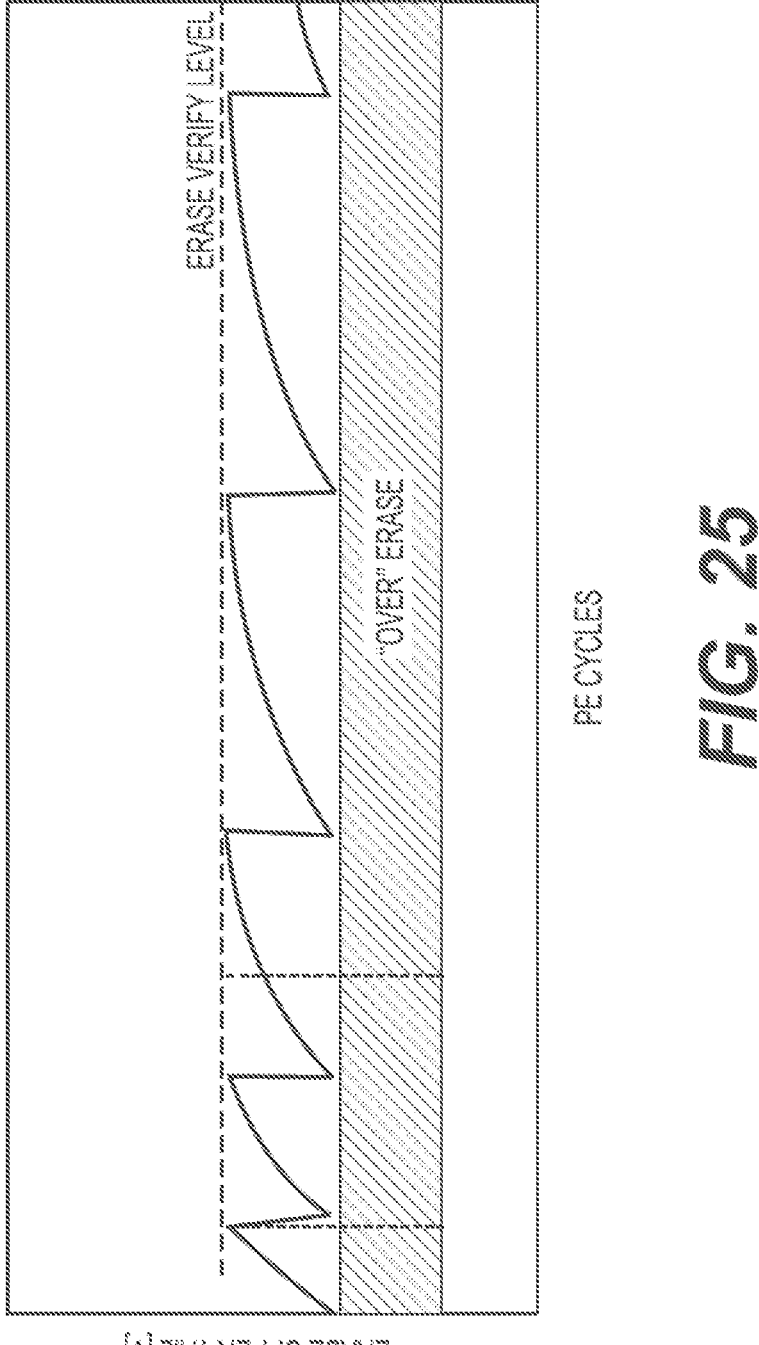
FIG. 25 is a plot of erase upper tail versus programming and erasing cycles during the operating life of a memory block for when utilizing analog bitscan techniques.

By reducing the step size voltage when the bitscan nearly fails, as illustrated in FIG. 25, over-erase is avoided, thereby protecting the memory cells from damage. As such, the overall endurance and performance of the memory device are both improved. FIG. 25 is similar to FIG. 20, but with the techniques of these exemplary embodiments having been applied. As illustrated, over-erase is substantially eliminated.

Another aspect of the present disclosure is related to the use of analog bitscan to improve the implementation of smart PCV during a programming operation. When programming to many bits of data per memory cell (for example, TLC or QLC), not all data states are verified in every program loop. Rather, in the early program loops, only the early data states are verified (e.g., S1 or S2) and in the later program loops, only the later data states are verified (e.g., S6 or S7). "Smart PCV" is a programming technique where the memory device dynamically decides when to begin verifying each of the data states being programmed during a programming operation, i.e., which program loop to start verify. For example, in some implementations, smart PCV dictates that verify should begin for the S2 data state in the program loop following some memory cells passing verify at the S1 data state.

Figures 26, 27:
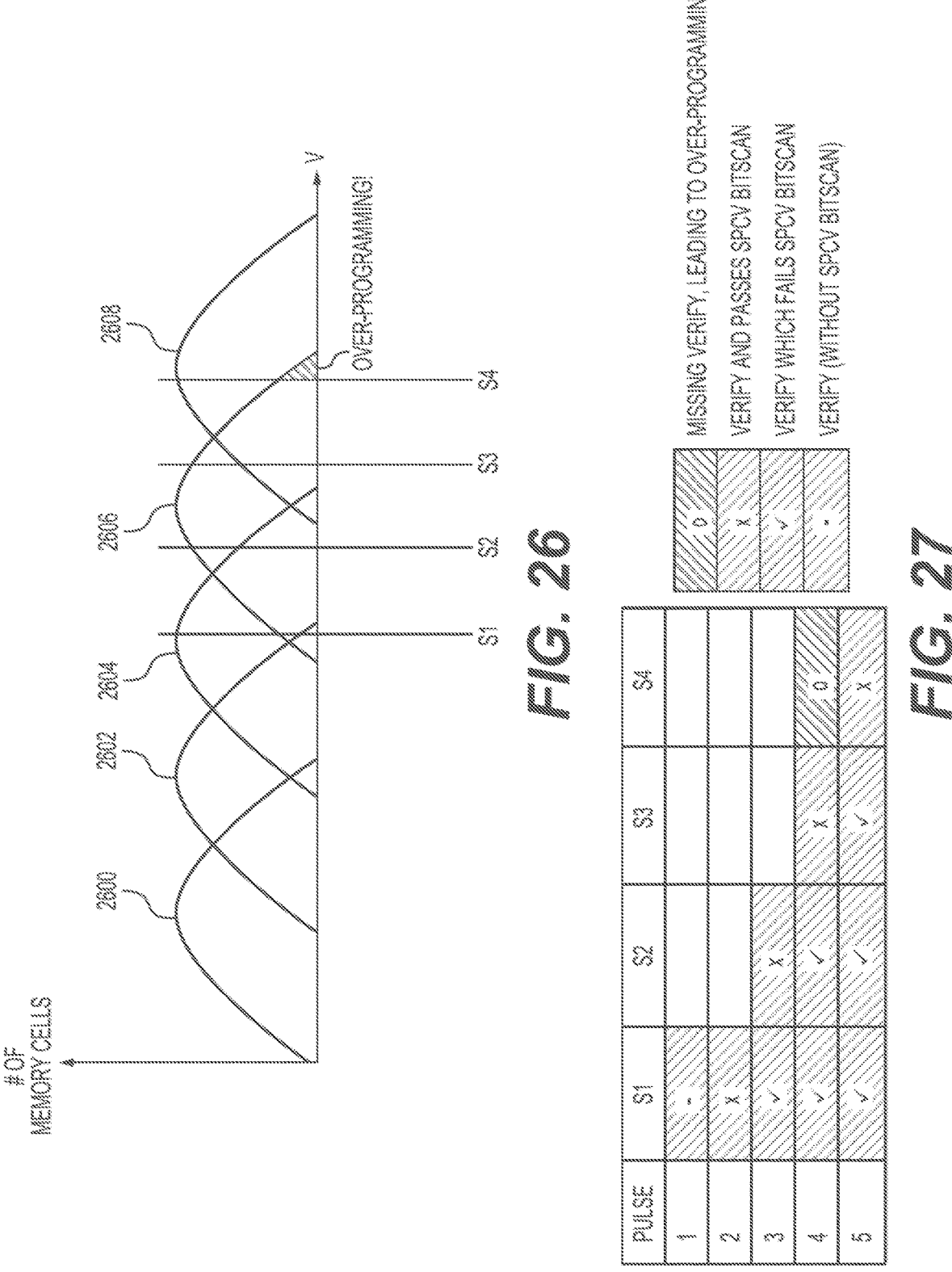
FIG. 26 is a plot of the threshold voltage distributions of a plurality of memory cells following a plurality of programming pulses according to an example.
FIG. 27 is a table illustrating what data states are verified in what programming loops according to the example that produces the result of FIG. 26.

Turning now to FIG. 26, the threshold voltage Vt distributions of a plurality of memory cells are illustrated following a first program loop 2600, a second program loop 2602, a third program loop 2604, a fourth program loop 2606, and a fifth program loop 2608. According to a smart PCV implementation where verify of data state Sn begins when some memory cells begin to pass verify at data state Sn-1, verify of data state S2 will begin following the second program loop 2602, and verify of data state S3 will begin following the third program loop 2604. However, in this example smart PCV technique, some over-programming of memory cells being programmed to the S3 data state could occur in the fourth program loop 2606. In other words, some memory cells that were intended for the S3 data state were unintentionally programmed into the voltage range associated with the S4 data state. This is also illustrated in the table of FIG. 27, which shows that some over-programming occurred in the fourth pulse. One solution to this is to perform additional verify operations, e.g., automatically start verify for each data state sooner. However, this more cautious approach reduces performance by requiring unnecessary verify pulses in cases where no over-programming would have occurred.

According to some embodiments of the present disclosure, a smart PCV technique is provided which more effectively prevents over-programming while avoiding unnecessary verify operations. Specifically, following each verify operation, an analog bitscan operation is performed to determine if verify was a strong pass (zero or very few memory cells passed verify), a weak pass (many memory cells passed verify, but fewer than the threshold), a weak fail (the number of memory cells that passed verify is barely above the threshold), or a strong fail (the number of memory cells that passed verify is significantly above the threshold). The output of the analog bitscan operation dictates which data states are verified during the subsequent program loop. In this embodiment, the number of memory cells that pass verify (rather than fail) is what is compared to the threshold.

Figure 28:
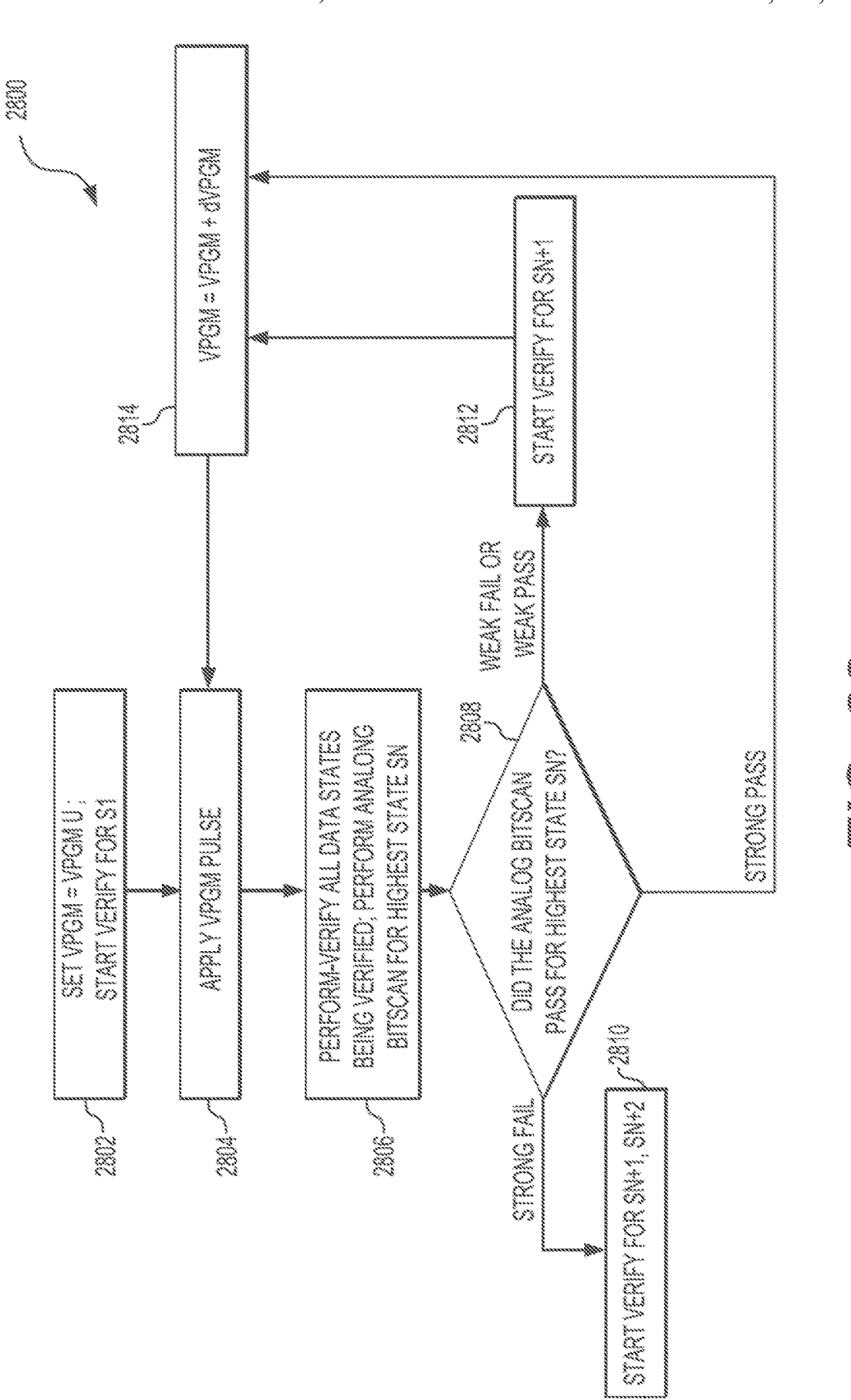
FIG. 28 is a flow chart containing the steps of performing a programming operation that includes an analog bitscan operation according to an example embodiment of the present disclosure.

FIG. 28 is a flow chart 2800 including the steps of programming the memory cells of a selected word line WLn according to an example embodiment of the present disclosure wherein an analog bitscan operation is utilized to establish when verify begins for certain data states. These steps could be performed by the controller, a processor or processing device or any other circuitry, executing instructions stored in memory, and/or other circuitry described herein that is specifically configured/programmed to execute the following steps.

At step 2802, the programming voltage VPGM is set at an initial level VPGMU, and verify is set to begin for the first programmed data state S1. At step 2804, the VPGM pulse is applied to the selected word line WLn. At step 2806, the verify operation is performed for all data states that are currently being verified. In the first instance, only data state S1 is verified. However, in later instances, additional data states will be verified, and some data states that have completed programming will not be verified, e.g., when programming of data state S1 is completed, then verify of data state S1 will not be performed at step 2806.

Also at step 2806, an analog bitscan operation is performed to determine how many memory cells passed verify for a highest data state SN that is being verified in this program loop. For this analog bitscan, a "pass" occurs when fewer memory cells pass verify than a threshold and a "fail" is if more memory cells pass verify than a threshold. The more memory cells that pass verify, the weaker the pass or the stronger the fail. Conversely, the fewer memory cells that pass verify, the stronger the pass or the weaker the fail. Also, the analog bitscan is only performed on the highest data state being verified in a given program loop, i.e., no analog bitscan operation is performed for data state SN-1.

At decision step 2808, it is determined if the analog bitscan operation passed for the highest data state being verified, i.e., SN. If the output at decision step 2808 is strong pass, then at step 2814, the programming voltage VPGM is incrementally increased, i.e., VPGM=VPGM+dVPGM. The process then returns to step 2804 to begin a next program loop without adding any new data states to be verified.

If the output at decision step 2808 is weak fail or weak pass, then at step 2812, the highest data state being verified SN is incrementally increased by one, i.e., SN=SN+1. The process then proceeds to step 2814 to incrementally increase the programming voltage VPGM and then to step 2804 to begin a next program loop.

If the output at decision step 2808 is strong fail, then at step 2810, the highest data state being verified SN is incrementally increased by two, i.e., SN=SN+2. Thus, verify begins for two additional data states in this condition. The process then proceeds to state 2814 to incrementally increase the programming voltage VPGM and then to step 2804 to begin a next program loop.

These steps are followed until verify begins for a last data state, e.g., S7 in the case of TLC or S15 in the case of QLC.

Figure 29:
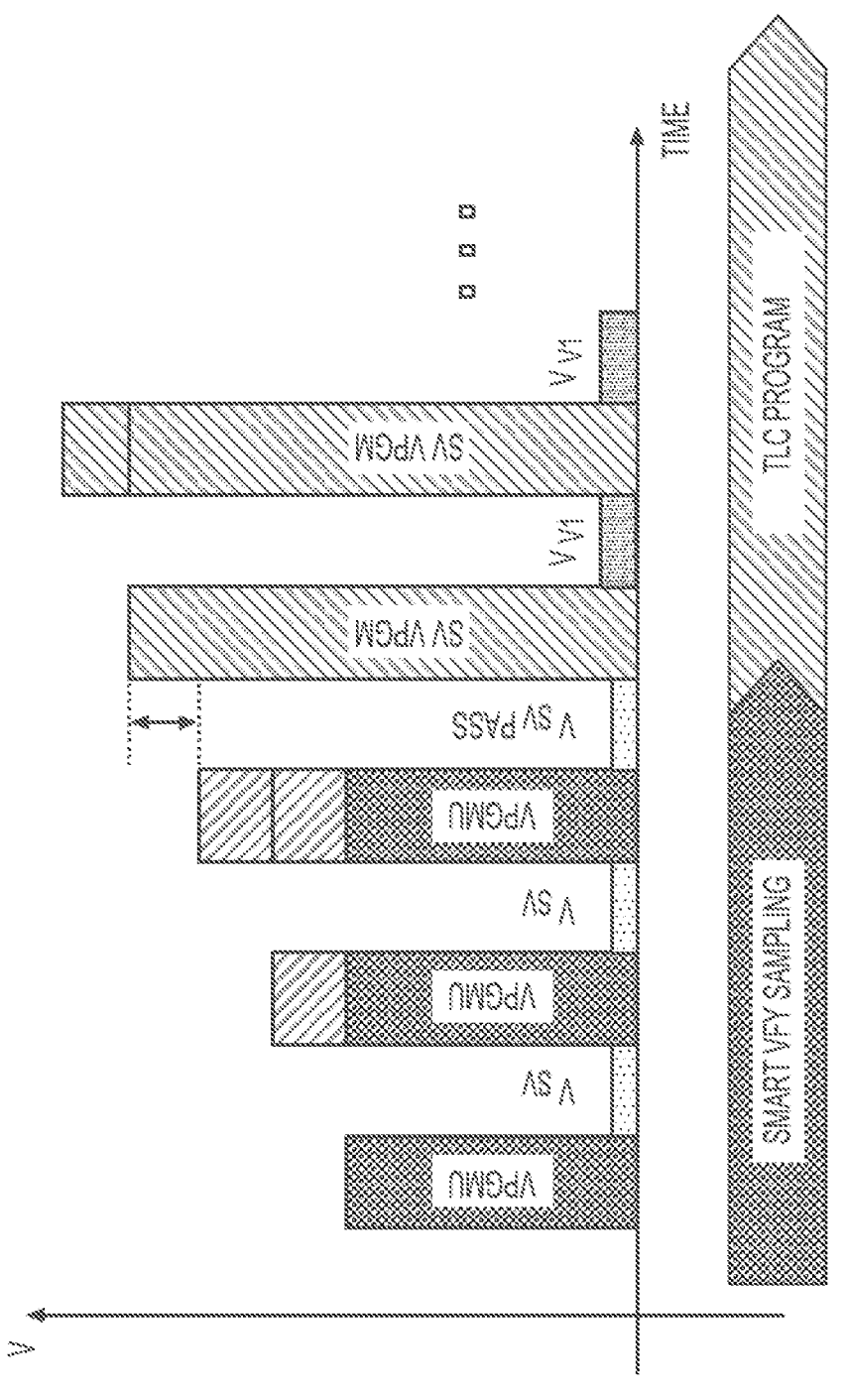
FIG. 29 is a plot depicting the programming pulses and verify pulses during and immediately after an example smart verify operation.

In some programming operations, a smart verify operation is performed during the first couple of programming loops to improve programming performance, i.e., reduce verify time. During the smart verify program loops, only a portion of the selected word line (for example, one string) is selected to acquire a suitable SV_VPGM voltage, which is then used as the initial programming voltage SV_VPGM during the programming of other word lines or strings within the same memory block. Smart verify improves performance by optimizing the initial VPGM voltage during programming of those other word lines rather than setting the initial VPGM voltage at an overly conservative level that would require unnecessary program loops or an overly aggressive level that could lead to over-programming. During smart verify, the programming voltage VPGM starts at a pre-trimmed and conservative initial voltage VPGMU and verify starts with a smart verify voltage Vsv, which is either equal to or lower than a verify voltage for a first programmed data state, e.g., S1. Referring to FIG. 29, during an example triple level cell (TLC) program operation, a smart verify operation is performed on the selected word line WLn until a predetermined threshold of memory cells have threshold voltages Vt that exceed Vsv verify level as determined by a bitscan operation. Upon that predetermined threshold being exceeded, the programming voltage in that program loop is saved to latches as SV_VPGM for later use as an initial programming voltage VPGM for other programming operations on other strings and/or word lines in the memory block. In all following program loops, the verify voltages that are applied during the verify portion are the verify voltages Vv1-Vv7 (or Vv2-Vv7 if the smart verify voltage was Vv1) associated with the programmed data states and verify to Vsv ends. In this example, smart verify fails after three program loops, and in the fourth program loop, the next data state Sn (for example, S1 or S2) is verified using the appropriate verify voltage Vvn. When programming begins for the next string or word line, the programming voltage applied during the first program loop is SV_VPGM. In some cases, two smart verify voltages (smart verify low Vsvl and smart verify high Vsvh) can be implemented to more accurately set SV_VPGM. However, this may add time to the process by requiring two verify pulses (one for Vsvl and one for Vsvh) rather than just one verify pulse. Thus, the improved resolution for SV_VPGM may come with a performance penalty.

Figure 30:
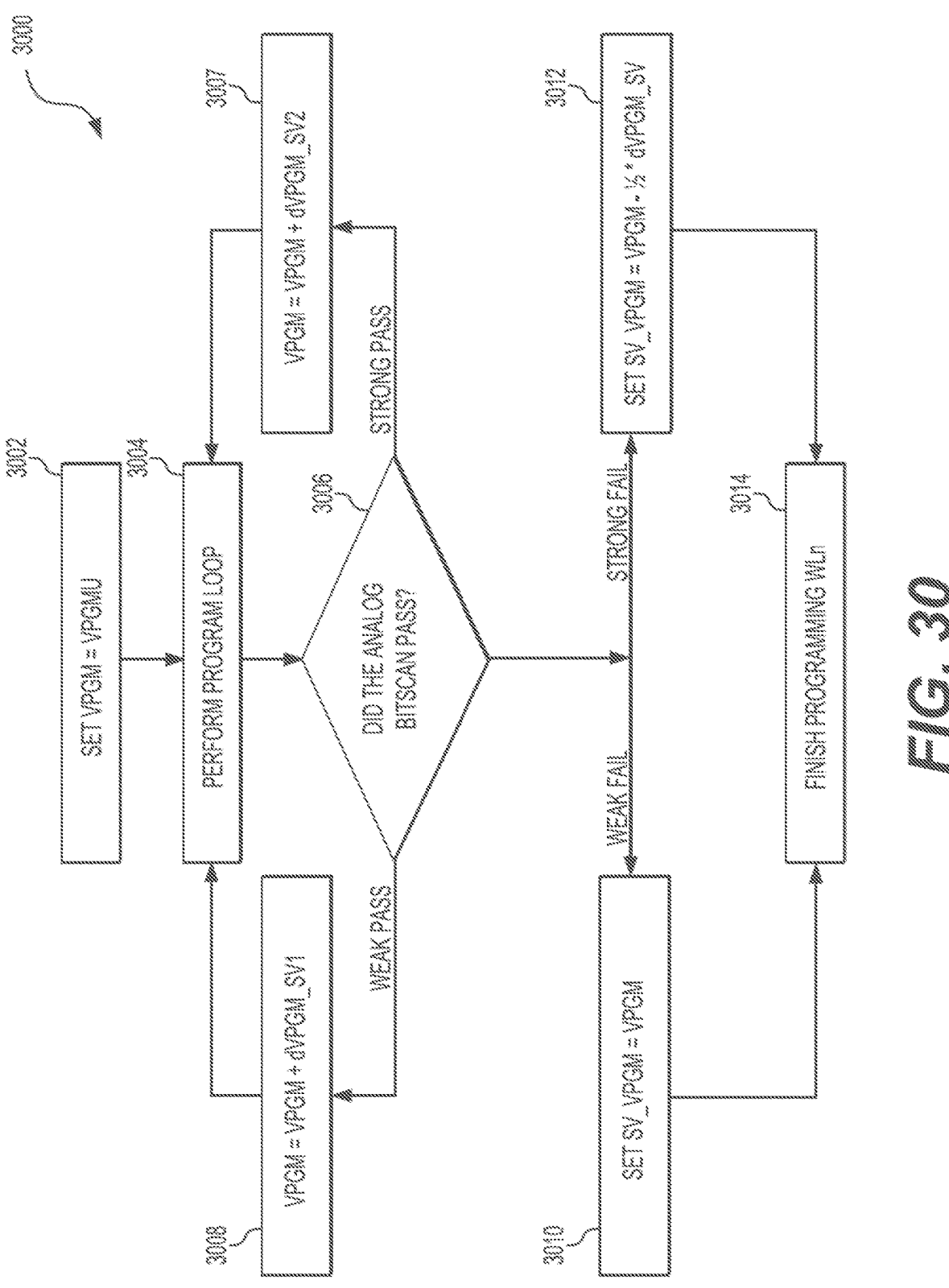
FIG. 30 is a flow chart containing the steps of performing a smart verify operation that includes an analog bitscan operation according to an example embodiment of the present disclosure.

An aspect of the present disclosure is related to a smart verify technique that allows the smart verify programming voltage SV_VPGM to be more accurately set with the use of analog bitscan without the performance penalty that comes with verifying at both smart verify low Vsvl and smart verify high Vsvh. FIG. 30 is a flow chart 3000 that depicts the steps of programming a memory block or sub-block according to one embodiment of these smart verify techniques. These steps could be performed by the controller, a processor or processing device or any other circuitry, executing instructions stored in memory, and/or other circuitry described herein that is specifically configured/programmed to execute the following steps.

At step 3002, the smart verify operation begins with setting the programming voltage VPGM at a predetermined initial voltage VPGMU. At step 3004, a program loop, which includes a programming pulse followed by a verify pulse at a low smart verify voltage Vsvl, is performed on the selected word line. The number of bits that passed verify are then counted and compared to a predetermined threshold in an analog bitscan operation. In some embodiments, a loop counter Loops can be maintained to count the number of program loops to complete the analog bitscan operation. At decision step 3006, it is determined if the analog bitscan operation passed, i.e., was the number of memory cells that passed verify less than the predetermined threshold?

If the answer at decision step 3006 is "yes" (pass), then the output of the analog bitscan operation could either be a strong pass or a weak pass. FIG. 31A depicts an example threshold voltage distribution of a weak pass condition where a small number of bits pass verify but the number is less than the predetermined threshold. If the output of the analog bitscan operation is weak pass, then at step 3008, the programming voltage VPGM is incrementally increased by a first step size dVPGM_SV1 (VPGM=VPGM+dVPGM_SV1) and the process then returns to step 3004 to begin another program loop.

FIG. 31B depicts an example threshold voltage distribution of a strong pass condition where no or very few memory cells pass verify. If the output of the analog bitscan operation is strong pass, then at step 3007, the programming voltage VPGM is incrementally increased by a second step size dVPGM_SV2 (VPGM=VPGM+dVPGM_SV2) that is greater than the first step size dVPGM_SV1. The process then returns to step 3004 to begin another program loop. Thus, the selected word line WLn receives a stronger next VPGM pulse in response to a strong pass than a weak pass.

If the answer at decision step 3006 is "no" (fail), then the output of the analog bitscan operation could either be a weak fail or a strong fail. FIG. 31C depicts the threshold distribution of a weak fail condition where the number of passed bits barely exceeds the predetermined threshold. If the failure of the analog bitscan operation is a weak fail, then at step 3010, the smart verify voltage SV_VPGM is set at the programming voltage VPGM.

FIG. 31D depicts the threshold voltage distribution of a strong fail condition where the number of passed bits greatly exceeds the predetermined threshold. If the output of the analog bitscan operation is strong fail, then at step 3012, the smart verify voltage SV_VPGM is set at a level that is less than VPGM to avoid overprogramming in the other word lines. Specifically, the smart verify voltage SV_VPGM is set at VPGM–(½)*dVPGM. Because the step size dVPGM was dynamically adjusted based on the output of the analog bitscan operation, in some embodiments, SV_VPGM may be increased by the result of dVPGM_SV*(Loops–1). In an example, if an operation results in a strong pass for one program loop and a weak pass for two program loops and then a strong fail, SV_VPGM will be set to VPGMU+ 1*dVPGM_SV2+2*dVPGM_SV1–(½)*dVPGM_SV1.

Following either step 3010 or 3012, at step 3014, programming proceeds in the selected word line WLn until completed. Programming can then continue for the remaining strings of the selected word line WLn and/or additional word lines in the memory block while using SV_VPGM as the programming voltage in the first program loop.

As illustrated in FIGS. 31A-31D, according to these techniques, the smart verify programming voltage SV_VPGM is more accurately established with only a single verify pulse at the low smart verify voltage Vsvl, i.e., only one verify pulse is required in each of the smart verify loops. This improves performance by reducing programming time as compared to using two verify pulses, one at a low smart verify voltage Vsvl and one at a high smart verify voltage Vsvh.

Further, by increasing the programming voltage VPGM by a greater step size dVPGM_SV2 in response to a strong pass output, the smart verify voltage SV_VPGM can be acquired in fewer programming loops. In other words, the magnitude of the step size dVPGM is dynamically set based on the output of the analog bitscan operation. However, in some embodiments, step 3007 can be skipped and any pass (strong or weak) at decision step 3006 can proceed to step 3008.

Figure 32:
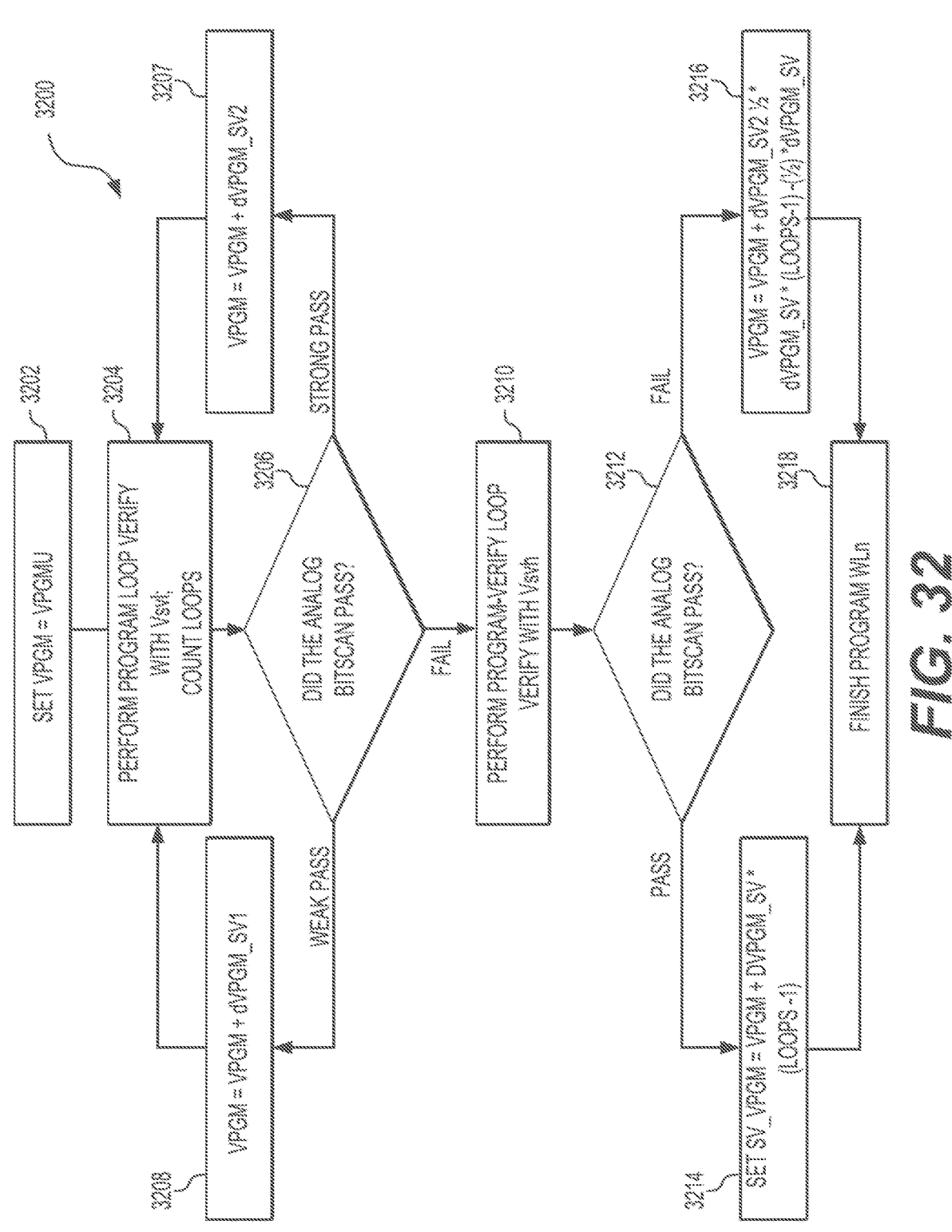
FIG. 32 is a flow chart containing the steps of performing a smart verify operation that includes an analog bitscan operation according to another example embodiment of the present disclosure.

FIG. 32 is a flow chart 3200 that depicts the steps of programming a memory block or sub-block according to another embodiment of these smart verify techniques whereby analog bitscan and two smart verify voltages Vsvl, Vsvh are utilized to greatly improve SV_VPGM accuracy. These steps could be performed by the controller, a processor or processing device or any other circuitry, executing instructions stored in memory, and/or other circuitry described herein that is specifically configured/programmed to execute the following steps.

At step 3202, the smart verify operation begins with setting the programming voltage VPGM at a predetermined initial voltage VPGMU. At step 3204, a program loop, which includes a programming pulse followed by a verify operation at a low smart verify voltage Vsvl, is performed on the selected word line WLn. The number of bits that passed verify are then counted and compared to a predetermined threshold in an analog bitscan operation. Also at step 3204, a loop counter Loops is maintained. At decision step 3206, it is determined if the analog bitscan operation passed, i.e., was the number of passing bits less than the predetermined threshold.

If the answer at decision step 3206 is "yes" (pass), then the output of the analog bitscan operation could either be a strong pass or a weak pass. If the output of the analog bitscan operation is weak pass, then at step 3208, the programming voltage VPGM is incrementally increased by a first step size dVPGM_SV1 (VPGM=VPGM+dVPGM_SV1) and the process then returns to step 3204 to begin another program loop.

If the output of the analog bitscan operation is strong pass, then at step 3207, the programming voltage VPGM is incrementally increased by a second step size dVPGM_SV2 (VPGM=VPGM+dVPGM_SV2) that is greater than the first step size dVPGM_SV1. The process then returns to step 3204 to begin another program loop.

If the answer at decision step 3206 is "no" (fail), then at step 3210, another program-verify loop is performed, but in this loop, the verify voltage is the high smart verify voltage Vsvh.

At decision step 3212, it is determined if the analog bitscan operation passed, i.e., was the number of passing bits less than the predetermined threshold. The output of this bitscan operation could either be a pass or a fail. If the output is pass, then at step 3214, the smart verify voltage SV_VPGM is set at VPGM plus dVPGM_SV times Loops minus 1, i.e., SV_VPGM=VPGM+dVPGM_SV*(Loops– 1). Thus, in contrast to the embodiment of FIG. 30, in the embodiment of FIG. 32, SV_VPGM is based on (Loops–1). If the output is "fail," then at step 3216, the smart verify voltage SV_VPGM is set at the same value but further reduced by one half of the step size, i.e., SV_VPGM=VPGM+dVPGM_SV*(Loops–1)–(½) *dVPGM_SV. This minimizes the risk of over-programming in the other strings and word lines of the memory block.

Following either step 3214 or step 3216, programming of the memory cells of the selected word line WLn can proceed at step 3218. Programming the memory cells of other strings and/or word lines in the same memory block can use SV_VPGM as the programming voltage in the first program loop. In this embodiment, SV_VPGM at is set according to the number of weak pass and strong pass outputs at decision step 3206 and whether the output is pass or fail at decision step 3212.

This embodiment allows for improved accuracy when setting SV_VPGM and improved performance by reducing the number of program loops necessary to complete the analog bitscan for the low smart verify voltage Vsvl as compared to other techniques with two smart verify voltages.

Figure 33:
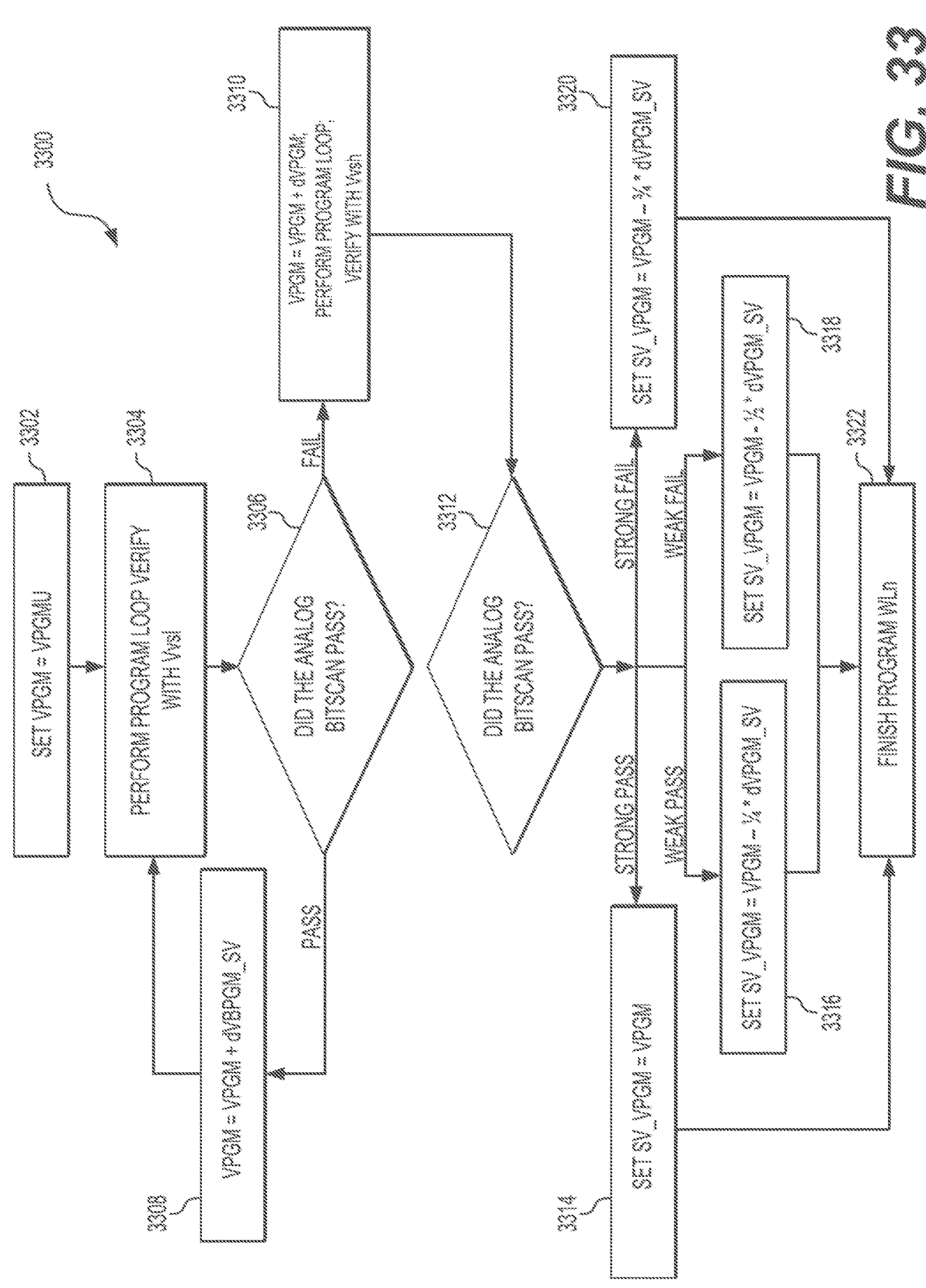
FIG. 33 is a flow chart containing the steps of performing a smart verify operation that includes an analog bitscan operation according to yet another example embodiment of the present disclosure.

According to another embodiment depicted in the flow chart 3300 of FIG. 33, the smart verify operation includes verifying to the low smart verify voltage Vsvl through a binary bitscan (the only output options are pass and fail) and then the analog bitscan operation can be applied to verify at the high smart verify voltage Vsvh. These steps could be performed by the controller, a processor or processing device or any other circuitry, executing instructions stored in memory, and/or other circuitry described herein that is specifically configured/programmed to execute the following steps.

At step 3302, the programming voltage VPGM is set at a predetermined initial programming voltage VPGMU. At step 3304, a program loop is performed on the selected word line WLn. During the verify portion of the program loop, the verify voltage is a low smart verify voltage Vsvl. At decision step 3306, it is determined if the binary bitscan operation passed, i.e., is the number of memory cells that passed verify less than the predetermined threshold?

If the output at decision step 3306 is "pass," then at step 3308, the programming voltage VPGM is incrementally increased, i.e., VPGM=VPGM+dVPGM_SV. The process then returns to step 3304 to begin a next program loop. If the output at decision step 3306 is "fail," then at step 3310, another program-verify operation is performed, but this time verify at Vsvl is skipped and the verify voltage is the high smart verify voltage Vsvh.

At decision step 3312, it is determined if the analog bitscan operation passed. Four outputs are possible: strong pass, weak pass, weak fail, and strong fail. The output determines what voltage smart verify programming voltage SV_VPGM is set at. If the output at decision step 3312 is strong pass, then at step 3314, the smart verify programming voltage SV_VPGM is set at the programming voltage VPGM. If the output at decision step 3314 is weak pass, then at step 3316, the smart verify voltage SV_VPGM is set at VPGM reduced by one quarter of the step size dVPGM_SV, i.e., SV_VPGM=VPGM−(¼)*dVPGM_SV. If the answer at decision step 3312 is weak fail, then at step 3318, the smart verify voltage SV_VPGM is set at VPGM reduced by one half of the step size dVPGM_SV, i.e., SV_VPGM=VPGM−(½)*dVPGM_SV. If the answer at decision step 3312 is strong fail, then at step 3320, the smart verify voltage SV_VPGM is set at VPGM reduced by three quarters of the step size dVPGM_SV, i.e., SV_VPGM=VPGM−(¾)*dVPGM_SV. In other embodiments, the specific voltage options could vary from those of the exemplary embodiment with the magnitude reducing as the number of memory cells passing verify increases.

Following step 3314, step 3316, step 3318, or step 3320, programming of the memory cells of the selected word line WLn can proceed at step 3322. Programming the memory cells of other strings and/or word lines in the same memory block can use SV_VPGM as the programming voltage in the first program loop.

Figure 34:
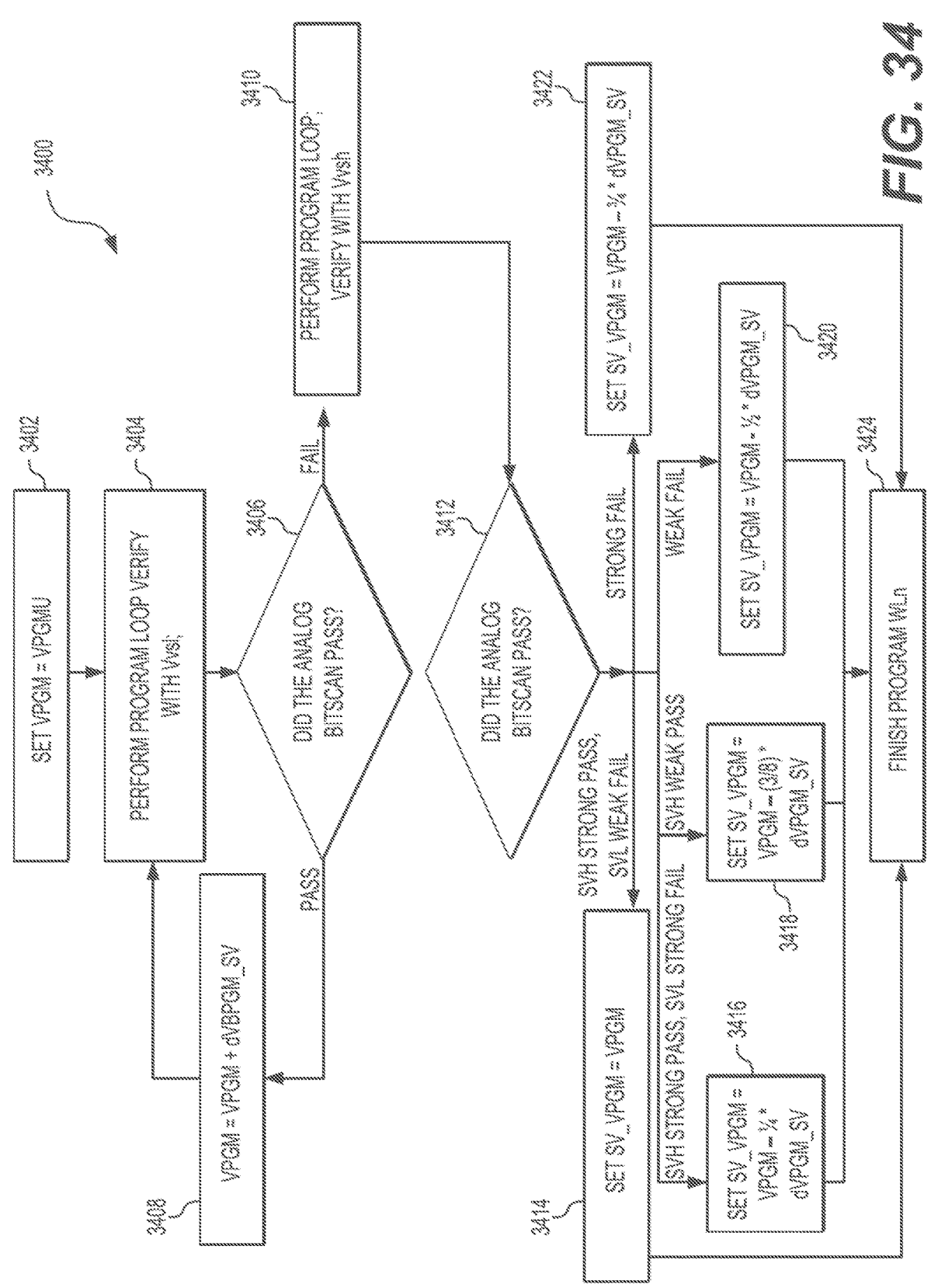
FIG. 34 is a flow chart containing the steps of performing a smart verify operation that includes an analog bitscan operation according to still another example embodiment of the present disclosure.

According to another embodiment depicted in the flow chart 3400 of FIG. 34, the resolution of the smart verify programming voltage SV_VPGM is further improved by conducting analog bitscan operations for both the low smart verify voltage Vsvl and the high smart verify voltage Vsvh. These steps could be performed by the controller, a processor or processing device or any other circuitry, executing instructions stored in memory, and/or other circuitry described herein that is specifically configured/programmed to execute the following steps.

In the embodiment of FIG. 34, steps 3402 through 3410 are the same as steps 3302 through 3310 respectively, except the analog bitscan operation for the smart verify low voltage Vvsl is now an analog bitscan operation rather than a binary bitscan operation.

Figures 35A, 35B, 35C:
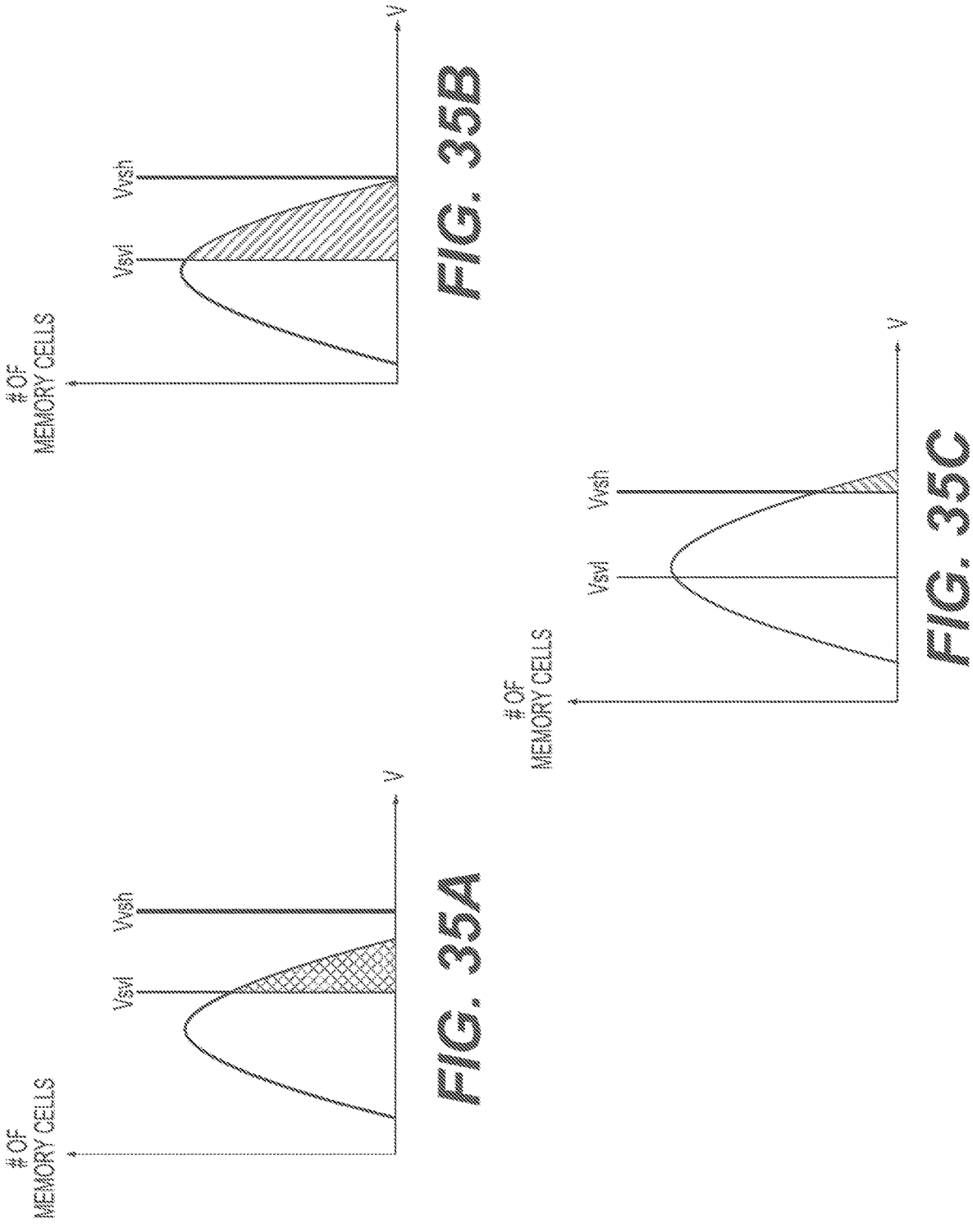
FIG. 35A is a threshold voltage distribution plot of a plurality of memory cells in a condition that would produce a weak fail for a verify low Vvsl analog bitscan operation and a strong pass for a verify high Vvsh analog bitscan operation.
FIG. 35B is a threshold voltage distribution plot of a plurality of memory cells in a condition that would produce a strong fail for a verify low Vvsl analog bitscan operation and a strong pass for a verify high Vvsh analog bitscan operation.
FIG. 35C is a threshold voltage distribution plot of a plurality of memory cells in a condition that would produce a weak pass for a verify high Vvsh analog bitscan operation.

At decision step 3412, the analog bitscan operation has five possible outputs, thereby allowing for improved resolution of the smart verify voltage SV_VPGM. If the Vsvh analog bitscan operation of step 3412 produces a strong pass output and the output of the Vsvl bitscan operation at step 3406 was weak fail, then at step 3414, the smart verify programming voltage SV_VPGM is set to VPGM. FIG. 35A depicts a threshold voltage Vt distribution for an example condition with a strong pass output for Vsvh and a weak fail output for Vsvl.

If the Vsvh analog bitscan operation of step 3412 produces a strong pass output and the output of the Vsvl bitscan operation at step 3406 was strong fail, then at step 3416, the smart verify programming voltage SV_VPGM is set to VPGM reduced by one quarter of the step size dVPGM_SV, i.e., SV_VPGM=VPGM−¼*dVPGM_SV. FIG. 35B depicts an example threshold voltage Vt distribution that could produce this outcome.

If the Vsvh analog bitscan operation of step 3412 produces a weak pass output, then at step 3418, the smart verify programming voltage SV_VPGM is set to VPGM reduced by three-eighths of the step size dVPGM_SV, i.e., SV_VPGM=VPGM−(⅜)*dVPGM_SV. FIG. 35C depicts an example threshold voltage Vt distribution that could produce this outcome.

Figure 35D:
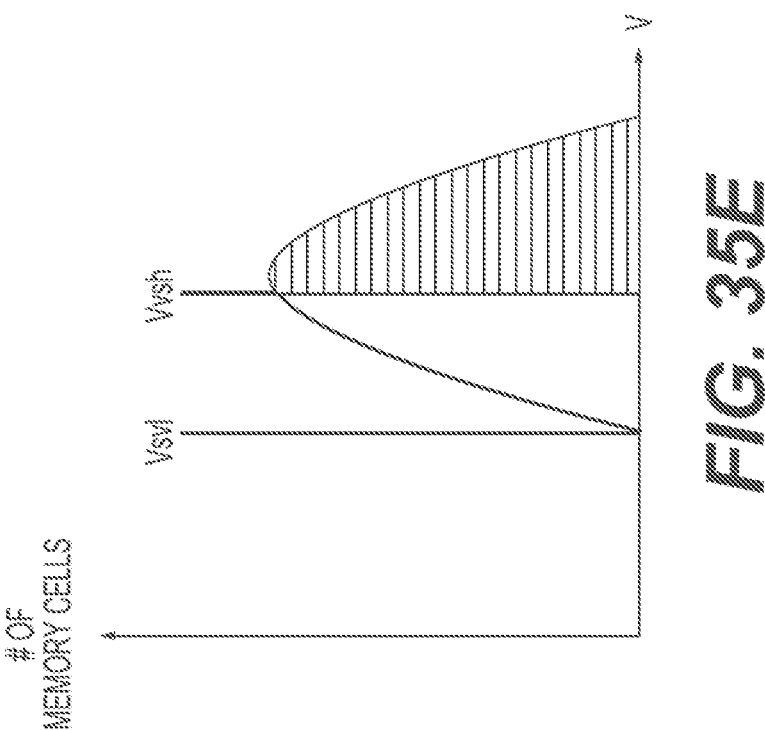
FIG. 35D is a threshold voltage distribution plot of a plurality of memory cells in a condition that would produce a weak fail for a verify high Vvsh analog bitscan operation.

If the analog bitscan operation of step 3412 produces a weak fail output, then at step 3420, the smart verify programming voltage SV_VPGM is set to VPGM reduced by one half of the step size dVPGM_SV, i.e., SV_VPGM=VPGM−½*dVPGM_SV. FIG. 35D depicts an example threshold voltage Vt distribution that could produce this outcome.

Figure 35E:
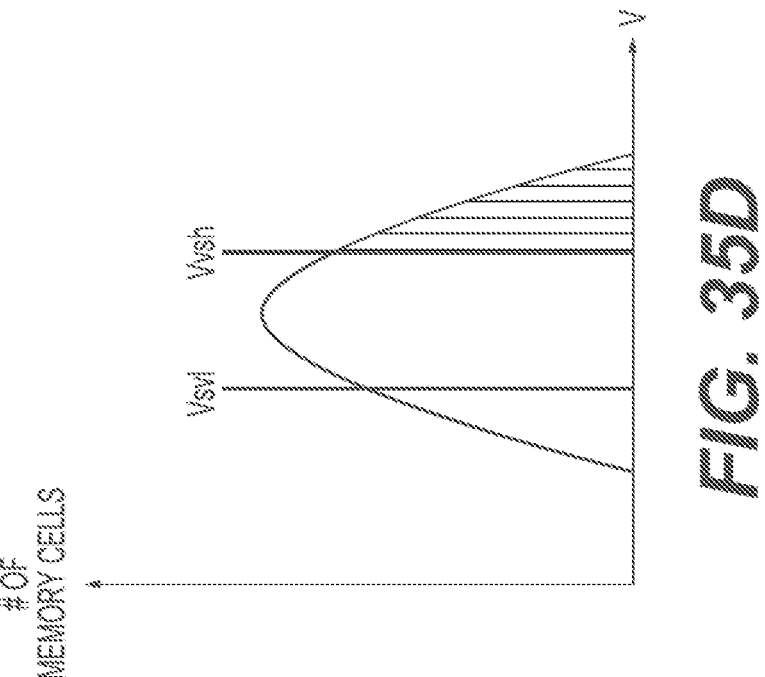
FIG. 35E is a threshold voltage distribution plot of a plurality of memory cells in a condition that would produce a string fail for a verify high Vvsh analog bitscan operation.

If the analog bitscan operation of step 3412 produces a strong fail output, then at step 3422, the smart verify programming voltage SV_VPGM is set to VPGM reduced by three quarters of the step size dVPGM_SV, i.e., SV_VPGM=VPGM−¾*dVPGM_SV. FIG. 35E depicts an example threshold voltage Vt distribution that could produce this outcome.

In some embodiments, certain aspects of the embodiments of FIGS. 30, 32, 33, and 34 can be combined into one process. For example, the dynamic step size dVPGM found in the embodiments of FIGS. 30 and 32 can be incorporated into either the FIG. 33 embodiment or the FIG. 34 embodiment.

Figure 48:
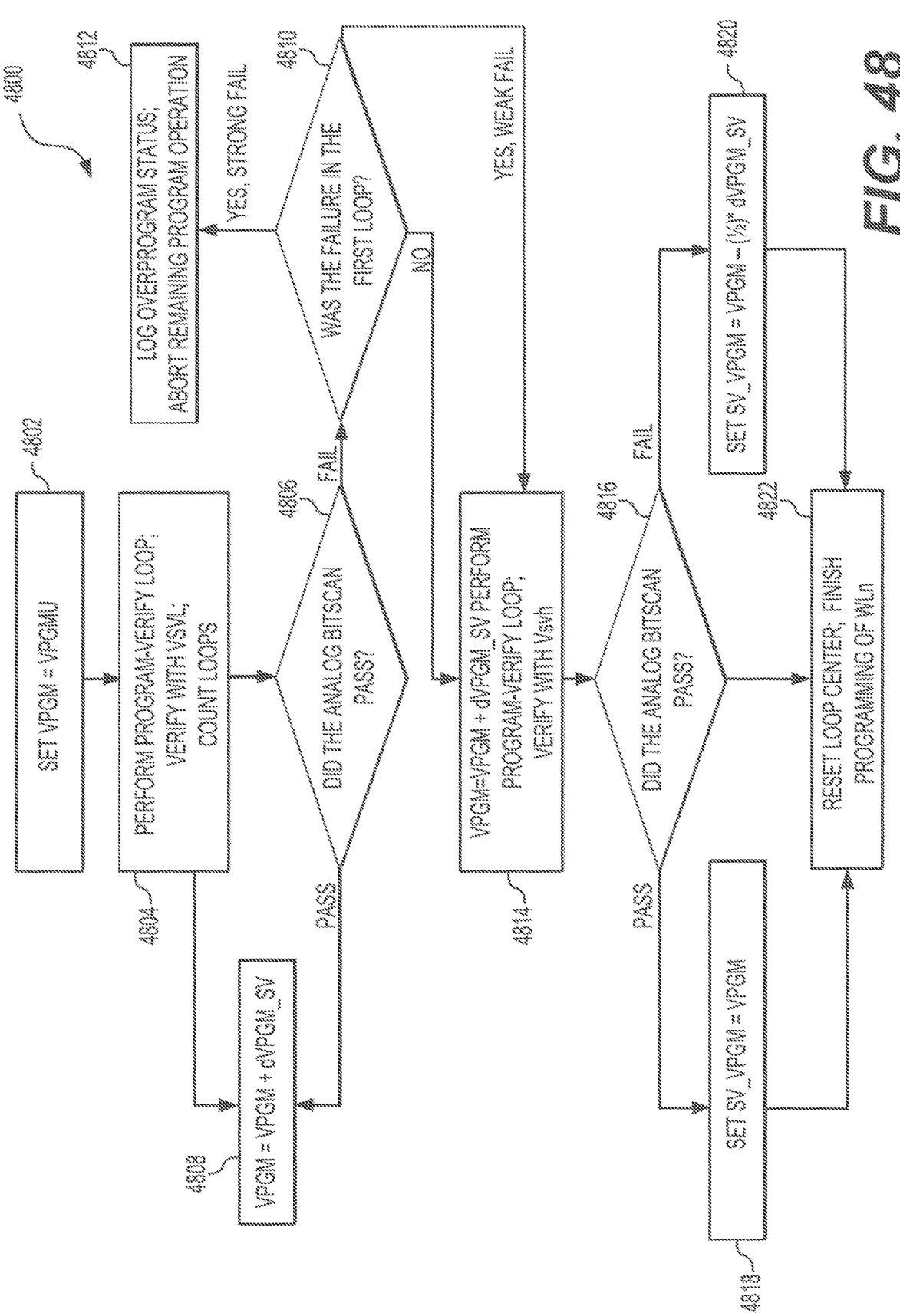
FIG. 48 is a flow chart containing the steps of performing a smart verify operation that includes an analog bitscan operation according to a further example embodiment of the present disclosure.

FIG. 48 is a flow chart 4800 that depicts the steps of programming a memory block or sub-block according to another embodiment of these smart verify techniques whereby analog bitscan and two smart verify voltages Vsvl, Vsvh are utilized to prevent overprogramming during the smart verify operation. These steps could be performed by the controller, a processor or processing device or any other circuitry, executing instructions stored in memory, and/or other circuitry described herein that is specifically configured/programmed to execute the following steps.

At step 4802, the program operation begins with the step of setting the programming voltage VPGM at an initial level VPGMU to begin the smart verify operation. At step 4804, a program loop including both a VPGM pulse and a verify operation is performed on the selected word line WLn and the number of memory cells that pass the verify operation are counted and compared to a predetermined threshold in an analog bitscan operation. At this step, the verify operation is performed using the smart verify low voltage Vvsl. Also at step 4804, the number of program loops are counted.

At decision step 4806, it is determined if the analog bitscan operation passed (was the number of passing memory cells less than the predetermined threshold?). If the output at decision step 4806 is pass, then at step 4808, the programming voltage VPGM is incrementally increased by a step size dVPGM_SV, i.e., VPGM=VPGM+dVPGM_SV, and then the process returns to step 4804 to being a next program loop.

If the output at decision step 4806 is "fail," then at decision step 4810, it is determined if the failure of the analog bitscan operation occurred during the first program loop. If the answer at decision step 4810 is "yes," and the output of the analog bitscan operation was strong fail, then the selected word line WLn is at risk of overprogramming some of the memory cells that were intended for the first programmed data state, e.g., S1. At step 4812, the memory device logs the programming operation as being at risk of overprogramming. The remaining programming operation for the selected word line WLn is aborted, and programming proceeds to a next word line to be programmed.

If the answer at decision step 4810 is "no," or is "yes" and the output of the analog bitscan operation was weak fail, then the selected word line is at a relatively lower risk of overprogramming and the process proceeds to step 4814. At step 4814, a verify operation is performed using the smart verify high voltage Vvsh.

At decision step 4816, it is determined if the bitscan operation for the verify operation at the smart verify high voltage Vvsh passed (was the number of passing memory cells less than the predetermined threshold). If the output at decision step 4816 was pass (the number of passing memory cells was less than the predetermined threshold), then at step 4818, the smart verify programming voltage SV_VPGM is set at VPGM. If the output at decision step 4816 is fail, then the smart verify programming voltage SV_VPGM is set at VPGM reduced by one half of the step size dVPGM_SV, i.e., SV_VPGM=VGPM−(½)*dVPGM_SV.

Following either step 4818 or step 4820, at step 4822, the loop counter can be reset and then programming can continue to program the memory cells of the selected word line WLn to their respective intended data states. The smart verify programming voltage SV_VPGM can then be used as the initial programming voltage when programming other strings of the selected word line WLn and/or when programming other word lines in the selected memory block.

This embodiment allows overprogramming to be detected during programming so that the data that was intended for the selected word line WLn can be correctly programmed to a different word line rather than incorrectly programmed to the selected word line WLn.

Figure 49:
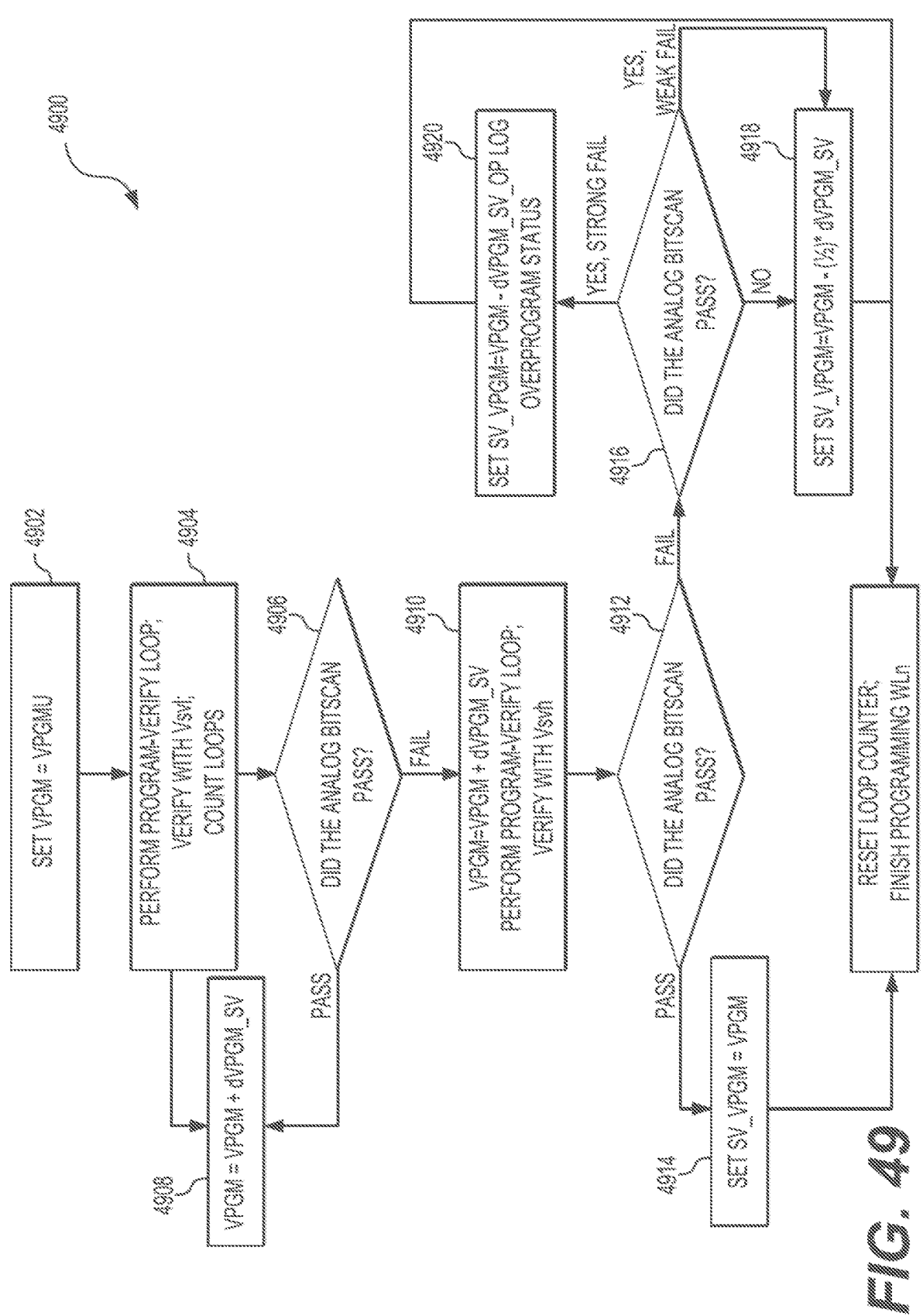
FIG. 49 is a flow chart containing the steps of performing a smart verify operation that includes an analog bitscan operation according to yet a further example embodiment of the present disclosure.

FIG. 49 is a flow chart 4900 that the steps of programming a memory block or sub-block according to yet another embodiment of these smart verify techniques whereby analog bitscan and two smart verify voltages Vsvl, Vsvh are utilized to prevent overprogramming during the smart verify operation. These steps could be performed by the controller, a processor or processing device or any other circuitry, executing instructions stored in memory, and/or other circuitry described herein that is specifically configured/programmed to execute the following steps.

Steps 4902-4906 are similar to steps 4802-4808 of the above-described embodiment. However, if the output at decision step 4906 is fail, then the process proceeds to step 4910. At step 4910, verify operation is conducted using the smart verify high voltage Vsvh, and the number of memory cells that pass verify are counted in an analog bitscan operation. Also at step 4910, the program loops are counted.

At decision step 4912, it is determined if the analog bitscan operation passed, i.e., was the number of memory cells that passed verify less than a predetermined threshold? If the output at decision step 4912 is a pass (either a strong pass or a weak pass), then at step 4814, the smart verify voltage programming voltage SV_VPGM is set to VPGM.

If the output at decision step 4912 is fail (either strong fail or weak fail), then at decision step 4916, it is determined if the failure at decision step 4906 occurred in the first loop. If the answer at decision step 4916 is "no" or is "yes" and also the output of the analog bitscan operation at decision step 4912 was weak fail, then the risk of overprogramming is low and the process proceeds to step 4918. At step 4918, the smart verify programming voltage SV_VPGM is set to VPGM−(½)*dVPGM_SV.

If the output at decision step 4916 is "yes" and also the output of the analog bitscan operation at decision step 4912 was strong fail, then the risk of overprogramming is high. At step 4920, the smart verify programming voltage SV_VPGM is set to VPGM−dVPGM_SV_OP. dVPGM_SV_OP may be different than the step size dVPGM_SV. Also at step 4920, the overprogramming status may be logged so that the memory device can take extra precautions prior to check for overprogramming prior to completing the programming operation.

Following step 4914, 4918, or 4920, at step 4922, the loop counter is reset and the programming operation continues to program all of the memory cells of the selected word line WLn to their respective intended data states.

As discussed above, in many program-verify operations, verify of each data state begins based on either a fixed programming loop count or on a smart PCV determination where fast to program bits of one data state SN are detected to determine when to start verify of the next data state or two data states, e.g., SN+1 and SN+2. Similarly, verify of each data state may end when the number of slow bits is within a bitscan criteria. The ending of each data state is detected one at a time. In other words, once verify is completed for data state SN, then detection for data state SN+1 can begin and so on. FIG. 36 includes a table for an example TLC programming operation and identifies which data states (S1-S7) are verified in which program loops (Loops 1-12). In this table, a "0" indicates that verify is not conducted for a given combination of program loop and data state, and a "1" indicates that that verify is conducted for a given combination of program loop and data state. In this example, a total of twenty-two (22) verify pulses are applied to complete programming.

According to another aspect of the present disclosure, an analog bitscan operation is utilized to allow for earlier termination of verify for each data state while still controlling slow bits to ensure that they receive sufficient programming so that their threshold voltages Vt are above the respective verify voltages Vv. In other words, an early program-verify termination parameter is established based on the output of an analog bitscan operation. By reducing the number of verify pulses that are performed, programming performance is improved with little or no loss in reliability.

Figure 39:
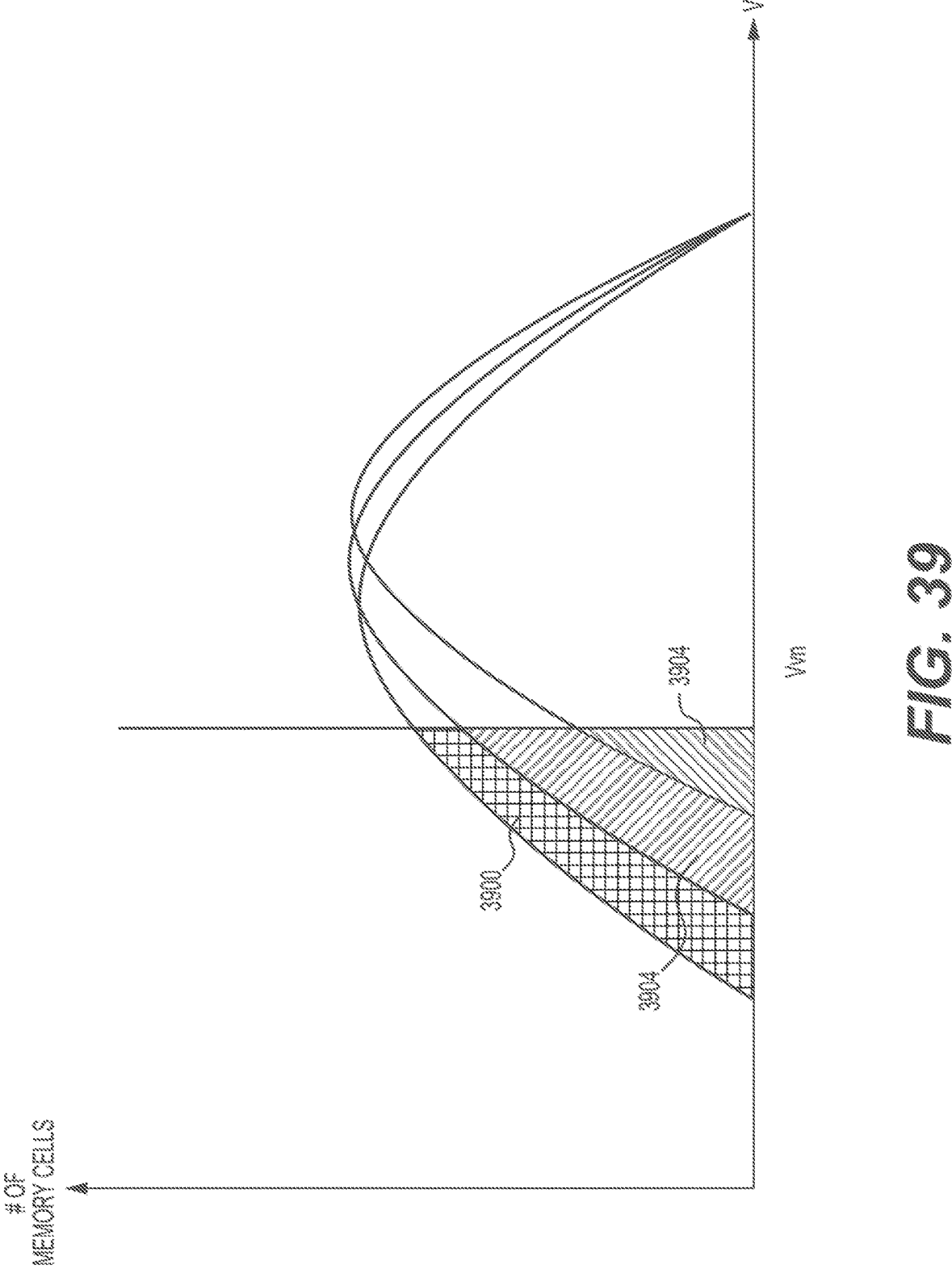
FIG. 39 is a threshold voltage distribution plot with a plurality of curves identifying strong fail, weak fail, and pass conditions for an example analog bitscan operation.

The analog bitscan operation is performed after each verify pulse for one of the data states being verified in that loop. Depending on the results of the analog bitscan operation, programming to that particular data state may continue unchanged, the programming to that data state may be ceased, or programming to that data state can continue for one or more program loops but without verify. For example, the table of FIG. 37 illustrates four options for a given data state SN based on the output of the analog bitscan operation. In this example, if the output of the analog bitscan operation for data state SN is strong fail (the failed bits greatly exceed the BSPF threshold), then programming proceeds unchanged in the following program loop, i.e., verify of data state SN and any other data states being verified is conducted. In FIG. 39, the curve 3900 illustrates the threshold voltage Vt distribution of a plurality of memory cells in a strong fail condition. If the output of the analog bitscan operation for data state SN is weak fail (the failed bits barely exceed the BSPF threshold), then verify of data state SN ceases. In the following two program loops, the uninhibited memory cells being programmed to data state SN are programmed, but there is no verify pulse of data state SN after those programming pulses. These program loops with a programming pulse and no verify are hereinafter referred to as "blind pulses." In FIG. 39, curve 3902 illustrates the threshold voltage Vt distribution of a plurality of memory cells in a weak fail condition. If the output of the analog bitscan operation for data state SN is weak pass or strong pass, (the failed bits are less than the BSPF threshold), then verify of data state SN ceases. In the following one program loop, the uninhibited memory cells being programmed to data state SN are programmed with a blind pulse. In FIG. 39, curve 3904 illustrates a threshold voltage Vt distribution of a plurality of memory cells in a pass condition. As illustrated in the table of FIG. 38, by utilizing the analog bitscan operation, in this example one verify pulse is eliminated for each of the seven (7) data states and a total of fifteen (15) verify pulses are conducted. Performance is thus significantly improved as compared to the twenty-two (22) verify pulses in the example of FIG. 36.

In some embodiments, the BSPF threshold can be adjusted to allow for additional resolution (more possible outputs) either for a pass condition or a fail condition. For example, if the BSPF threshold is decreased to BSPF_Low, which is less than a baseline BSPF threshold, then three possible fail options are available (weak fail, medium fail, and strong fail) in addition to a single pass option. For example, FIG. 40 depicts a table of possible outputs for an analog bitscan operation where the BSPF threshold is set at a BSPF_Low level and the associated action that is taken of each output option. In this example, in response to a strong fail output, then programming continues unchanged in the following program loop. In response to a medium fail output, then programming proceeds with three blind pulses in the following three program loops to further program the slow bits but by a lesser amount than a strong fail output. In response to a weak fail output, then programming proceeds with two blind pulses in the following two program loops to further program the slow bits but by a lesser amount than a medium fail output. In response to a pass output, then programming proceeds with one blind pulse in the following program loop to further program the slow bits but by a lesser amount than a weak fail output. In some embodiments, additional output options are possible. The lower BSPF threshold of this embodiment also allows for improved performance by reducing bitscan operation time.

In the embodiment of FIG. 41, the BSPF threshold is set to BSPF_High, which is greater than the baseline BSPF threshold. In this embodiment, three possible pass options are available (weak pass, medium pass, and strong pass) in addition to a single fail option. In this example, in response to a fail output, then programming continued unchanged in the following program loop. In response to a weak pass output, then programming proceeds with three blind pulses in the following three program loops to further program the slow bits. In response to a medium pass output, then programming proceeds with two blind pulses in the following two program loops to further program the slow bits but by a lesser amount than a weak pass output. In response to a strong pass output, then programming proceeds with one blind pulse in the following program loop to further program the slow bits but by a lesser amount than a medium pass output. In some embodiments, additional output options are possible.

Figure 42:
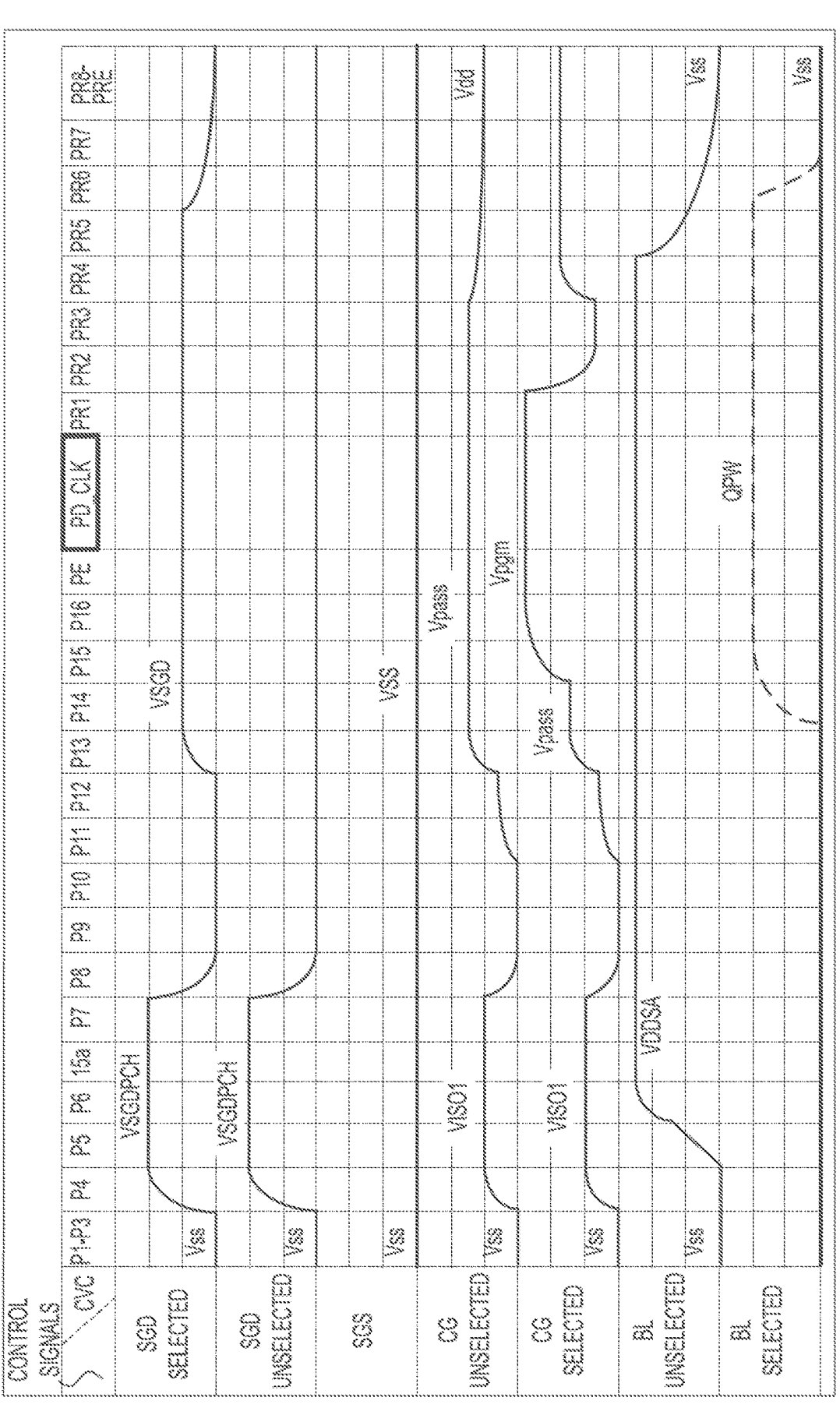
FIG. 42 is a plot of various voltages applied to different components in a memory block before and during a program pulse according to an example embodiment of the present disclosure.

The blind pulses of the above example embodiments can lead to "Vt widening," or a condition where the threshold voltage Vt distributions for one or more of the data states are widened. The threshold voltage Vt distributions can be tightened by verifying at two levels: verify low VL and verify high VH. If the threshold voltage Vt of a memory cell is sensed as being between VL and VH, then programming of that memory cell is nearly completed. Accordingly, on an ensuing programming pulse, a quick pass write (QPW) voltage is applied to a bit line coupled to that memory cell to slow programming of that memory cell so that it can be more accurately programmed to a threshold voltage Vt that is barely above the verify high VH voltage while allowing other memory cells in the selected word line WLn to be programmed at high speed. FIG. 42 depicts the voltages applied to various components of a memory block during a programming pulse where some of the memory cells have threshold voltages Vt between VL and VH and receive the QPW bias voltage applied to their respective bit lines. The bit lines coupled with memory cells that have threshold voltages Vt below VL receive a low VSS voltage.

According to an additional aspect of the present disclosure, an analog bitscan operation is performed following verify at the verify low VL voltage and/or at the verify high VH voltage. The results of the analog bitscan operation or operations dictates whether programming proceeds at full speed (no QPW bias voltage) or at a reduced speed (with a QPW bias voltage) in the ensuing programming loops and also how many blind pulses are to follow.

In the embodiment depicted in the table of FIG. 43, if the threshold voltage Vt of a memory cell is between verify low VL and verify high VH, then the result of the analog bitscan operation determines how many blind programming pulses with the QPW bias are to follow. For example, "Option 1" could be for a memory cell with a threshold voltage Vt that is much closer to the verify low VL voltage than the verify high VH voltage and requires four programming pulses at the reduced speed to complete programming. "Option 4" could be for a memory cell with a threshold voltage Vt that is much closer to the verify high VH voltage than the verify low VL voltage and requires only a single programming pulse at the reduced speed to complete programming. Options 2 and 3 can be between Options 1 and 4.

Similarly, if the threshold voltage Vt of a memory cell is below verify low VL, then the memory cell receives four blind programming pulses with appropriate programming speeds. For example "Option 1" with four fast (VSS) blind programming pulses could be for a memory cell that has a threshold voltage Vt that is significantly below the verify low VL voltage, and "Option 2" with one fast (VSS) and three slow (QPW) blind pulses could be for a memory cell that has a threshold voltage Vt that is very close to the verify low VL voltage.

Options 1-4 in the table of FIG. 43 may correspond to four possible options of the above-discussed analog bitscan operations. For example, Option 1 could correspond with a strong fail output, Option 2 could correspond with a weak fail output, Option 3 could correspond with a weak pass output, and Option 4 could correspond with a strong pass output. In some embodiments, there can be more or fewer than four options to go along with more or fewer outputs of the analog bitscan operation.

According to some additional embodiments, the output of the analog bitscan operation can be used to trigger an end of verify at the verify low VL voltage. If the output of the analog bitscan operation for verify high VH is medium fail or weak fail, then a performance gain can be achieved by terminating verify at the verify low VL voltage, i.e., skipping verify low VL in subsequent program loops. If the output is medium fail, then verify at the verify low voltage VL only ends for the memory cells with threshold voltages Vt between the verify low and verify high voltages VL, VH. For memory cells with threshold voltages below the verify low voltage VL, then during later VPGM pulses, the low VSS voltage is applied to the bit lines coupled to those respective memory cells. The slow memory cells with threshold voltages Vt below the verify low voltage VL will still be programmed in one or more following program loops. A weak fail output can either produce the same output as a medium fail output or verify can cease for both the verify low and verify high voltages VL, VH.

Another aspect of the present disclosure is related to an SLC programming technique where an analog bitscan operation is implemented in order to improve performance. SLC programming is generally similar to TLC or QLC programming as described above in that programming occurs in one or more program loops, which typically include a VPGM pulse and a verify operation. In terms of timing, the analog bitscan operation can take place as a standalone operation; it can be partially or fully hidden at the end of the verify operation during discharge; or it can be partially or fully hidden at the beginning of a subsequent VPGM pulse setup.

Figure 44:
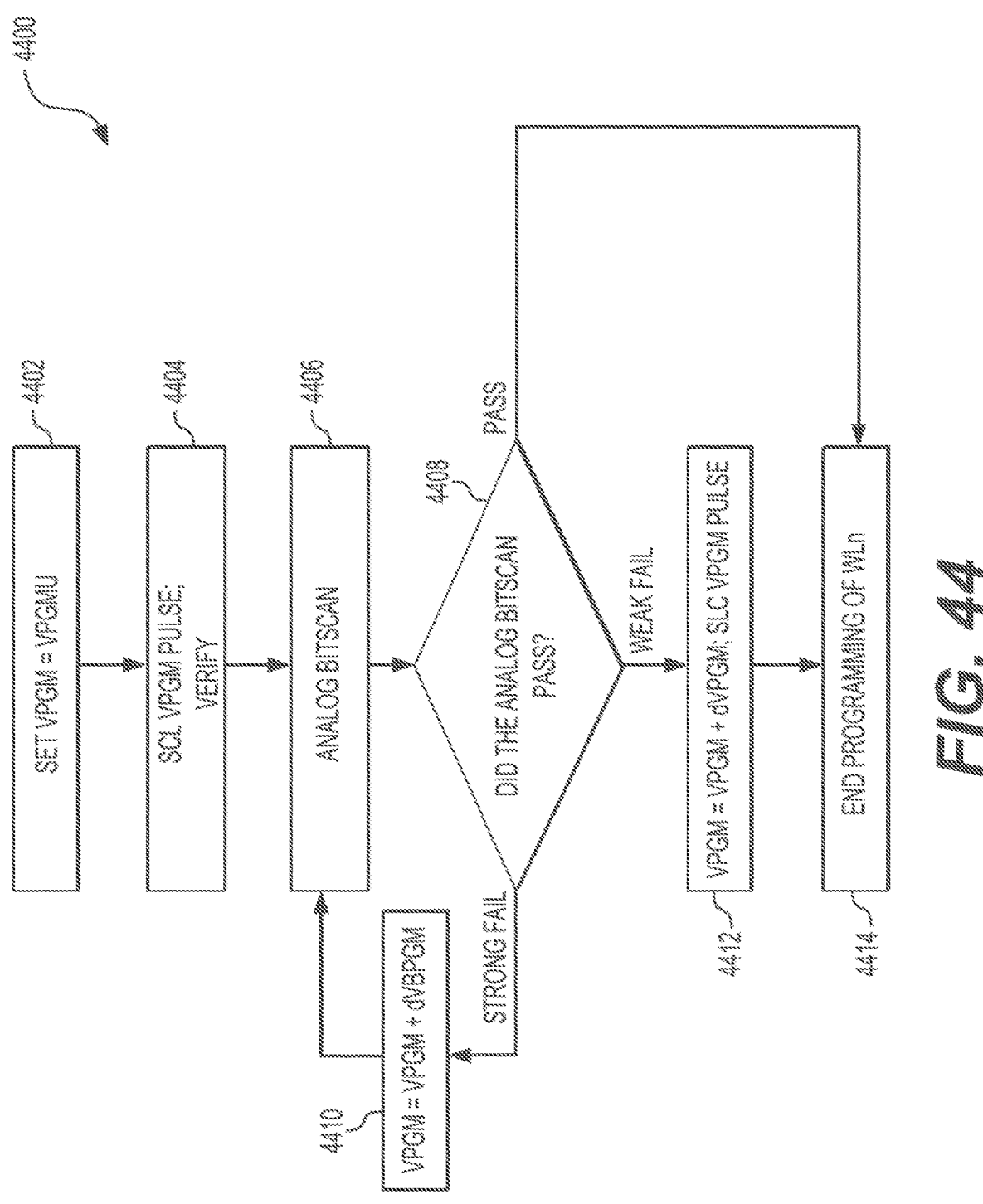
FIG. 44 is a flow chart containing the steps of performing an SLC programming operation that includes an analog bitscan operation according to an example embodiment of the present disclosure.

FIG. 44 includes a flow chart 4400 that illustrates the steps of programming the memory cells of a selected word line WLn to SLC according to an example embodiment of the present disclosure. These steps could be performed by the controller, a processor or processing device or any other circuitry, executing instructions stored in memory, and/or other circuitry described herein that is specifically configured/programmed to execute the following steps.

At step 4402, the programming voltage VPGM is set at an initial voltage VPGMU. At step 4404, a VPGM pulse is applied to the selected word line WLn to program the non-inhibited memory cells of the selected word line WLn. After the VPGM pulse, a verify operation is performed to compare each memory cell being programmed to the verify voltage (there is only one verify voltage in SLC programming). At step 4406, an analog bitscan operation is performed to compare the number of failed bits (memory cells that failed verify) to a BSPF threshold.

At decision step 4408, it is determined if the analog bitscan operation passed. If the output at decision step 4408 is strong fail (the number of failed bits is significantly greater than the BSPF threshold), then at step 4410, the programming voltage VPGM is incrementally increased by a step size dVPGM, i.e., VPGM=VPGM+dVPGM. The process then returns to step 4404 to begin another program loop.

If the answer at decision step 4408 is weak fail (the number of failed bits is slightly greater than the BSPF threshold), then programming is nearly completed. At step 4412, the programming voltage VPGM is incrementally increased (VPGM=VPGM+dVPGM) and a single VPGM pulse is applied to the selected word line WLn to further program the non-inhibited memory cells without a following verify pulse.

Following step 4412 or a pass output at decision step 4408, the programming operation is completed at step 4414. Programming may now move to a next word line in the memory block.

Figure 45:
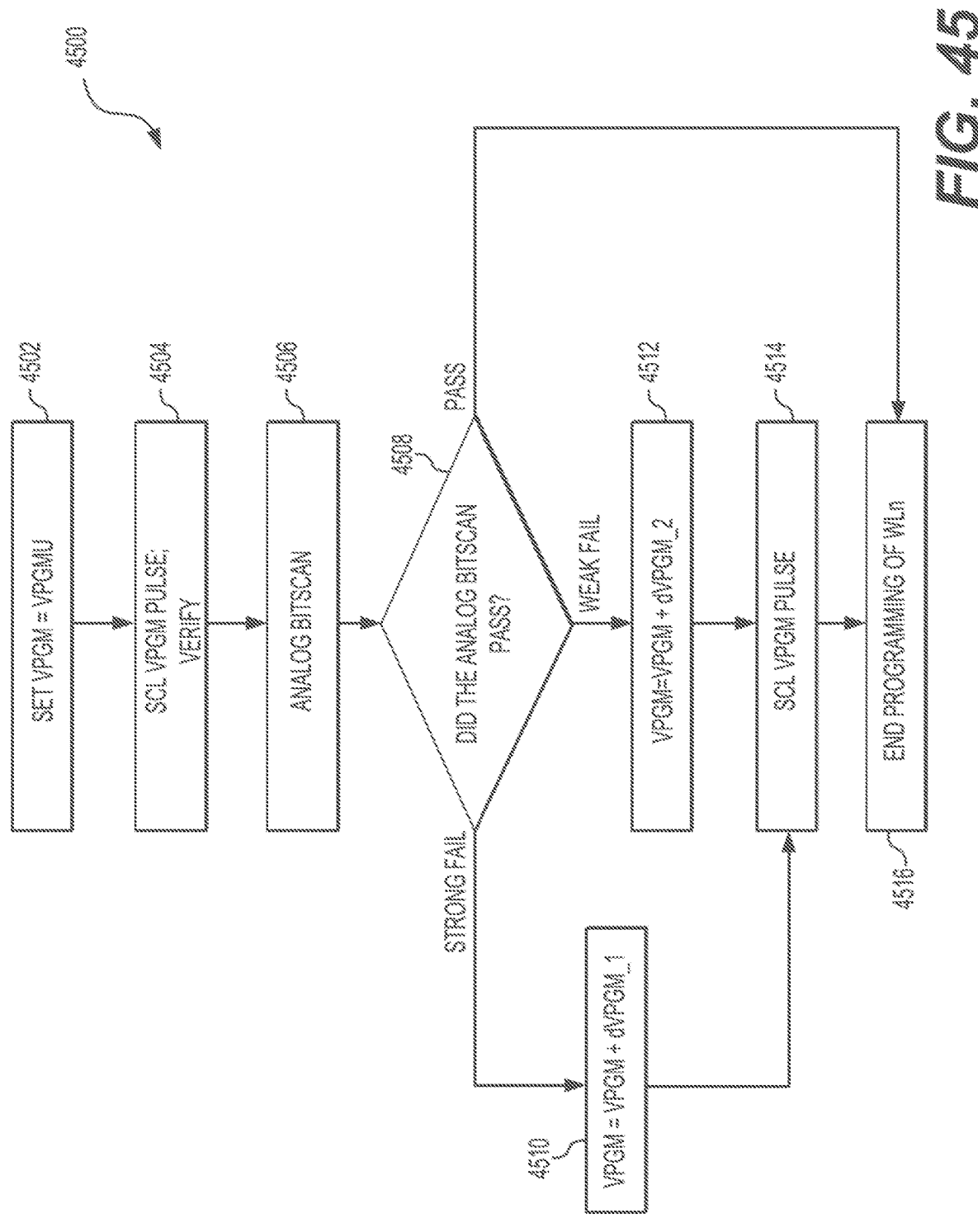
FIG. 45 is a flow chart containing the steps of performing a smart verify operation that includes an analog bitscan operation according to another example embodiment of the present disclosure.

FIG. 45 includes a flow chart 4500 that illustrates the steps of programming the memory cells of a selected word line WLn to SLC according to another example embodiment of the present disclosure. These steps could be performed by the controller, a processor or processing device or any other circuitry, executing instructions stored in memory, and/or other circuitry described herein that is specifically configured/programmed to execute the following steps.

At step 4502, the programming voltage VPGM is set at an initial voltage VPGMU. At step 4504, a VPGM pulse is applied to the selected word line WLn to program the non-inhibited memory cells of the selected word line WLn. After the VPGM pulse, a verify operation is performed to compare each memory cell being programmed to the verify voltage. At step 4506, an analog bitscan operation is performed to compare the number of failed bits (memory cells that failed verify) to a BSPF threshold.

At decision step 4508, it is determined if the analog bitscan operation passed. If the output at decision step 4508 is strong fail (the number of failed bits is significantly greater than the BSPF threshold), then at step 4510, the programming voltage is increased by a first step size dVPGM_1, i.e., VPGM=VPGM+dVPGM_1. If the output at decision step 4508 is weak fail (the number of failed bits is slightly greater than the BSPF threshold), then at step 4512, the programming voltage is increased by a second step size dVPGM_2, i.e., VPGM=VPGM+dVPGM_2. The second step size dVPGM_2 is less than the first step size dVPGM_1 such that the programming voltage VPGM increases by a lesser amount in response to a weak fail output of the analog bitscan operation than in response to a strong fail output.

Following either step 4510 or 4512, the process proceeds to step 4514, and a VPGM pulse is applied to the selected word line without a following verify operation.

Following either step 4514 or a pass output at decision step 4508, at step 4516, programming of the selected word line WLn is completed.

In some embodiments, rather than the step size dVPGM being dependent on the output of the analog bitscan operation, another programming aspect can be adjusted. For example, in some embodiment the programming clock (the time that the VPGM pulse is held on the selected word line WLn) can be lengthened in response to a strong fail analog bitscan output and can be shortened in response to a weak fail analog bitscan output. In some other embodiments, the bit line voltage VBLC can also be adjusted to control programming speed (e.g., see the discussion about QPW above) based on the output of the analog bitscan operation.

These SLC programming techniques may allow for improved performance as compared to conventional nPnV SLC programming operations where each program loop includes both a VPGM pulse and a verify operation.

Another aspect of the present disclosure is related to the use of analog bitscan in a programming technique sometimes known as STPFINE. Generally, STPFINE involves automatically finishing the programming of a last data state (for example, data state S7 in the case of TLC depicted in FIG. 9) after a predetermined number of program loops following completion of a previous data state (for example, data state S6) if very does not pass before this point. That is, programming is completed even if data state S7 does not pass verify. As discussed in further detail below, the use of analog bitscan allows certain variables to be dynamically optimized, for example, the number of program loops to perform after completion of the second to last data state and/or the programming voltage in those additional program loops. Dynamically optimizing these variables improved performance and/or reliability.

Figure 46:
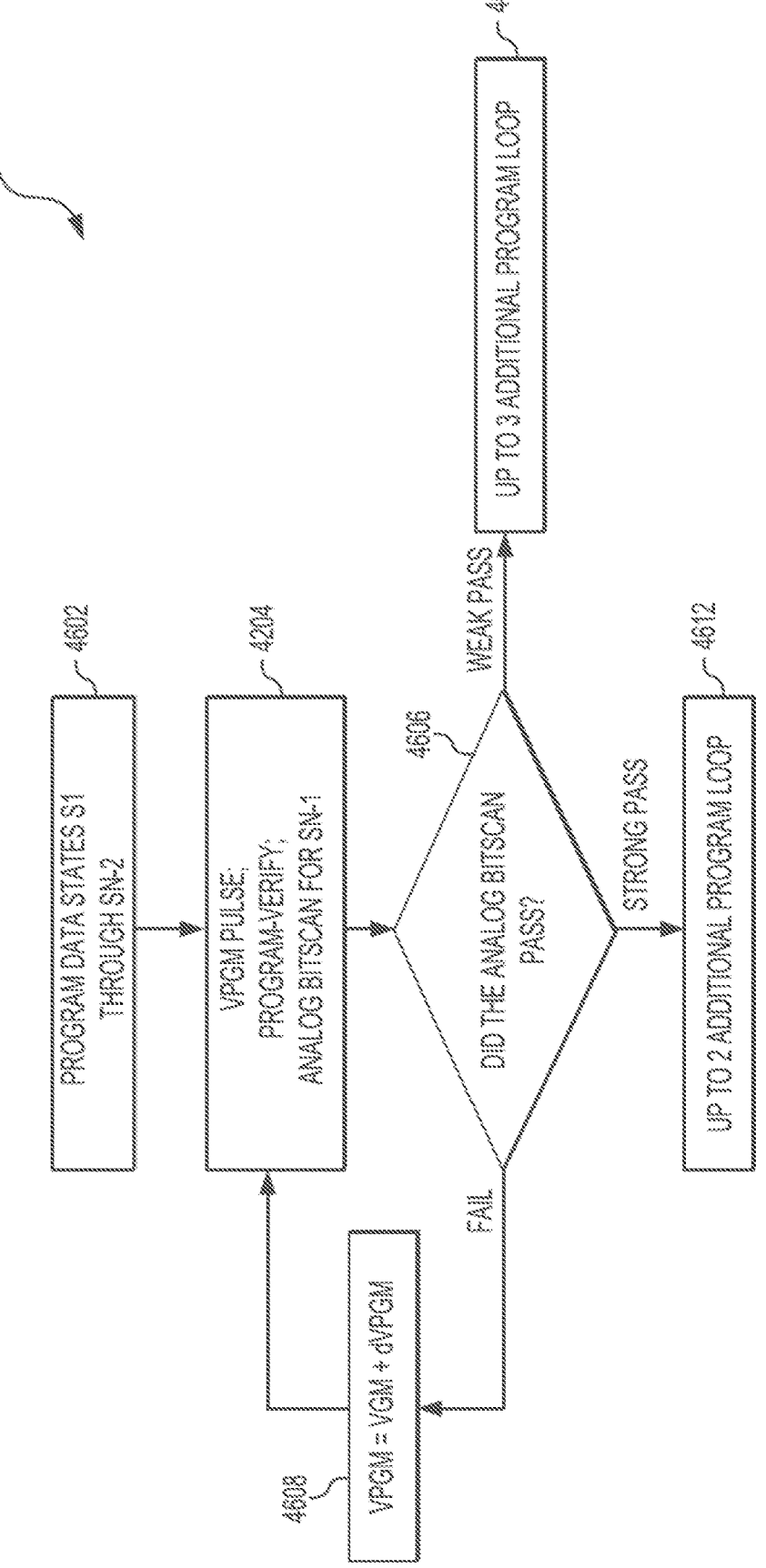
FIG. 46 is a flow chart containing the steps of performing a STPFINE operation that includes an analog bitscan operation according to an example embodiment of the present disclosure.

FIG. 46 includes a flow chart 4600 that illustrates the steps of programming the memory cells of a selected word line WLn utilizing analog bitscan in a STPFINE operation. These steps could be performed by the controller, a processor or processing device or any other circuitry, executing instructions stored in memory, and/or other circuitry described herein that is specifically configured/programmed to execute the following steps.

At step 4602, the memory cells of the selected word line WLn are programmed to data states S1 through SN-2 (where SN is the last data state to be programmed) in a plurality of program loops using an ISPP technique. In an example embodiment where the memory cells of the selected word line are being programmed to TLC, at step 4602, the memory cells can be programmed to data states S1-S5. Similarly, if the memory cells of the selected word line WLn are being programmed to QLC, then at step 4602, the memory cells are programmed to data states S1-S13. In other words, the process only moves on to step 4604 after verify passes for data state S5. At step 4604, another program loop is performed on the selected word line. The program loop includes a VPGM pulse, a verify operation; and an analog bitscan operation for data state SN-1 (for example S6 or S14) to compare a number of memory cells that fail verify to a BSPF threshold.

At decision step 4606, it is determined if the analog bitscan operation passed. If the output at decision step 4606 is fail, then at step 4608, the programming voltage VPGM is incrementally increased by a step size dVPGM, i.e., VPGM=VPGM+dVPGM. The process then returns to step 4604 to begin another program loop. If the output at decision step 4606 is weak pass (the number of memory cells that failed verify is barely below the BSPF threshold), then at step 4610, up to three additional program loops are performed on the selected word line WLn to further program the memory cells to the last data state SN (for example, S7 or S15). If the output at decision step 4606 is strong pass (the number of memory cells that failed verify is greatly below the BSPF threshold), then at step 4612, up to two additional program loops are performed on the selected word line WLn to further program the memory cells to the last data state SN (for example, S7 or S15). The specific numbers of additional program loops for each of these outputs can be set at any suitable level.

At step 4610 or 4612, each program loop includes a VPGM pulse, a verify operation, and a bitscan operation for data state SN. If verify passes prior to the end of the three program loops (in the case of step 4610) or two program loops (in the case of step 4612), then programming is completed early. However, after those extra program loops, programming is considered completed, even if verify does not pass for data state SN.

This embodiment allows the number of additional program loops to be performed following the program-verify passing for state SN-1 to be dynamically determined based on how strong the pass was. If the output of the analog bitscan operation was a weak pass, then the memory cells being programmed to data state SN can receive more additional program loops to further program those memory cells than in the case of a strong pass.

In some embodiments, additional outputs or bins may be provided for the analog bitscan operation with different operations resulting from the different outputs. For example, in response to a strong pass output from the analog bitscan operation for data state SN-1, up to two additional program loops can be performed on the selected word line WLn; in response to a medium pass output, up to three additional program loops can be performed; and in response to a weak pass output, up to four additional program loops can be performed. One way to add bins to the analog bitscan operation is to tighten (or reduce) the BSPF threshold to add additional fail scenarios, as discussed above.

Figure 47:
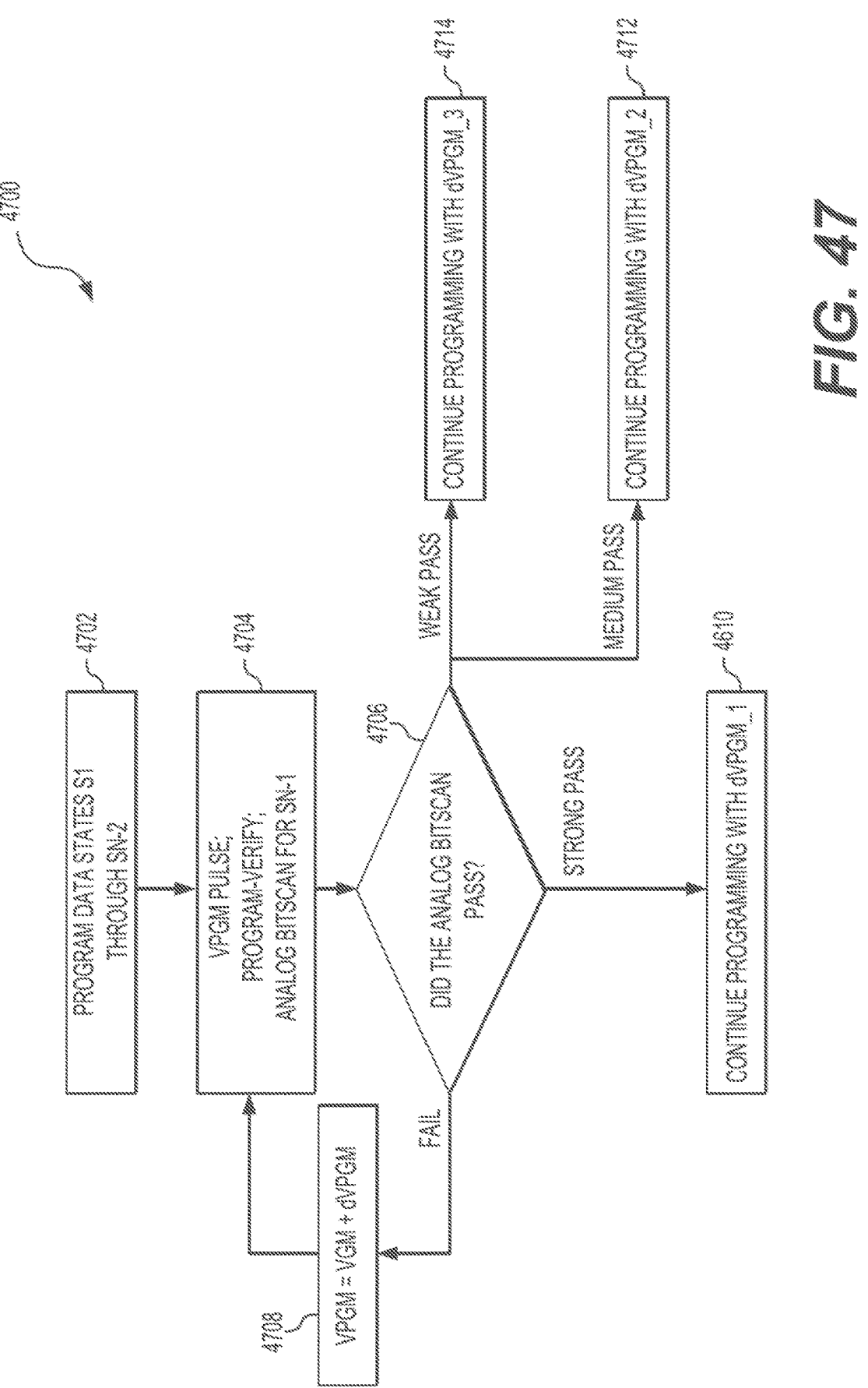
FIG. 47 is a flow chart containing the steps of performing a STPFINE operation that includes an analog bitscan operation according to another example embodiment of the present disclosure.

Turning now to FIG. 47, a flow chart 4700 is provided that illustrates the steps of programming the memory cells of a selected word line WLn utilizing analog bitscan in a STPFINE operation according to another embodiment of the present disclosure. These steps could be performed by the controller, a processor or processing device or any other circuitry, executing instructions stored in memory, and/or other circuitry described herein that is specifically config-ured/programmed to execute the following steps.

In this embodiment, steps 4702-4708 are identical to steps 4602-4608 of the embodiment described above but the analog bitscan operation is configured to provide four dif-ferent output options (fail, weak pass, medium pass, and strong pass) rather than three output options as described above.

In response to a strong pass output at decision step 4706, then at step 4710, programming continues for up to a predetermined number of program loops (for example, up to three additional program loops) and with the programming voltage VPGM increasing by a first step size dVPGM_1 between the additional program loops. In response to a medium pass output at decision step 4706, then at step 4712, programming continues for up to a predetermined number of program loops and with the programming voltage VPGM increasing by a second step size dVPGM_2 between the additional program loops. In response to a weak pass output at decision step 4706, then at step 4714, programming continues for up to a predetermined number of program loops with the programming voltage VPGM increasing by a third step size dVPGM_3 between the additional program loops.

In this embodiment, the third step size dVPGM_3 is greater than the second step size dVPGM_2, which is greater than the first step size dVPGM_1. As such, the programming voltage VPGM increases more slowly for a strong pass because less additional programming is required and increases more quickly for a weak pass because more additional programming is required. In other words, the step size dVPGM during the additional program loops is dynami-cally optimized based on the results of the analog bitscan operation for data state SN-1.

In some embodiments, the step size dVPGM may be dynamically adjusted for just one or fewer than all of the additional program loops rather than for all of the additional program loops after verify passes for data state SN-1.

In some further embodiments, certain aspects of both of these embodiments can be combined together. For example, both the number of additional program loops performed after verify passes for data state SN-1 and the step size dVPGM can be dynamically determined based on the results of the last bitscan operation for data state SN-1. In some embodiments different programming parameters can be adjusted based on the results of the analog bitscan operation. For example, the programming clock timing can be increased during in response to a weak pass output of the analog bitscan operation to further program the memory cells in the subsequent additional program loops. In some other embodiments, the biases applied to the unselected word lines can be adjusted to either increase or decrease programming that occurs in the additional program loops as desired. In some other embodiments, the bit line voltage VBLC can also be adjusted based on the output of the analog bitscan operation to either speed up or slow down program-ming for a memory cell coupled thereto.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be imple-mented as a hardware circuit that includes customized very-large-scale integration (VLSI) circuits or gate arrays, or off-the-shelf semiconductors that include logic chips, tran-sistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of performing an operation in a memory device, comprising the steps of:
   preparing a memory block that includes a plurality of memory cells that are arranged in a plurality of word lines;
   programming at least some of the plurality of memory cells in a program loop or erasing at least some of the plurality of memory cells in an erase loop;
   performing a verify operation;
   in an analog bitscan operation, counting the memory cells that pass or that fail the verify operation and comparing the count to only a single threshold; and
   determining an output of the analog bitscan operation, the output being one of at least three options.

2. The method as set forth in claim 1, wherein the step of programming or erasing at least some of the plurality of memory cells includes performing the program loop on a selected word line of the plurality of word lines.

3. The method as set forth in claim 1, wherein the step of programming or erasing at least some of the plurality of memory cells includes performing an erase loop on at least some word lines of the plurality of word lines.

4. The method as set forth in claim 1, wherein the analog bitscan operation includes scans of multiple tiers of the plurality of memory cells that are programmed in the program loop or that are erased in the erase loop; and wherein the output of the analog bitscan operation is determined based on which tier of the multiple tiers is being scanned when the analog bitscan operation is completed.

5. The method as set forth in claim 1, wherein the analog bitscan operation includes a scan of multiple tiers of the plurality of memory cells that are programmed in the program loop or that are erased in the erase loop; and
   wherein the output of the analog bitscan operation is determined based on a busy time calculation.

6. The method as set forth in claim 1, wherein the at least three options include four options, comprising: strong fail, weak fail, weak pass, and strong pass.

7. The method as set forth in claim 6, wherein at least one programming parameter in a subsequent program loop or at least one erasing parameter in a subsequent erase loop is adjusted based on the output of the analog bitscan operation.

8. A memory device, comprising:
   a memory block including a plurality of memory cells that are arranged in a plurality of word lines;
   circuitry that is configured to program at least some of the plurality of memory cells in a program loop or that is configured to erase at least some of the plurality of memory cells in an erase loop, during the program loop or the erase loop, the circuitry being configured to;
   perform a verify operation,
   in an analog bitscan operation, count the memory cells that pass or that fail the verify operation and compare the count to only a single threshold, and
   determine an output of the analog bitscan operation, the output being one of at least three options.

9. The memory device as set forth in claim 8, wherein the circuitry is configured to program the memory cells of a selected word line of the plurality of word lines in the program loop.

10. The memory device as set forth in claim 8, wherein the circuitry is configured to erase the memory cells of at least some of the plurality of word lines in the erase loop.

11. The memory device as set forth in claim 8, wherein, when performing the analog bitscan operation, the circuitry scans multiple tiers of the plurality of memory cells that are programmed in the program loop or that are erased in the erase loop; and
   wherein the output of the analog bitscan operation is determined by the circuitry based on which tier of the multiple tiers is being scanned when the analog bitscan operation is completed.

12. The memory device as set forth in claim 8, wherein during the analog bitscan operation, the circuitry scans multiple tiers of the plurality of memory cells that are programmed in the program loop or that are erased in the erase loop; and
   wherein the output of the analog bitscan operation from the circuitry is determined based on a busy time calculation.

13. The memory device as set forth in claim 8, wherein the at least three options include four options, comprising: strong fail, weak fail, weak pass, and strong pass.

14. The memory device as set forth in claim 13, wherein the circuitry adjusts at least one programming parameter in a subsequent program loop or adjusts at least one erasing parameter in a subsequent erase loop based on the output of the analog bitscan operation.

15. An apparatus, comprising:
   a memory block including a plurality of memory cells that are arranged in a plurality of word lines;

a control circuit for programming the memory cells of a selected word line of the plurality of word lines in a plurality of program loops and for erasing the memory cells of at least some of the plurality of word lines in a plurality of erase loops;

an analog bitscan means for counting memory cells that complete programming during the program loops or that complete erasing during the erase loops, the analog bitscan means being configured to compare a count of memory cells that completed programming or that completed erase to only a single threshold and determine an output that is one of at least three options.

16. The apparatus as set forth in claim 15, wherein the at least three options that the analog bitscan means is configured to output include strong fail, weak fail, weak pass, and strong pass.

17. The apparatus as set forth in claim 16, wherein the control circuit is configured to adjust at least one programming parameter in a subsequent program loop based on the output of the analog bitscan means in a previous program loop.

18. The apparatus as set forth in claim 16, wherein the control circuit is configured to adjust at least one erasing parameter in a subsequent erase loop based on the output of the analog bitscan means in a previous erase loop.

19. The apparatus as set forth in claim 15, wherein the analog bitscan means scans multiple tiers of the plurality of memory cells that are programmed in the program loop or that are erased in the erase loop; and wherein the output of the analog bitscan means is determined based on which tier of the multiple tiers is being scanned when an analog bitscan operation is completed.

20. The apparatus as set forth in claim 15, wherein during an analog bitscan operation, the analog bitscan means scans multiple tiers of the plurality of memory cells that are programmed in the program loop or that are erased in the erase loop; and wherein the output of the analog bitscan means is determined based on a busy time calculation.

* * * * *